(12) United States Patent
Tsujiuchi

(10) Patent No.: US 7,679,138 B2
(45) Date of Patent: Mar. 16, 2010

(54) SEMICONDUCTOR DEVICE

(75) Inventor: Mikio Tsujiuchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 330 days.

(21) Appl. No.: 11/733,363

(22) Filed: Apr. 10, 2007

(65) Prior Publication Data

US 2007/0241401 A1    Oct. 18, 2007

(30) Foreign Application Priority Data

Apr. 12, 2006    (JP)    ............................... 2006-110038

(51) Int. Cl.
*H01L 27/12* (2006.01)

(52) U.S. Cl. .................. 257/347; 257/350; 257/351; 257/371; 257/513; 257/544; 257/E21.703; 257/E27.099; 257/E27.112

(58) Field of Classification Search ................ 257/347, 257/371, 350–351, 544, 513
See application file for complete search history.

(56) References Cited

U.S. PATENT DOCUMENTS

| 6,841,400 | B2 | 1/2005 | Matsumoto et al. |
| 7,144,764 | B2 | 12/2006 | Matsumoto et al. |
| 2001/0025990 | A1* | 10/2001 | Hirano et al. ............... 257/347 |
| 2002/0175375 | A1* | 11/2002 | Kunikiyo ..................... 257/347 |
| 2006/0249756 | A1 | 11/2006 | Matsumoto et al. |

FOREIGN PATENT DOCUMENTS

JP    2002-289873    10/2002

OTHER PUBLICATIONS

U.S. Appl. No. 12/253,510, filed Oct. 17, 2008, Tsujiuchi et al.

* cited by examiner

*Primary Examiner*—A. Sefer
(74) *Attorney, Agent, or Firm*—Oblon, Spivak, McClelland, Maier & Neustadt, L.L.P.

(57) ABSTRACT

A MOS transistor including a source region, a drain region, and a gate electrode has first and second partial isolation regions in one-end gate region and the other-end gate region, respectively, with a first tap region provided adjacent to the first partial isolation region, and a second tap region provided adjacent to the second partial isolation region. A full isolation region is provided in the whole area around the first and second partial isolation regions, first and second tap regions, and source and drain regions.

19 Claims, 43 Drawing Sheets

F I G. 2 8
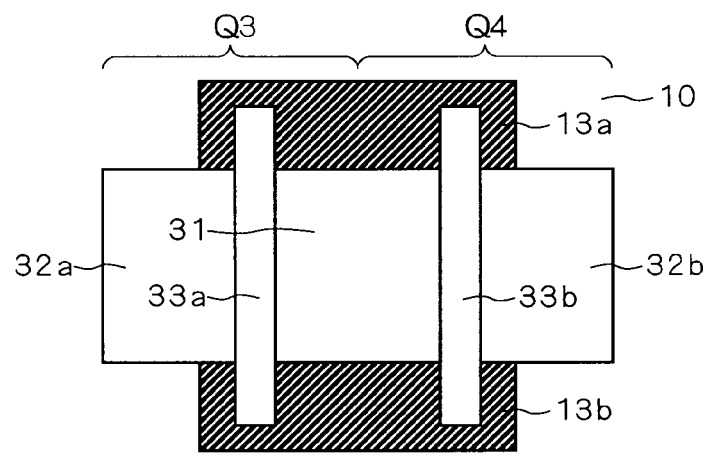
F I G. 2 9
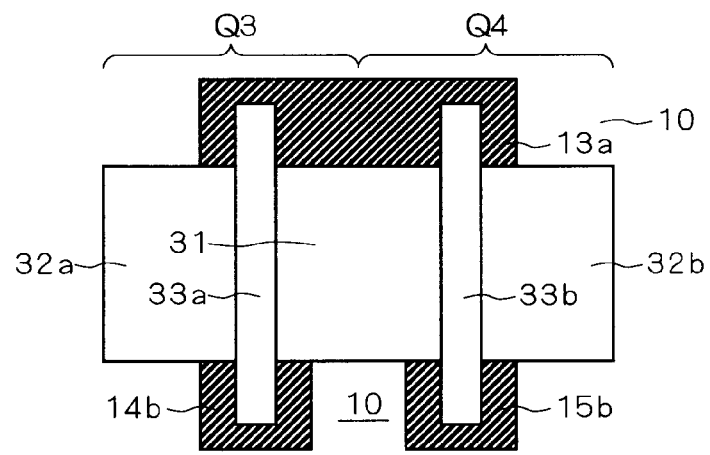
F I G. 3 0
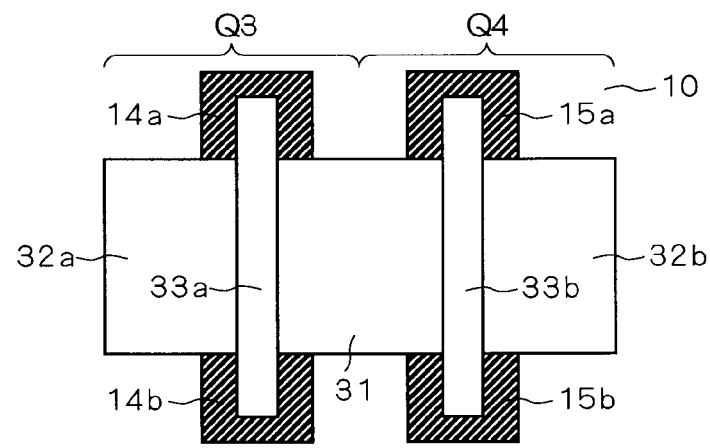

F I G . 3 5
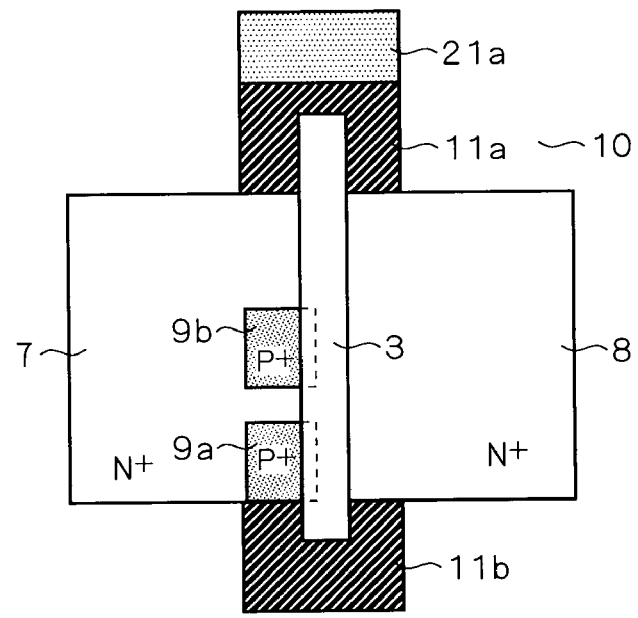
F I G . 3 6
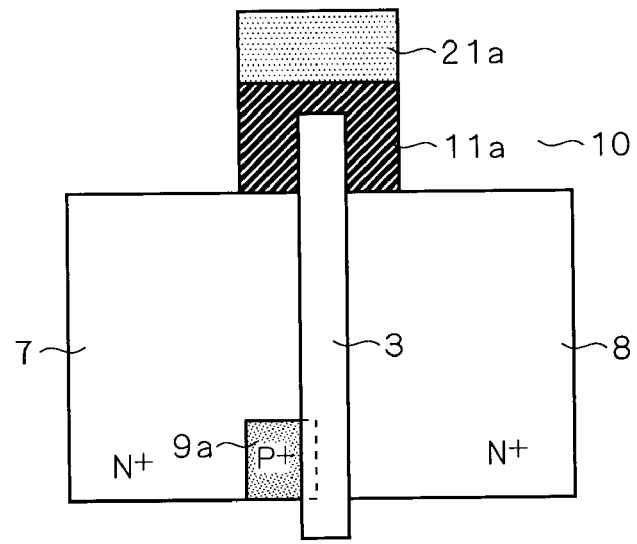

F I G . 3 9
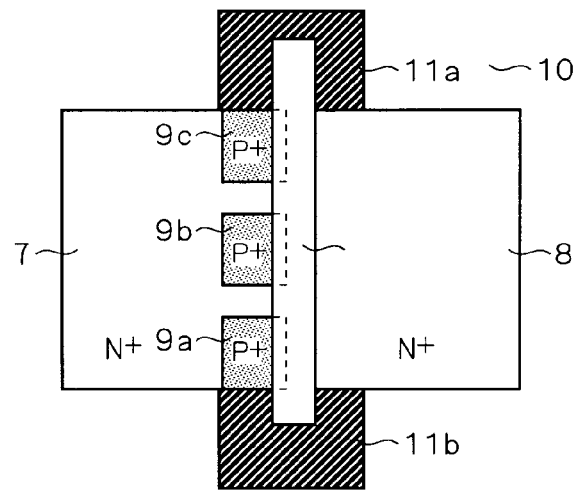
F I G . 4 0
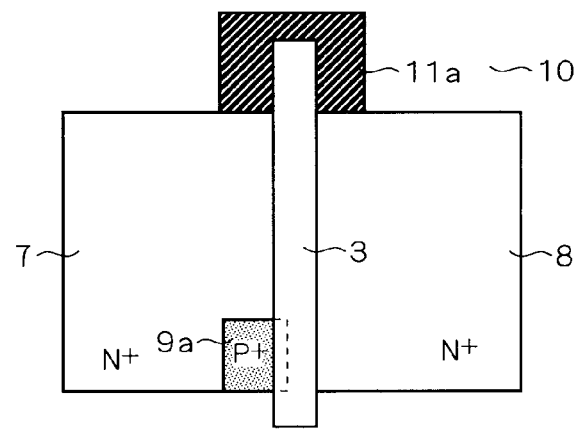
F I G . 4 1
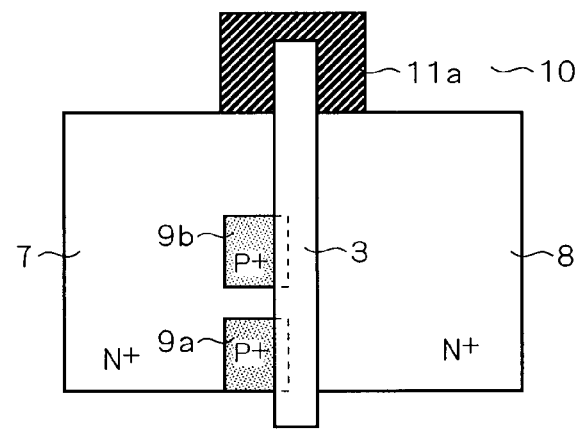

SEMICONDUCTOR DEVICE

FIELD OF THE INVENTION

The present invention relates to a semiconductor device employing a Silicon on Insulator (SOI) substrate, and more particularly to the configuration of a semiconductor device of fixing the body potential through a silicon layer remaining under a partial isolation region formed in a SOI layer.

DESCRIPTION OF THE BACKGROUND ART

The term "MOS" has been used for a metal-oxide-semiconductor layered structure from long ago. Particularly in field effect transistors of MOS structure (hereinafter briefly referred to as "MOS transistors"), however, materials for a gate insulating film and gate electrode are being improved with the recent trend toward higher integration and improved manufacturing process.

For instance, polycrystalline silicon is employed as a gate electrode material instead of metal in MOS transistors, mainly in terms of forming a source/drain in a self-aligned manner. From the view point of achieving improved electric properties, materials of high dielectric constant are employed, which are not necessarily limited to oxides.

Accordingly, the term "MOS" is not limited to the metal-oxide-semiconductor layered structure, and the description throughout the present specification is not based on such limitation. That is, in light of common technical knowledge, the term "MOS" herein is not a mere abbreviation of metal-oxide-semiconductor, but widely involves conductor-insulator-semiconductor layered structures.

FIG. 84 is a plan view showing a first mode of layout of a conventional MOS transistor formed in a SOI layer in a SOI substrate including a support substrate, a buried insulating film and the SOI layer.

In FIG. 84, a gate electrode 93 is formed on a body region (with a channel region on its surface; both not shown) between a source region 91 and a drain region 92 with a gate oxide film (not shown) interposed therebetween. A full isolation region 100 extending through the SOI layer is provided around these transistor forming regions 91 to 93.

FIG. 85 is a plan view showing a second mode of layout of a conventional MOS transistor formed in a SOI layer in a SOI substrate.

In FIG. 85, similarly to the first mode, the gate electrode 93 is formed on a body region between the source region 91 and drain region 92 with a gate oxide film interposed therebetween, and the full isolation region 100 is provided around these transistor forming regions 91 to 93.

Further, in the second mode, a source tie region 94 extends from part of an upper portion of the region where the source region 91 is provided to part of an upper portion of the region where the body region is provided. Since the source tie region 94 is adjacent to both the source region 91 and body region, its potential is set through metal silicide for setting the potential of the source region 91, by which potential setting of the body region is achieved.

Techniques for fixing the body region potential of such MOS transistor formed on a SOI substrate include a SOI semiconductor integrated circuit disclosed in Japanese Patent Application Laid-Open No. 2002-289873, for example.

The body potential fixing using the source tie region 94 of the aforementioned second mode and body potential fixing disclosed in the above JP2002-289873 arise problems of not ensuring higher integration, lower parasitic capacitance and smaller wiring capacitance as well as achieving stable body potential fixing.

SUMMARY OF THE INVENTION

An object of the present invention is to provide a semiconductor device formed on a SOI substrate that ensures higher integration, lower parasitic capacitance and smaller wiring capacitance as well as achieving stable body potential fixing.

According to a first aspect of the invention, the semiconductor device includes a MOS transistor in a SOI layer of a first conductivity type in a SOI substrate, the SOI substrate including a semiconductor substrate, a buried insulating film on the semiconductor substrate and the SOI layer on the buried insulating film.

The MOS transistor includes one-side electrode region, the other-side electrode region and a gate electrode.

The one-side electrode region and the other-side electrode region are selectively provided in the SOI layer and have a second conductivity type. A region sandwiched between the one-side electrode region and the other-side electrode region is defined as a body region of the first conductivity type. The gate electrode is provided on the body region.

The semiconductor device further includes one-side insulative partial isolation region, an insulative full isolation region and one-side body-fixing active region.

The one-side insulative partial isolation region is provided in the SOI layer such that one-side semiconductor region which is part of a lower portion of the SOI layer remains only in a region close to one-end region of the gate electrode in a peripheral region of an active region, the active region including the one-side electrode region, the other-side electrode region and the body region. The one-side semiconductor region is adjacent to the body region.

The insulative full isolation region is provided at least in a region except a region close to both end regions of the gate electrode in the peripheral region of the active region, and extends through the SOI layer. The one-side body-fixing active region has the first conductivity type, is provided adjacent to the one-side semiconductor region, and is capable of receiving a fixed potential from outside.

The semiconductor device allows the body region to be stably fixed in potential from the one-side body-fixing active region capable of receiving a fixed potential from outside, through the one-side semiconductor region.

At this time, the full isolation region that can be formed in an isolation width narrower than that of the partial isolation region is provided at least in the region except the region close to the both end regions of the gate electrode, which achieves higher integration.

Further, the one-side partial isolation region is provided only in the region close to one end of the gate electrode, which minimizes the parasitic capacitance generated by the one-side semiconductor region.

According to a second aspect of the invention, the semiconductor device includes a MOS transistor in a SOI layer of a first conductivity type in a SOI substrate, the SOI substrate including a semiconductor substrate, a buried insulating film on the semiconductor substrate and the SOI layer on the buried insulating film.

The MOS transistor includes one-side electrode region, the other-side electrode region and a gate electrode.

The one-side electrode region and the other-side electrode region have a second conductivity type and selectively provided in the SOI layer. A region sandwiched between the one-side electrode region and the other-side electrode region is defined as a body region of the first conductivity type. The gate electrode is provided on the body region.

The semiconductor device further includes one-side insulative partial isolation region and an insulative full isolation region.

The one-side insulative partial isolation region is provided in the SOI layer such that one-side semiconductor region which is part of a lower portion of the SOI layer remains only in a region close to one-end region of the gate electrode in a peripheral region of an active region, the active region including the one-side electrode region, the other-side electrode region and the body region. The one-side semiconductor region is adjacent to the body region.

The insulative full isolation region is provided at least in a region except a region close to both end regions of the gate electrode in the peripheral region of the active region, and extends through the SOI layer.

The semiconductor device does not include an external-potential receiving region for potential setting of the body region.

The semiconductor device allows the body region to be stably fixed in potential by the parasitic capacitance generated by the one-side semiconductor region.

At this time, the full isolation region that can be formed in an isolation width narrower than that of the partial isolation region is provided at least in the region except the region close to the both end regions of the gate electrode, which achieves higher integration.

According to a third aspect of the invention, the semiconductor device includes a MOS transistor in a SOI layer of a first conductivity type in a SOI substrate, the SOI substrate including a semiconductor substrate, a buried insulating film on the semiconductor substrate and the SOI layer on the buried insulating film.

The MOS transistor includes first and second MOS transistors sharing a common gate electrode.

The first MOS transistor includes one-side first electrode region and the other-side first electrode region of a second conductivity type selectively provided in the SOI layer. A region sandwiched between the one-side first electrode region and the other-side first electrode region is defined as a first body region of the first conductivity type.

The second MOS transistor includes one-side second electrode region and the other-side second electrode region of the second conductivity type selectively provided in the SOI layer. A region sandwiched between the one-side second electrode region and the other-side second electrode region is defined as a second body region of the first conductivity type.

The first and second MOS transistors further include the common gate electrode. The common gate electrode is provided on the first and second body regions.

The semiconductor device further includes one-side insulative partial isolation region, an insulative central partial isolation region, full isolation region and one-side body-fixing active region.

The one-side insulative partial isolation region is provided in the SOI layer such that one-side semiconductor region which is part of a lower portion of the SOI layer remains in a region close to one-end region of the common gate electrode in a peripheral region of a first active region and a second active region, the first active region including the one-side first electrode region, the other-side first electrode region and the first body region, the second active region including the one-side second electrode region, the other-side second electrode region and the second body region. The one-side semiconductor region is adjacent to the first body region.

The insulative central partial isolation region is provided such that a central semiconductor region which is part of a lower portion of the SOI layer remains in a region close to a central part of the common gate electrode positioned between the first and second active regions. The central semiconductor region is adjacent to the first and second body regions.

The insulative full isolation region is provided at least in a region except the region close to the central part and both end regions of the common gate electrode in the peripheral region of the first and second active regions, and extends through the SOI layer.

The one-side body-fixing active region has the first conductivity type, is provided adjacent to the one-side semiconductor region, and is capable of receiving a fixed potential from outside.

The semiconductor device allows the first body region to be stably fixed in potential from the one-side body-fixing active region capable of receiving a fixed potential from outside, through the one-side semiconductor region, and further allows the second body region to be stably fixed in potential through the central semiconductor region.

At this time, the full isolation region that can be formed in an isolation width narrower than that of the partial isolation region is provided at least in the region except the region close to the central part and both end regions of the common gate electrode, which achieves higher integration.

Further, the one-side partial isolation region and central partial isolation region are provided only in the region close to the one end and central part of the common gate electrode, respectively, which minimizes the parasitic capacitances generated by the one-side semiconductor region and central semiconductor region.

According to a fourth aspect of the invention, the semiconductor device includes a MOS transistor in a SOI layer of a first conductivity type in a SOI substrate, the SOI substrate including a semiconductor substrate, a buried insulating film on the semiconductor substrate and the SOI layer on the buried insulating film.

The MOS transistor includes first and second MOS transistors sharing a common gate electrode.

The first MOS transistor includes one-side first electrode region and the other-side first electrode region of a second conductivity type selectively provided in the SOI layer. A region sandwiched between the one-side first electrode region and the other-side first electrode region is defined as a first body region of the first conductivity type.

The second MOS transistor includes one-side second electrode region and the other-side second electrode region of the second conductivity type selectively provided in the SOI layer. A region sandwiched between the one-side second electrode region and the other-side second electrode region is defined as a second body region of the first conductivity type.

The first and second MOS transistors further include the common gate electrode. The common gate electrode is provided on the first and second body regions.

The semiconductor device further includes an insulative central isolation region and an insulative full isolation region.

The insulative central isolation region is provided in the SOI layer such that a central semiconductor region which is part of a lower portion of the SOI layer remains in a region close to a central part of the common gate electrode positioned between a first active region and a second active region. The first active region includes the one-side first electrode region, the other-side first electrode region and the first body region. The second active region includes the one-side second electrode region, the other-side second electrode region and the second body region. The central semiconductor region is adjacent to the first and second body regions.

The insulative full isolation region is provided at least in a region except the region close to the central part and both end regions of the common gate electrode in the peripheral region of the first and second active regions, and extends through the SOI layer.

The semiconductor device does not include an external-potential receiving region for potential setting of the first and second body regions.

The semiconductor device allows the body region to be stably fixed in potential by the parasitic capacitance generated by the central semiconductor region.

At this time, the full isolation region that can be formed in an isolation width narrower than that of the partial isolation region is provided at least in the region except the region close to the central part and both end regions of the gate electrode, which achieves higher integration.

According to a fifth aspect of the invention, the semiconductor device includes a MOS transistor in a SOI layer of a first conductivity type in a SOI substrate, the SOI substrate including a semiconductor substrate, a buried insulating film on the semiconductor substrate and the SOI layer on the buried insulating film.

The MOS transistor includes first and second MOS transistors sharing one-side common electrode region.

The first MOS transistor includes the one-side common electrode region, the other-side first electrode region and a first gate electrode.

The one-side common electrode region and the other-side first electrode region have a second conductivity type and selectively provided in the SOI layer. A region sandwiched between the one-side common electrode region and the other-side first electrode region is defined as a first body region of the first conductivity type. The first gate electrode is provided on the first body region.

The second MOS transistor includes the one-side common electrode region, the other-side second electrode region and a second gate electrode.

The one-side common electrode region and the other-side second electrode region have the second conductivity type and selectively provided in the SOI layer. A region sandwiched between the one-side common electrode region and the other-side second electrode region is defined as a second body region of the first conductivity type. The second gate electrode is provided on the second body region.

The semiconductor device further includes one-side first and second insulative partial isolation regions, an insulative full isolation region and one-side first and second body-fixing active regions.

The one-side first and second insulative partial isolation regions are provided in the SOI layer such that one-side first and second semiconductor regions which are part of lower portions of the SOI layer respectively remain only in a region close to one-end regions of the first and second gate electrodes in a peripheral region of a common active region. The common active region includes the one-side common electrode region, the other-side first electrode region, the first body region, the other-side second electrode region and the second body region. The one-side first and second insulative partial isolation regions are adjacent to the first and second body regions, respectively.

The insulative full isolation region is provided at least in a region except a region close to both end regions of each of said first and second gate electrodes and except a region between the first and second gate electrodes in the peripheral region of the common active region. The insulative full isolation region extends through the SOI layer.

The one-side first and second body-fixing active regions have the first conductivity type, and are provided adjacent to the one-side first and second semiconductor regions, respectively. Each of the one-side first and second body-fixing active regions is capable of receiving a fixed potential from outside.

The semiconductor device allows the first and second body regions to be stably fixed in potential from the first and second one-side body-fixing active regions each being capable of receiving a fixed potential from outside, through the first and second one-side semiconductor regions, respectively.

At this time, the full isolation region that can be formed in an isolation width narrower than that of the partial isolation region is provided at least in the region except the region close to the both end regions of the first and second gate electrodes and except the region between the first and second gate electrodes, which achieves higher integration.

Further, the first and second one-side partial isolation regions are provided only in the region close to one ends of the first and second gate electrodes, respectively, which minimizes the parasitic capacitances generated by the first and second one-side semiconductor regions.

According to a sixth aspect of the invention, the semiconductor device includes a MOS transistor in a SOI layer of a first conductivity type in a SOI substrate, the SOI substrate including a semiconductor substrate, a buried insulating film on the semiconductor substrate and the SOI layer on the buried insulating film.

The MOS transistor includes first and second MOS transistors sharing one-side common electrode region.

The first MOS transistor includes the one-side common electrode region, the other-side first electrode region and a first gate electrode.

The one-side common electrode region and the other-side first electrode region have a second conductivity type and selectively provided in the SOI layer. A region sandwiched between the one-side common electrode region and the other-side first electrode region is defined as a first body region of the first conductivity type. The first gate electrode is provided on the first body region.

The second MOS transistor includes the one-side common electrode region, the other-side second electrode region and a second gate electrode.

The one-side common electrode region and the other-side second electrode region have the second conductivity type and selectively provided in the SOI layer. A region sandwiched between the one-side common electrode region and the other-side second electrode region is defined as a second body region of the first conductivity type. The second gate electrode is provided on the second body region.

The semiconductor device further includes one-side first and second insulative partial isolation regions and an insulative full isolation region.

The one-side first and second insulative partial isolation regions are provided in the SOI layer such that one-side first and second semiconductor regions which are part of lower portions of the SOI layer respectively remain only in a region close to one-end regions of the first and second gate electrodes in a peripheral region of a common active region. The common active region includes the one-side common electrode region, the other-side first electrode region, the first body region, the other-side second electrode region and the second body region. The one-side first and second semiconductor regions are adjacent to the first and second body regions, respectively.

The insulative full isolation region is provided at least in a region except a region close to both end regions of each of the first and second gate electrodes and except a region between the first and second gate electrodes in the peripheral region of the common active region. The insulative full isolation region extends through the SOI layer.

The semiconductor device does not include an external-potential receiving region for potential setting of the first and second body regions.

The semiconductor device allows the body region to be stably fixed in potential by the parasitic capacitances generated by the first and second one-side semiconductor regions.

At this time, the full isolation region that can be formed in an isolation width narrower than that of the partial isolation region is provided at least in the region except the region close to the both end regions of the first and second gate electrodes, which achieves higher integration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 28 is a plan view showing the layout of a MOS transistor according to an eleventh mode of the fourth preferred embodiment;

FIG. 29 is a plan view showing the layout of a MOS transistor according to a twelfth mode of the fourth preferred embodiment;

FIG. 30 is a plan view showing the layout of a MOS transistor according to a thirteenth mode of the fourth preferred embodiment;

FIG. 35 is a plan view showing the layout of a MOS transistor according to the second mode of the fifth preferred embodiment;

FIG. 36 is a plan view showing the layout of a MOS transistor according to the third mode of the fifth preferred embodiment;

FIG. 39 is a plan view showing the layout of a MOS transistor according to the sixth mode of the fifth preferred embodiment;

FIG. 40 is a plan view showing the layout of a MOS transistor according to the seventh mode of the fifth preferred embodiment;

FIG. 41 is a plan view showing the layout of a MOS transistor according to the eighth mode of the fifth preferred embodiment;

DESCRIPTION OF THE PREFERRED EMBODIMENTS

First Preferred Embodiment

FIGS. 1 to 5 are plan views showing the layout of a MOS transistor formed on a SOI substrate according to first to fifth modes of a first preferred embodiment, respectively. The first preferred embodiment will focus attention to the layout of a unit MOS transistor.

First Mode

Figure 1:
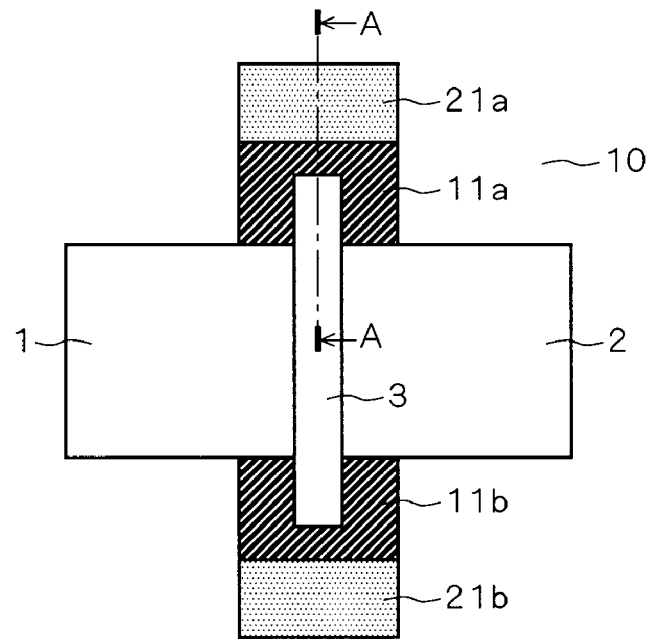
FIG. 1 is a plan view showing the layout of a MOS transistor formed on a SOI substrate according to a first mode of a first preferred embodiment.

FIG. 1 is a plan view showing the first mode of the first preferred embodiment. In this drawing, a gate electrode 3 is provided on a body region (with a channel region on its surface; both not shown) between a source region (one-side electrode region) 1 and a drain region (the other-side electrode region) 2 with a gate oxide film (not shown) interposed therebetween. This gate electrode 3 has its both ends respectively extending out in plan view from the forming regions of the source region 1 and drain region 2 (which hereinafter may be briefly referred to as "active regions 1 and 2" including the body region between the source region 1 and drain region 2). Hereinafter, for ease of description, part of the gate electrode 3 extending out from the active regions 1 and 2 upwardly in plan view in the drawing and its surrounding region (a region close to one-end region of the gate electrode 3) may also be called "one-end gate region", and part of the gate electrode 3 extending out from the active regions 1 and 2 downwardly in plan view in the drawing and its surrounding region (a region close to the other-end region of the gate electrode 3) may also be called "the other-end gate region". The one-end gate region and the other-end gate region may be called "both end gate regions" in combination or "each side gate region". An upward extension from the gate electrode 3 in the drawing may be referred to as "one-side gate extension", and a downward extension from the gate electrode 3 in the drawing may be referred to as "the other-side gate extension". The one-side gate extension and the other-side gate extension may be called "both side gate extensions" in combination.

Partial isolation regions 11a and 11b are provided in the one-end gate region (in the vicinity of (a region close to) one end of the gate electrode) and the other-end gate region (in the vicinity of (a region close to) the other end of the gate electrode), respectively. A tap region (body-fixing active region) 21a is provided adjacent to the partial isolation region 11a on the one-side gate extension, and a tap region 21b is provided adjacent to the partial isolation region 11b on the other-side gate extension. To be more precise, arranging a partial isolation region and a tap region adjacent to each other which will be described in the present specification means arranging an under-PTI semiconductor region which is part of a SOI layer remaining under a partial isolation region and a tap region adjacent to each other to provide an electric connection therebetween.

A full isolation region 10 is provided in the whole area around the partial isolation regions 11a, 11b, tap regions 21a, 21b, and active regions 1 and 2. That is, the full isolation region 10 is provided in the whole area around the active regions 1 and 2 except the other-end gate region.

Figure 6:
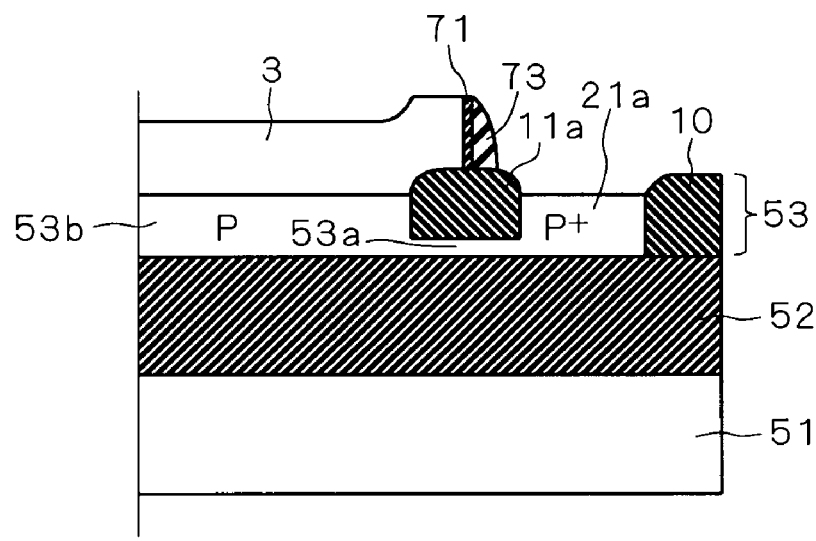
FIG. 6 is a sectional view taken along the line A-A of FIG. 1.

FIG. 6 is a sectional view taken along the line A-A of FIG. 1, and shows an N-type MOS transistor in the first mode (with a P-type body region).

As shown in the drawing, a SOI substrate has a layered structure of a silicon support substrate 51, a buried insulating film 52 and a SOI layer 53, and the partial isolation region 11*a* is formed without extending through the SOI layer 53, with an under-PTI semiconductor region 53*a* which is part of the SOI layer 53 remaining thereunder. In contrast, the full isolation region 10 extends through the SOI layer 53 to reach the buried insulating film 52.

A P-type body region 53*b* belonging to the SOI layer 53 directly under the gate electrode 3 is electrically connected to the P$^+$-type tap region 21*a* through the P-type under-PTI semiconductor region 53*a*, whose potential is fixed at the body potential applied to the tap region 21*a*. It is noted that a silicon oxide film spacer 71 and a sidewall 73 (not shown in FIGS. 1 to 5) are provided on the side face of the gate electrode 3. The sectional structure on the side of the partial isolation region 11*b* and tap region 21*b* is symmetrically similar to the structure shown in FIG. 6.

As described, in the first mode of the first preferred embodiment, the partial isolation regions 11*a* and 11*b* are provided in the both end gate regions, respectively, and the tap regions 21*a* and 21*b* are provided adjacent to the partial isolation regions 11*a* and 11*b* on the both side gate extensions, respectively, which achieves the effect of stably fixing the body potential (body fixing effect) by applying fixed potentials from the two tap regions 21*a* and 21*b*.

Further, the full isolation region 10 is provided in the whole area around the active regions 1 and 2 except the both end gate regions for device isolation. Since isolation width required for a full isolation region can generally be made narrower than that required for a partial isolation region, the present mode achieves the effect of achieving higher integration (integration increasing effect) than providing partial isolation regions in the whole area around the active regions 1 and 2.

In addition, providing the full isolation region 10 in the whole area around the active regions 1 and 2 except the both end gate regions for device isolation also achieves the effect of reducing capacitance (capacitance reducing effect) because of the absence of parasitic capacitance at a PN junction which would be created between a semiconductor region (corresponding to the under-PTI semiconductor region 53*a* in FIG. 6) under each partial isolation region and the active regions 1, 2, as compared to the case of providing partial isolation regions in the whole area around the active regions 1 and 2.

Second Mode

Figure 2:
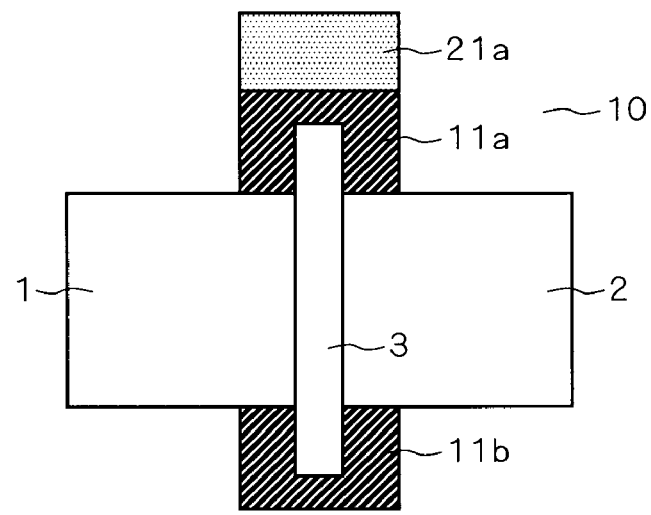
FIG. 2 is a plan view showing the layout of a MOS transistor according to a second mode of the first preferred embodiment.

FIG. 2 is a plan view showing the second mode of the first preferred embodiment. As shown in the drawing, the second mode differs from the first mode in that no tap region is provided adjacent to the partial isolation region 11*b* on the other-side gate extension. Other configuration is similar to the first mode shown in FIG. 1, and repeated description will be omitted here.

The second mode with such configuration achieves the body potential fixing by applying the fixed potential from the tap region 21*a*, charging into the PN junction capacitance generated by the under-PTI semiconductor region under the partial isolation region 11*b* (when the MOS transistor is on), and diffusion of carriers.

The second mode is inferior in body fixing effect and superior in integration increasing effect to the first mode because of the absence of the tap region 21*b*. Further, the second mode is superior in capacitance reducing effect to the first mode because the absence of the tap region 21*b* removes wiring capacitance which would be generated between the tap region 21*b* and wiring installed thereabove.

Third Mode

Figure 3:
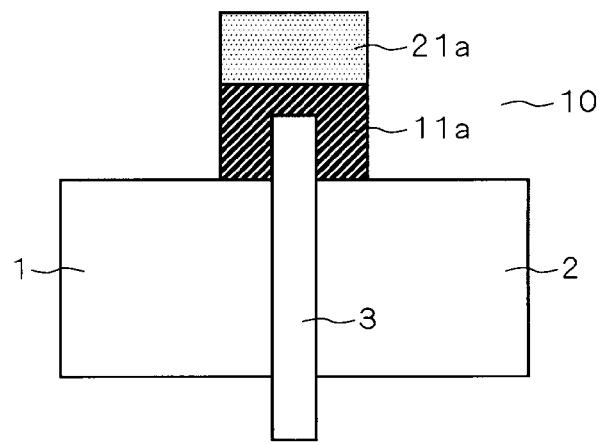
FIG. 3 is a plan view showing the layout of a MOS transistor according to a third mode of the first preferred embodiment.

FIG. 3 is a plan view showing the third mode of the first preferred embodiment. As shown in the drawing, the third mode differs from the second mode in that the partial isolation region 11*b* is not provided in the other-end gate region, and the full isolation region 10 is provided instead. Other configuration is similar to the second mode shown in FIG. 2, and repeated description will be omitted here.

The third mode with such configuration achieves the body potential fixing only by applying the fixed potential from the tap region 21*a*.

The third mode is inferior in body fixing effect and superior in integration increasing effect to the second mode because of the absence of the partial isolation region 11*b*. Further, the third mode is superior in capacitance reducing effect to the second mode because the absence of the partial isolation region 11*b* removes PN parasitic capacitance which would be generated by the partial isolation region 11*b*.

Fourth Mode

Figure 4:
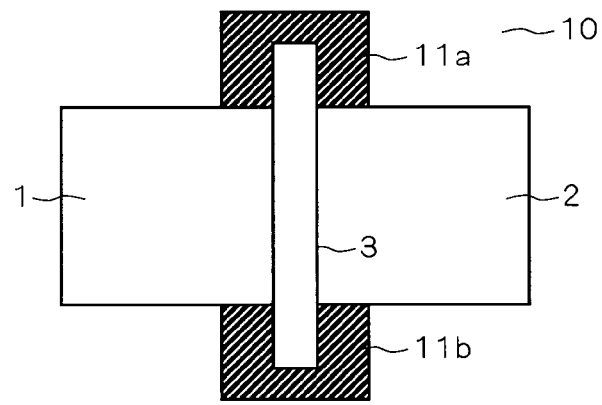
FIG. 4 is a plan view showing the layout of a MOS transistor according to a fourth mode of the first preferred embodiment.

FIG. 4 is a plan view showing the fourth mode of the first preferred embodiment. As shown in the drawing, the fourth mode differs from the second mode in that the tap region 21*a* is not provided. Other configuration is similar to the second mode shown in FIG. 2, and repeated description will be omitted here.

The fourth mode with such configuration achieves the body potential fixing by charging into the PN junction capacitance generated by the under-PTI semiconductor region under each of the partial isolation regions 11*a* and 11*b*, similarly to the partial isolation region 11*b* of the second mode.

The fourth mode is inferior in body fixing effect and superior in integration increasing effect to the second mode because of the absence of the tap region 21*a*. Further, the fourth mode is superior in capacitance reducing effect to the second mode because the absence of the tap region 21*a* removes wiring capacitance which would be generated by the tap region 21*a*.

In order to increase the stability in body potential fixing as well as charging into the PN junction capacitance generated by the under-PTI semiconductor regions under the partial isolation regions 11*a* and 11*b*, the under-PTI semiconductor regions 53*a* under the partial isolation regions 11*a* and 11*b* may be doped with impurities of high concentration to generate damage regions (crystal defect regions), which prevents the body potential from becoming unstable due to electron-hole recombination. When placing importance on the stability in body potential fixing, it is more preferable to form the partial isolation regions 11*a* and 11*b* (to be more specific, the under-PTI semiconductor regions thereunder) in a larger area to increase the PN junction capacitance and extend the region into which carriers diffuse.

Fifth Mode

Figure 5:
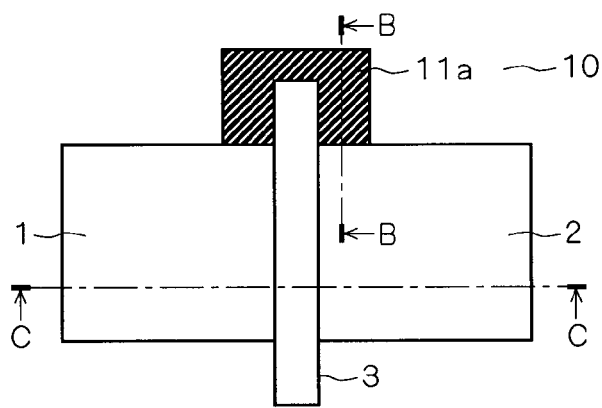
FIG. 5 is a plan view showing the layout of a MOS transistor according to a fifth mode of the first preferred embodiment.

FIG. 5 is a plan view showing the fifth mode of the first preferred embodiment. As shown in the drawing, the fifth mode differs from the fourth mode in that the partial isolation region 11*b* is not provided, and the full isolation region 10 is provided instead. Other configuration is similar to the fourth mode shown in FIG. 4, and repeated description will be omitted here.

The fifth mode with such configuration achieves the body potential fixing by charging into the PN junction capacitance generated by the under-PTI semiconductor region under the partial isolation region 11a and diffusion of carriers.

The fifth mode is inferior in body fixing effect to the fourth mode because of the absence of the partial isolation region 11b and superior in integration increasing effect to the fourth mode because the full isolation region 10 can also be provided in the region where the partial isolation region 11b would be formed. Further, the fifth mode is superior in capacitance reducing effect to the fourth mode because the absence of the partial isolation region 11b removes PN parasitic capacitance which would be generated by the partial isolation region 11b.

Others

In the above-described first to fifth modes of the first preferred embodiment, the tap regions 21a and 21b may be provided with no contact. With such configuration, the body potential fixing is achieved by charging into the PN junction capacitance generated by the under-PTI semiconductor regions under the partial isolation regions and diffusion of carriers into the tap regions as well as the under-PTI semiconductor regions. When placing importance on the stability in body potential fixing, it is more preferable to form the partial isolation regions (to be more specific, the under-PTI semiconductor regions thereunder) and tap regions in a larger area. Further, it is preferable to form the damage region described in the fourth mode in each tap region.

Second Preferred Embodiment

FIGS. 7 to 12 are plan views respectively showing the layout of a MOS transistor formed on a SOI substrate according to first to fifth modes of a second preferred embodiment. The second preferred embodiment will focus attention to the layout of two units of MOS transistors sharing a gate electrode.

The second preferred embodiment provides a common gate electrode 6 and hence achieves higher integration than in the first preferred embodiment.

First Mode

Figure 7:
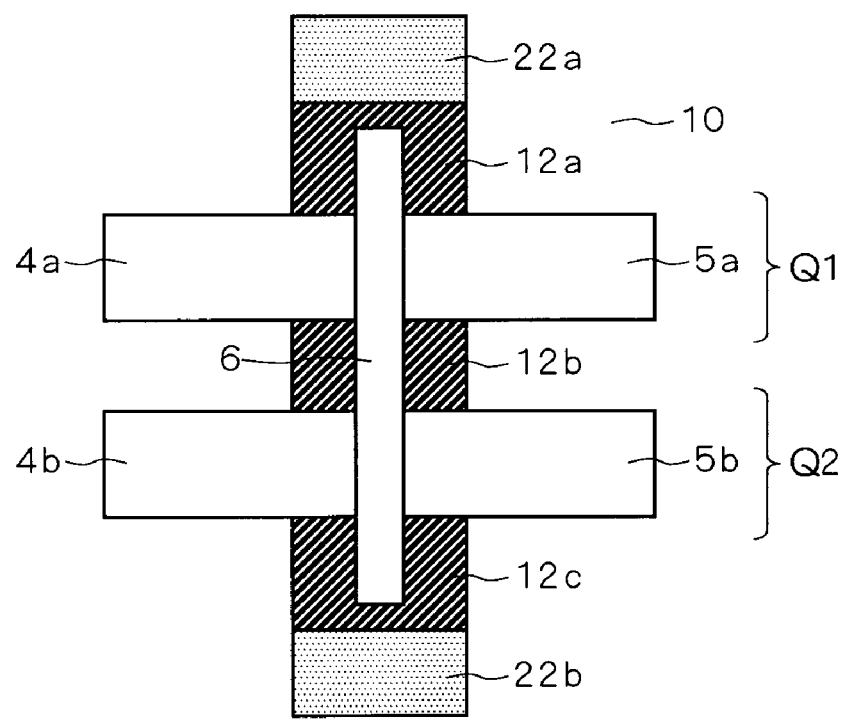
FIG. 7 is a plan view showing the layout of a MOS transistor formed on a SOI substrate according to a first mode of a second preferred embodiment.

FIG. 7 is a plan view showing the first mode of the second preferred embodiment. In this drawing, the common gate electrode 6 is formed on a body region (with a channel region on its surface; both not shown) between a source region 4a and a drain region 5a, and on a body region (with a channel region on its surface; both not shown) between a source region 4b and a drain region 5b, with a gate oxide film (not shown) interposed therebetween. This gate electrode 6 has its one end extending out in plan view upwardly from the forming regions of the source region 4a and drain region 5a (hereinafter may be briefly referred to as "active regions 4a and 5a" including the body region between the source region 4a and drain region 5a) and its other end extending out in plan view downwardly from the forming regions of the source region 4b and drain region 5b (hereinafter may be briefly referred to as "active regions 4b and 5b" including the body region between the source region 4b and drain region 5b). The active regions 4a, 5a and gate electrode 6 constitute a MOS transistor Q1, and the active regions 4b, 5b and gate electrode 6 constitute a MOS transistor Q2. The MOS transistors Q1 and Q2 shares the gate electrode 6.

Partial isolation regions 12a and 12c are provided in the one-end gate region and the other-end gate region of the gate electrode 6, respectively, and a partial isolation region 12b is provided (in a region) close to the central part of the gate electrode 6 between the active regions 4a, 5a and active regions 4b, 5b. A tap region (body-fixing active region) 22a is provided adjacent to the partial isolation region 12a on the one-side gate extension, and a tap region 22b is provided adjacent to the partial isolation region 12c on the other-side gate extension.

A full isolation region 10 is provided in the whole area around the partial isolation regions 12a to 12c, tap regions 22a, 22b, and active regions 4a, 5a, 4b and 5b.

As described, in the first mode of the second preferred embodiment, the partial isolation regions 12a and 12c are provided in the both end gate regions, respectively, the partial isolation region 12b is provided (in a region) close to the central part of the gate electrode 6, and the tap regions 22a and 22b are provided on the both side gate extensions, respectively, which achieves the body fixing effect by applying fixed potentials from the two tap regions 22a and 22b to the body regions of the MOS transistors Q1 and Q2, respectively.

Further, providing the full isolation region 10 for device isolation in the whole area around the active regions 4a, 5a, 4b and 5b except the both end gate regions and except the region close to the gate central part also achieves the integration increasing effect, similarly to the first preferred embodiment.

In addition, providing the full isolation region 10 for device isolation in the whole area around the active regions 4a, 5a, 4b and 5b except the both end gate regions and except the region close to the gate central part also achieves the capacitance reducing effect because of reduction in parasitic capacitance at PN junctions which would be created between semiconductor regions under the partial isolation regions and the active regions 4a, 5a and 4b, 5b.

Second Mode

Figure 8:
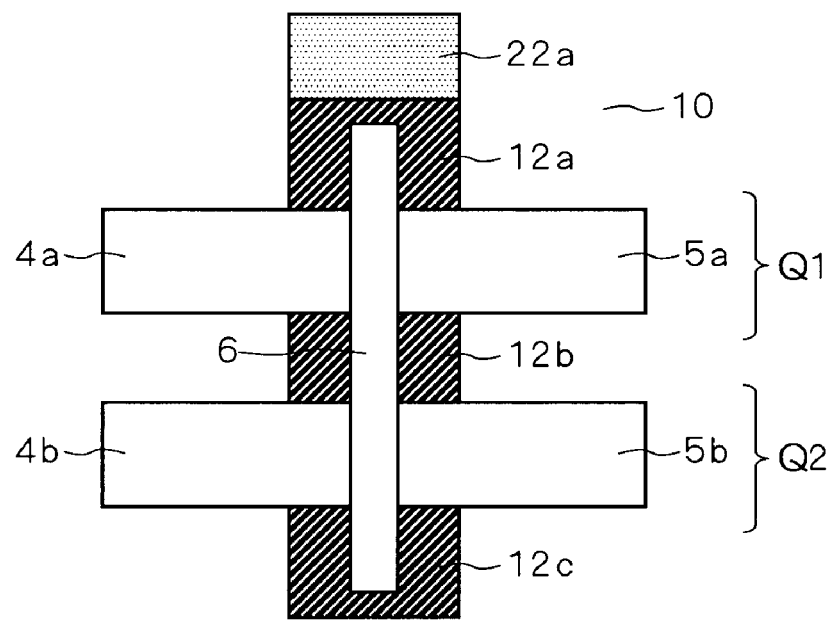
FIG. 8 is a plan view showing the layout of a MOS transistor according to a second mode of second preferred embodiment.

FIG. 8 is a plan view showing the second mode of the second preferred embodiment. As shown in the drawing, the second mode differs from the first mode in that no tap region is provided adjacent to the partial isolation region 12c on the other-side gate extension. Other configuration is similar to the first mode shown in FIG. 7, and repeated description will be omitted here.

The second mode with such configuration achieves the body potential fixing by applying the fixed potential from the tap region 22a (which can be applied to the body region of the MOS transistor Q1 and the body region of the MOS transistor Q2 through the under-PTI semiconductor region under the partial isolation region 12b), charging into the PN junction capacitance generated by the under-PTI semiconductor region under the partial isolation region 12c, and diffusion of carriers.

The second mode is inferior in body fixing effect and superior in integration increasing effect to the first mode because of the absence of the tap region 22b. Further, the second mode is superior in capacitance reducing effect to the first mode because the absence of the tap region 22b removes wiring capacitance which would be generated by the tap region 22b.

Third Mode

Figure 9:
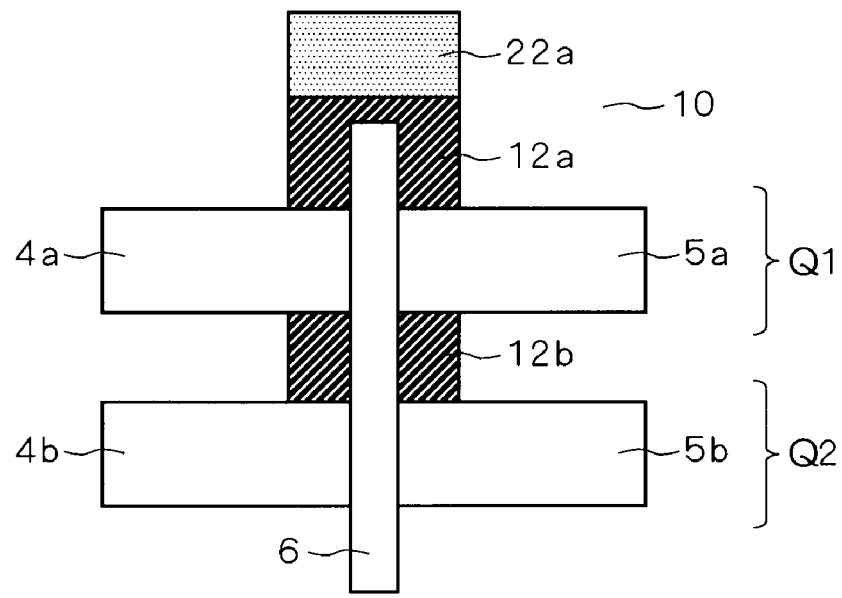
FIG. 9 is a plan view showing the layout of a MOS transistor according to a third mode of the second preferred embodiment.

FIG. 9 is a plan view showing the third mode of the second preferred embodiment. As shown in the drawing, the third mode differs from the second mode in that the partial isolation region 12c is not provided, and the full isolation region 10 is provided instead. Other configuration is similar to the second mode shown in FIG. 8, and repeated description will be omitted here.

The third mode with such configuration achieves the body potential fixing by applying the fixed potential from the tap region 22a (which can be applied to the body region of the MOS transistor Q1 and the body region of the MOS transistor Q2 through the under-PTI semiconductor region under the partial isolation region 12b).

The third mode is inferior in body fixing effect and superior in integration increasing effect to the second mode because of the absence of the partial isolation region 12c. Further, the third mode is superior in capacitance reducing effect to the second mode because the absence of the partial isolation region 12c removes PN parasitic capacitance which would be generated by the partial isolation region 12c.

Fourth Mode

Figure 10:
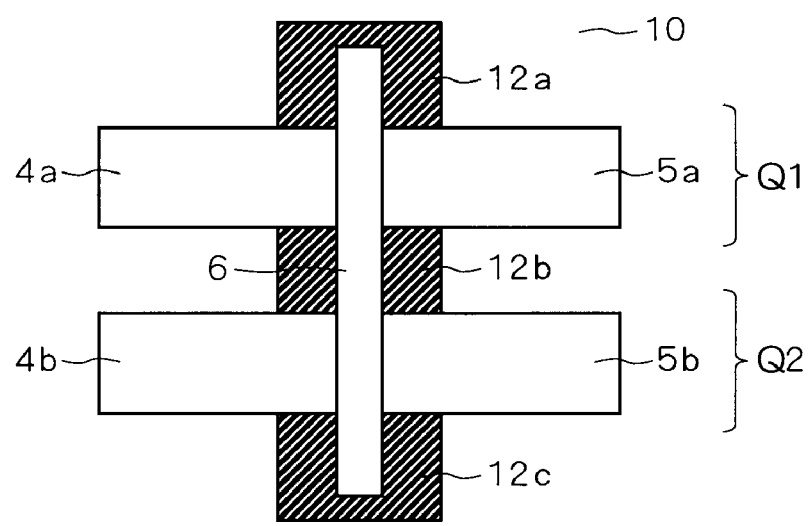
FIG. 10 is a plan view showing the layout of a MOS transistor according to a fourth mode of the second preferred embodiment.

FIG. 10 is a plan view showing the fourth mode of the second preferred embodiment. As shown in the drawing, the fourth mode differs from the second mode in that no tap region is provided adjacent to the partial isolation region 12a on the one-side gate extension. Other configuration is similar to the second mode shown in FIG. 8, and repeated description will be omitted here.

The fourth mode with such configuration achieves the body potential fixing in the MOS transistor Q1 by charging into the PN junction capacitance generated by the under-PTI semiconductor regions under the partial isolation regions 12a and 12b and diffusion of carriers, and the body potential fixing in the MOS transistor Q2 by charging into the PN junction capacitance generated by the under-PTI semiconductor regions under the partial isolation regions 12b and 12c, and diffusion of carriers.

The fourth mode is inferior in body fixing effect and superior in integration increasing effect to the second mode because of the absence of the tap region 22a. Further, the fourth mode is superior in capacitance reducing effect to the second mode because the absence of the tap region 22a removes wiring capacitance which would be generated by the tap region 22a.

In the fourth mode of the present embodiment, similarly to the fourth mode of the first preferred embodiment, in order to increase the stability in body potential fixing as well as charging into the PN junction capacitance generated by the under-PTI semiconductor regions under the partial isolation regions 12a to 12c, it is effective to dope the under-PTI semiconductor regions under the partial isolation regions 12a to 12c with impurities of high concentration to generate damage regions (crystal defect regions). When placing importance on the stability in body potential fixing, it is more preferable to form the partial isolation regions 12a to 12c (to be more specific, the under-PTI semiconductor regions thereunder) in a larger area to increase the PN junction capacitance and extend the region into which carriers diffuse.

Fifth Mode

Figure 11:
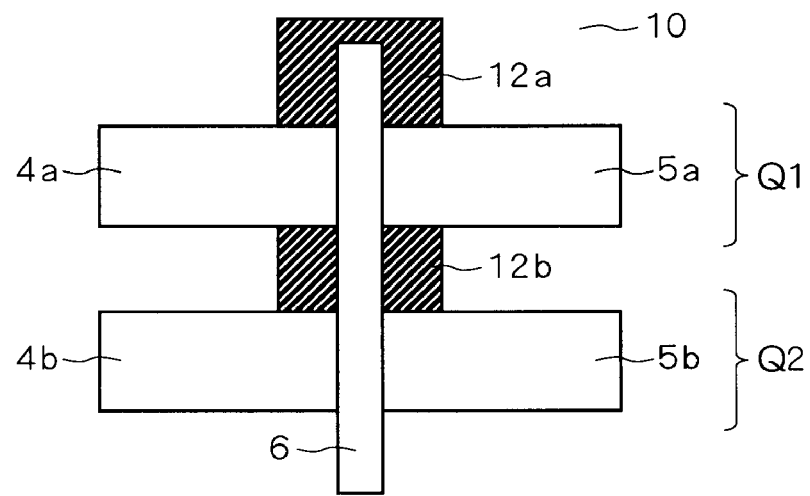
FIG. 11 is a plan view showing the layout of a MOS transistor according to a fifth mode of the second preferred embodiment.

FIG. 11 is a plan view showing the fifth mode of the second preferred embodiment. As shown in the drawing, the fifth mode differs from the fourth mode in that the partial isolation region 12c is not provided, and the full isolation region 10 is provided instead. Other configuration is similar to the fourth mode shown in FIG. 10, and repeated description will be omitted here.

The fourth mode with such configuration achieves the body potential fixing in the MOS transistors Q1 and Q2 by charging into the PN junction capacitance generated by the under-PTI semiconductor regions under the partial isolation regions 12a and 12b and diffusion of carriers.

The fifth mode is inferior in body fixing effect and superior in integration increasing effect to the fourth mode because of the absence of the partial isolation region 12c. Further, the fifth mode is superior in capacitance reducing effect to the fourth mode because the absence of the partial isolation region 12c removes PN junction capacitance which would be generated by the partial isolation region 12c.

In the fifth mode, similarly to the fourth mode, in order to increase the stability in body potential fixing as well as charging into the PN junction capacitance generated by the under-PTI semiconductor regions under the partial isolation regions 12a and 12b, it is effective to dope the under-PTI semiconductor regions under the partial isolation regions 12a and 12b with impurities of high concentration to generate damage regions (crystal defect regions). When placing importance on the stability in body potential fixing, it is more preferable to form the partial isolation regions 12a and 12b (to be more specific, the under-PTI semiconductor regions thereunder) in a larger area to increase the PN junction capacitance and extend the region into which carriers diffuse.

Sixth Mode

Figure 12:
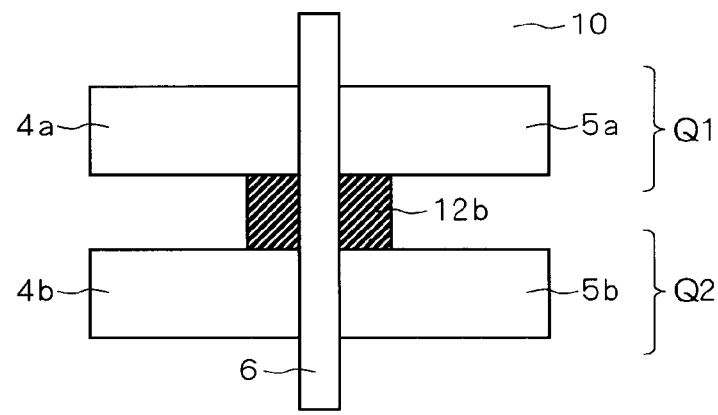
FIG. 12 is a plan view showing the layout of a MOS transistor according to a sixth mode of the second preferred embodiment.

FIG. 12 is a plan view showing the sixth mode of the second preferred embodiment. As shown in the drawing, the sixth mode differs from the fifth mode in that the partial isolation region 12a is not provided, and the full isolation region 10 is provided instead. Other configuration is similar to the fifth mode shown in FIG. 11, and repeated description will be omitted here.

The sixth mode with such configuration achieves the body potential fixing in the MOS transistors Q1 and Q2 by charging into the PN junction capacitance generated by the under-PTI semiconductor region under the partial isolation region 12b and diffusion of carriers.

The sixth mode is inferior in body fixing effect to the fifth mode because of the absence of the partial isolation region 12a and superior in integration increasing effect because the full isolation region 10 can also be provided in the regions where the partial isolation region 12a would be formed. Further, the sixth mode is superior in capacitance reducing effect to the fifth mode because the absence of the partial isolation region 12a removes PN junction capacitance which would be generated by the partial isolation region 12a.

In the sixth mode, similarly to the fifth mode, in order to increase the stability in body potential fixing as well as charging into the PN junction capacitance generated by the under-PTI semiconductor region under the partial isolation region 12b, it is effective to dope the under-PTI semiconductor region under the partial isolation region 12b with impurities of high concentration to generate a damage region (crystal defect region). When placing importance on the stability in body potential fixing, it is more preferable to form the partial isolation region 12b (to be more specific, the under-PTI semiconductor region thereunder) in a larger area to increase the PN junction capacitance and extend the region into which carriers diffuse.

Others

In the above-described first to sixth modes of the second preferred embodiment, the tap regions 22a and 22b may be provided with no contact. With such configuration, the body potential fixing is achieved by charging into the PN junction capacitance generated by the under-PTI semiconductor regions under the partial isolation regions and diffusion of carriers into the tap regions as well as the under-PTI semiconductor regions. When placing importance on the stability in body potential fixing, it is more preferable to form the partial isolation regions (to be more specific, the under-PTI semiconductor regions thereunder) and tap regions in a larger area. Further, it is preferable to form the damage region described in the fourth to sixth modes in each tap region.

Third Preferred Embodiment

FIGS. 13 to 17 are plan views respectively showing the layout of a MOS transistor formed on a SOI substrate according to first to fifth modes of a third preferred embodiment. The third preferred embodiment will focus attention to the layout of a unit MOS transistor.

First Mode

Figure 13:
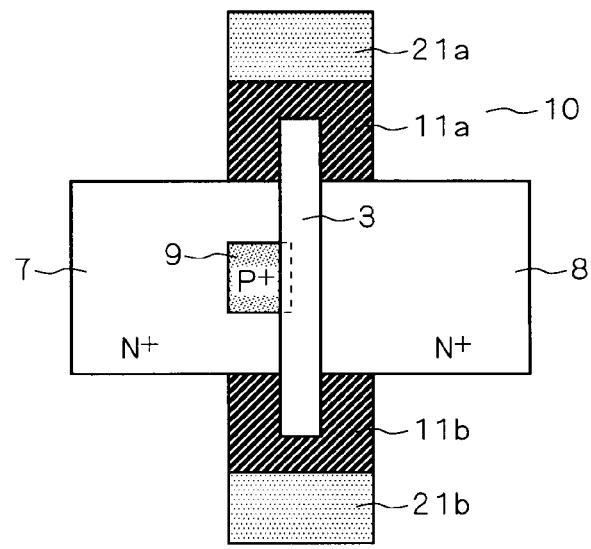
FIG. 13 is a plan view showing the layout of a MOS transistor formed on a SOI substrate according to a first mode of a third preferred embodiment.

FIG. 13 is a plan view showing the first mode of the third preferred embodiment. In this drawing, the gate electrode 3 is formed on a body region (with a channel region on its surface; both not shown) between a source region 7 and a drain region 8 with a gate oxide film (not shown) interposed therebetween. This gate electrode 3 has its both ends respectively extending out in plan view from the forming regions of the source region 7 and drain region 8 (hereinafter may be briefly referred to as "active regions 7 and 8" including the body region between the active regions 7 and 8).

The partial isolation regions 11a and 11b are formed in the one-end gate region and the other-end gate region, respectively. The tap region 21a is provided adjacent to the partial isolation region 11a on the one-side gate extension, and the tap region 21b is provided adjacent to the partial isolation region 11b on the other-side gate extension.

In addition, a P-type source tie region (electrode-region-forming active region) 9 is provided in the vicinity of the central part of the gate electrode 3 to extend from part of an upper portion of the source region 7 to part of an upper portion of the body region under the gate electrode 3.

The full isolation region 10 is provided in the whole area around the partial isolation regions 11a, 11b, tap regions 21a, 21b, and active regions 7 and 8.

The first mode of the third preferred embodiment with such configuration is superior in body potential fixing effect to the first mode of the first preferred embodiment because of the application of fixed potential from the source tie region 9 in addition to the application of fixed potential from the two tap regions 21a and 21b. For instance, when the gate electrode 3 has a relatively large width, the fixed potentials from the tap regions 21a and 21b provided on the both side gate extensions might unstabilize the potential fixing of the body region in the vicinity of the gate central part, which, however, can be avoided with reliability because the fixed potential is also applied from the source tie region 9 provided in the vicinity of the central part of the gate electrode 3.

Further, providing the full isolation region 10 in the whole area around the active regions 7 and 8 except the both end gate regions for device isolation achieves the integration increasing effect, similarly to the first mode of the first preferred embodiment.

In addition, providing the full isolation region 10 for device isolation in the whole area around the active regions 7 and 8 except the both end gate regions also achieves the capacitance reducing effect, similarly to the first mode of the first preferred embodiment.

Second Mode

Figure 14:
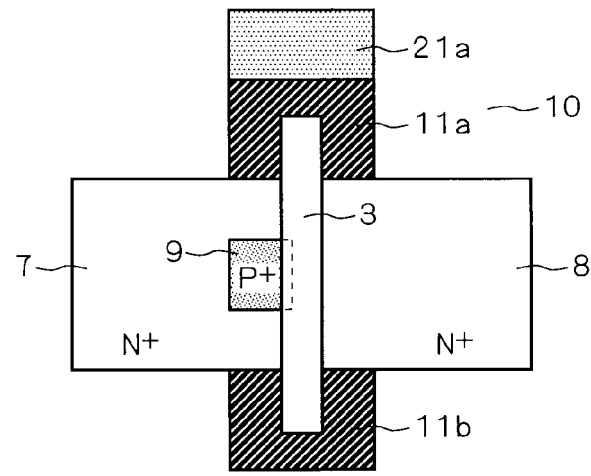
FIG. 14 is a plan view showing the layout of a MOS transistor according to a second mode of the third preferred embodiment.

FIG. 14 is a plan view showing the second mode of the third preferred embodiment. As shown in the drawing, the second mode differs from the first mode in that the tap region 21b is not provided adjacent to the partial isolation region 11b on the other-side gate extension. Other configuration is similar to the first mode shown in FIG. 13, and repeated description will be omitted here.

The second mode with such configuration achieves the body potential fixing by applying the fixed potential from the tap region 21a, applying the fixed potential from the source tie region 9, charging into the PN junction capacitance generated by the under-PTI semiconductor region under the partial isolation region 11b, and diffusion of carriers.

The second mode is inferior in body fixing effect and superior in integration increasing effect to the first mode because of the absence of the tap region 21b. Further, the second mode is superior in capacitance reducing effect to the first mode because the absence of the tap region 21b removes wiring capacitance which would be generated between the tap region 21b and wiring installed thereabove.

Third Mode

Figure 15:
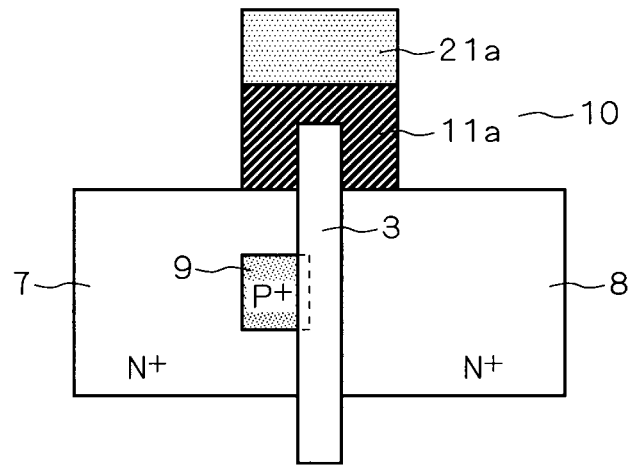
FIG. 15 is a plan view showing the layout of a MOS transistor according to a third mode of the third preferred embodiment.

FIG. 15 is a plan view showing the third mode of the third preferred embodiment. As shown in the drawing, the third mode differs from the second mode in that the partial isolation region 11b is not provided in the other-end gate region, and the full isolation region 10 is provided instead. Other configuration is similar to the second mode shown in FIG. 14, and repeated description will be omitted here.

The third mode with such configuration achieves the body potential fixing by applying the fixed potential from the tap region 21a and applying the fixed potential from the source tie region 9.

The third mode is inferior in body fixing effect and superior in integration increasing effect to the second mode because of the absence of the partial isolation region 11b. Further, the third mode is superior in capacitance reducing effect to the second mode because the absence of the partial isolation region 11b removes PN parasitic capacitance which would be generated by the partial isolation region 11b.

Fourth Mode

Figure 16:
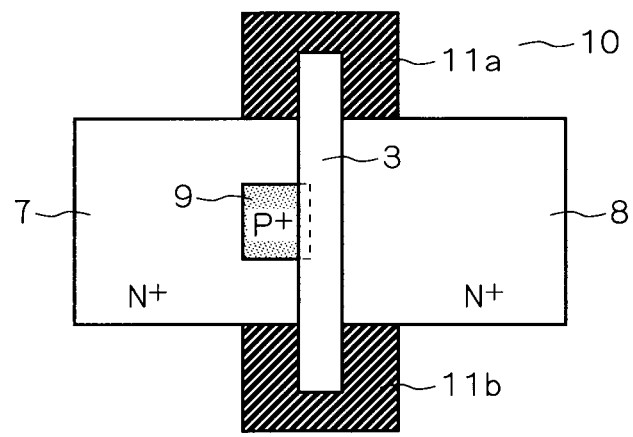
FIG. 16 is a plan view showing the layout of a MOS transistor according to a fourth mode of the third preferred embodiment.

FIG. 16 is a plan view showing the fourth mode of the third preferred embodiment. As shown in the drawing, the fourth mode differs from the second mode in that the tap region 21a is not provided. Other configuration is similar to the second mode shown in FIG. 14, and repeated description will be omitted here.

The fourth mode with such configuration achieves the body potential fixing by applying the fixed potential from the source tie region 9, charging into the PN junction capacitance generated by the under-PTI semiconductor regions under the partial isolation regions 11a and 11b, and diffusion of carriers.

The fourth mode is inferior in body fixing effect and superior in integration increasing effect to the second mode because of the absence of the tap region 21a. Further, the fourth mode is superior in capacitance reducing effect to the second mode because the absence of the tap region 21a removes wiring capacitance which would be generated by the tap region 21a.

In order to increase the stability in body potential fixing as well as charging into the PN junction capacitance generated by the under-PTI semiconductor regions under the partial isolation regions 11a and 11b, the under-PTI semiconductor regions under the partial isolation regions 11a and 11b may be doped with impurities of high concentration to generate a damage region, which prevents the body potential from becoming unstable due to electron-hole recombination. When placing importance on the stability in body potential fixing, it is more preferable to form the partial isolation regions 11a and 11b (to be more specific, the under-PTI semiconductor regions thereunder) in a larger area to increase the PN junction capacitance and extend the region into which carriers diffuse.

Fifth Mode

Figure 17:
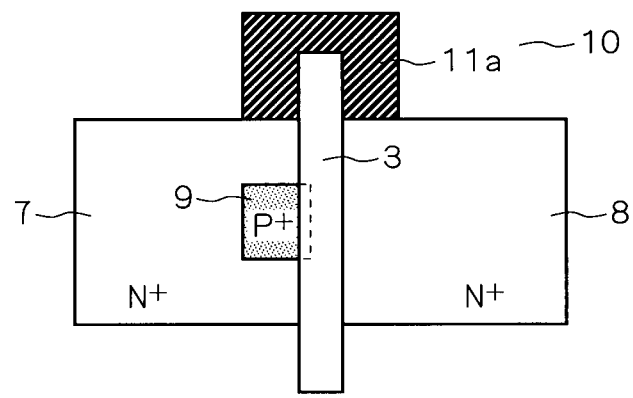
FIG. 17 is a plan view showing the layout of a MOS transistor according to a fifth mode of the third preferred embodiment.

FIG. 17 is a plan view showing the fifth mode of the third preferred embodiment. As shown in the drawing, the fifth mode differs from the fourth mode in that the partial isolation region 11b is not provided, and the full isolation region 10 is provided instead. Other configuration is similar to the fourth mode shown in FIG. 16, and repeated description will be omitted here.

The fifth mode with such configuration achieves the body potential fixing by applying the fixed potential from the source tie region 9, charging into the PN junction capacitance generated by the under-PTI semiconductor region under the partial isolation region 11a, and diffusion of carriers.

The fifth mode is inferior in body fixing effect and superior in integration increasing effect to the fourth mode because of the absence of the partial isolation region 11b. Further, the fifth mode is superior in capacitance reducing effect to the fourth mode because the absence of the partial isolation region 11b removes PN parasitic capacitance which would be generated by the partial isolation region 11b.

In order to increase the stability in body potential fixing as well as charging into the PN junction capacitance generated by the under-PTI semiconductor region under the partial isolation region 11a, the under-PTI semiconductor region under the partial isolation region 11a may be doped with impurities of high concentration to generate a damage region, which prevents the body potential from becoming unstable due to electron-hole recombination. When placing importance on the stability in body potential fixing, it is more preferable to form the partial isolation region 11a (to be more specific, the under-PTI semiconductor region thereunder) in a larger area to increase the PN junction capacitance and extend the region into which carriers diffuse.

Others

In the above-described first to fifth modes of the third preferred embodiment, the tap regions 21a and 21b may be provided with no contact. With such configuration, the body potential fixing is achieved by charging into the PN junction capacitance generated by the under-PTI semiconductor regions under the partial isolation regions and diffusion of carriers into the tap regions as well as the under-PTI semiconductor regions. When placing importance on the stability in body potential fixing, it is more preferable to form the partial isolation regions (to be more specific, the under-PTI semiconductor regions thereunder) and tap regions in a larger area. Further, it is preferable to form the damage region described in the fourth and fifth modes in each tap region.

It is also preferable to set the width of the partial isolation regions 11a and 11b (12a to 12c) (i.e., dimension in the direction that the source/drain extends: in the lateral direction in the drawing) according to the first to third preferred embodiments at the sum of {gate length of the gate electrode 3 (6)+exposure overlay misalignment+process fluctuations}.

For instance, the partial isolation regions may be formed substantially in a width of {gate length+0.1 μm (0.05 μm on each side)(=exposure overlay misalignment+process fluctuations)}(min=0.2 μm).

It is more effective to form the tap regions in a width (i.e., dimension in the direction that the source/drain extends) substantially equal to or larger than the width of the partial isolation regions, but may be smaller to a degree that contacts can be provided.

Further, it is preferable to form the tap regions in a length (i.e., dimension in the direction that the gate electrode extends: in the vertical direction in the drawing) not less than a dimension that contact holes can be formed.

Fourth Preferred Embodiment

FIGS. 18 to 33 are plan views showing of the layout of a MOS transistor formed on a SOI substrate according to first to sixteenth modes of a fourth preferred embodiment, respectively. The fourth preferred embodiment will focus attention to the layout of two units of MOS transistors sharing a source region.

The fourth preferred embodiment provides a common source region 31 and hence achieves higher integration than in the first preferred embodiment.

First Mode

Figure 18:
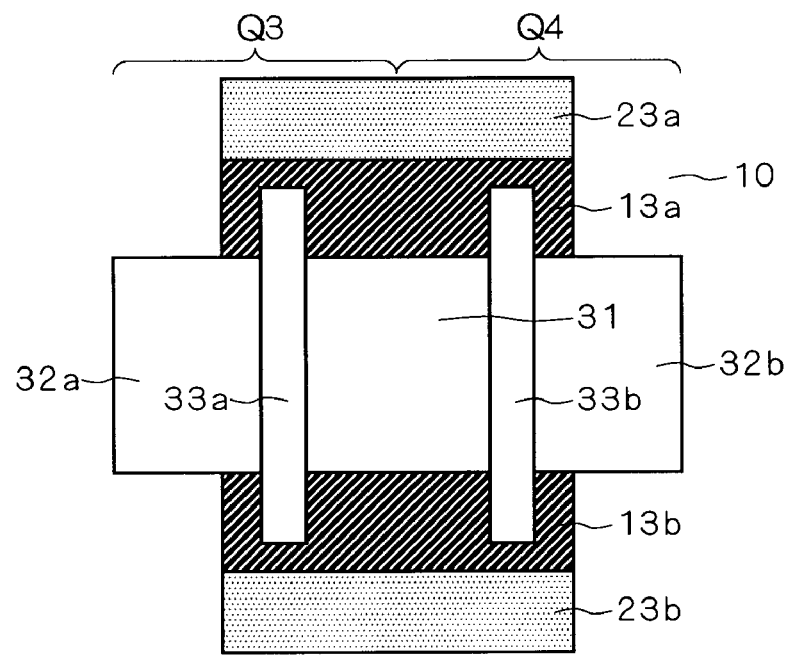
FIG. 18 is a plan view showing the layout of a MOS transistor formed on a SOI substrate according to a first mode of a fourth preferred embodiment.

FIG. 18 is a plan view showing the first mode of the fourth preferred embodiment. In this drawing, a gate electrode 33a is provided on a body region (with a channel region on its surface; both not shown) between a source region 31 and a drain region 32a with a gate oxide film (not shown) interposed therebetween, and a gate electrode 33b is provided on a body region (with a channel region on its surface; both not shown) between the source region 31 and a drain region 32b with a gate oxide film (not shown) interposed therebetween. The gate electrodes 33a and 33b each have both ends extending out in plan view from the forming regions of the source region 31 and drain regions 32a and 32b (hereinafter may be briefly referred to as "(common) active regions 31, 32a, 32b" including the two body regions between the source region 31 and drain region 32a and between the source region 31 and drain region 32b). The active regions 31, 32a and gate electrode 33a constitute a MOS transistor Q3, and the active regions 31, 32b and gate electrode 33b constitute a MOS transistor Q4. The MOS transistors Q1 and Q2 share the source region 31.

A partial isolation region 13a shared by the MOS transistors Q3 and Q4 is provided in the one-end gate region of each of the gate electrodes 33a, 33b and a region therebetween. A partial isolation region 13b shared by the MOS transistors Q3 and Q4 is provided in the other-end gate region of each of the gate electrodes 33a, 33b and a region therebetween. A tap region 23a is provided adjacent to the partial isolation region 13a on the one-side gate extension, and a tap region 23b is provided adjacent to the partial isolation region 13b on the other-side gate extension.

The full isolation region 10 is provided in the whole area around the partial isolation regions 13a, 13b, tap regions 23a, 23b, and (common) active regions 31, 32a and 32b.

As described, in the first mode of the fourth preferred embodiment, the partial isolation regions 13a and 13b are provided in the both end gate regions shared by the gate electrodes 33a and 33b, respectively, and the tap regions 23a and 23b are provided on the both side gate extensions, respectively, which achieves the body fixing effect similarly to the first preferred embodiment by applying a common fixed potential from the two tap regions 23a and 23b to the body regions of the MOS transistors Q3 and Q4.

In addition, the partial isolation regions 13a and 13b are provided integrally to be shared by the MOS transistors Q3 and Q4, and provided also in the region between the gate electrodes 33a and 33b in the one-end gate regions. Accordingly, the under-PTI semiconductor regions under the partial isolation regions 13a and 13b are also shared by the MOS transistors Q3 and Q4, and thus can be increased in area. This allows a current flow path for potential setting from the tap regions 23a and 23b to be widened, which achieves the body potential fixing effect with more stability.

Further, the tap regions 23a and 23b are integrally formed as common tap regions shared by the MOS transistors Q3 and Q4, which achieves the effect of providing pads for body potential fixing with stability.

Furthermore, providing the full isolation region 10 for device isolation in the whole area around the active regions 31, 32a and 32b except the both end gate regions achieves the integration increasing effect, similarly to the first preferred embodiment.

Still further, providing the full isolation region 10 for device isolation in the whole area around the active regions 31, 32a and 32b except the both end gate regions also achieves the capacitance reducing effect because of reduction in parasitic capacitance at a PN junction which would be created between semiconductor regions under the partial isolation regions and the active regions 31, 32a and 32b.

Second Mode

Figure 19:
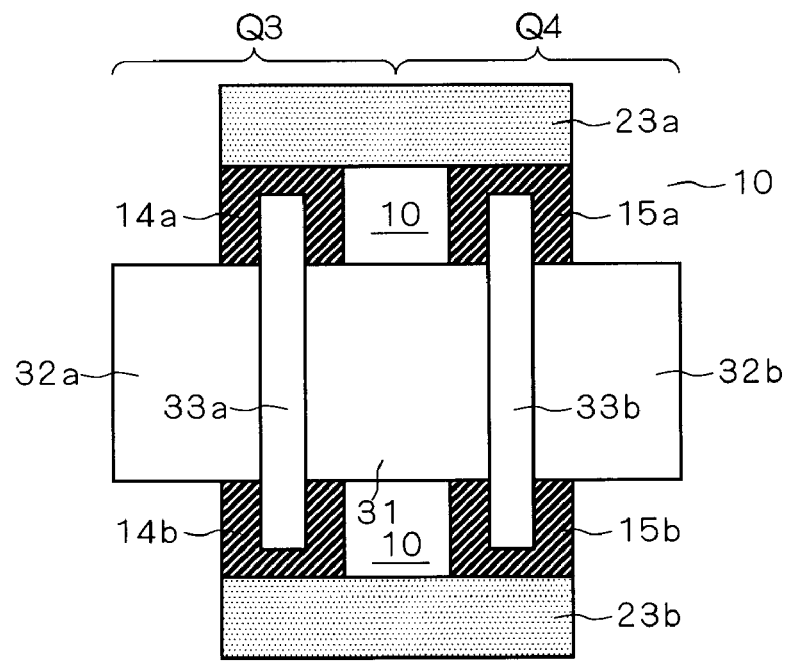
FIG. 19 is a plan view showing the layout of a MOS transistor according to a second mode of the fourth preferred embodiment.

FIG. 19 is a plan view showing the second mode of the fourth preferred embodiment. As shown in the drawing, the second mode differs from the first mode in that the partial isolation region 13a is replaced by partial isolation regions 14a, 15a, the partial isolation region 13b is replaced by partial isolation regions 14b, 15b, and the full isolation region 10 is provided between the partial isolation regions 14a and 15a and between the partial isolation regions 14b and 15b.

More specifically, the partial isolation regions 14a and 14b are formed in the both end gate regions of the gate electrode 33a, respectively, and the partial isolation regions 15a and 15b are provided in the both end gate regions of the gate electrode 33b, respectively. The partial isolation regions 14a and 15a are provided independently to be isolated from each other, and the partial isolation regions 14b and 15b are provided independently to be isolated from each other.

As described, since the full isolation region 10 is provided between the partial isolation regions 14a and 15a and between the partial isolation regions 14b and 15b, respectively, the under-PTI semiconductor regions under the partial isolation regions 14a and 15a are isolated from each other by the full isolation region 10, and the under-PTI semiconductor regions under the partial isolation regions 14b and 15b are isolated from each other by the full isolation region 10. Other configuration is similar to the first mode shown in FIG. 18, and repeated description will be omitted here.

The second mode with such configuration achieves the body potential fixing by applying the fixed potentials from the tap regions 23a and 23b, similarly to the first mode.

The second mode is inferior in body fixing effect and superior in integration increasing effect to the first mode because the partial isolation regions 14a and 15a formed independently and the partial isolation regions 14b and 15b formed independently have a narrower width than the partial isolation regions 13a and 13b. Further, the second mode is superior in capacitance reducing effect to the first mode because the reduction in width of the partial isolation regions reduces the parasitic area of the under-PTI semiconductor regions thereunder, resulting in reduction of PN parasitic capacitance.

Third Mode

Figure 20:
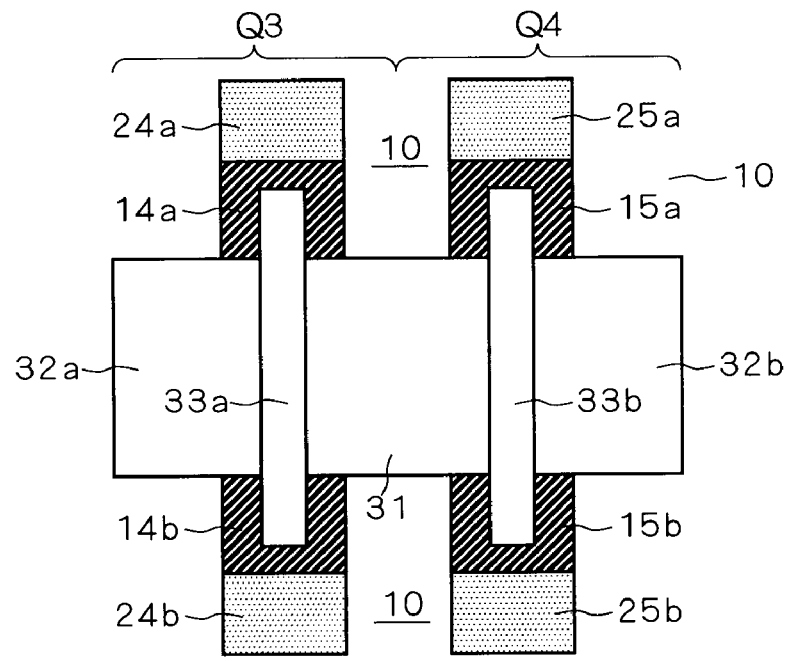
FIG. 20 is a plan view showing the layout of a MOS transistor according to a third mode of the fourth preferred embodiment.

FIG. 20 is a plan view showing the third mode of the fourth preferred embodiment. As shown in the drawing, the third mode differs from the second mode in that the tap region 23a is replaced by tap regions 24a and 25a, and the tap region 23b is replaced by tap regions 24b and 25b.

More specifically, the tap regions 24a and 25a are provided adjacent to the partial isolation regions 14a and 15a on the one-side gate extensions, respectively, and the tap regions 24b and 25b are provided adjacent to the partial isolation regions 14b and 15b on the other-side gate extensions, respectively. The tap regions 24a and 25a are independent from each other, and the tap regions 24b and 25b are independent from each other. Independence of the tap regions 24a and 25a from each other may involve electrical independence. Other configuration is similar to the second mode shown in FIG. 19, and repeated description will be omitted here.

The third mode with such configuration achieves the body potential fixing in the MOS transistor Q3 by applying the fixed potentials from the tap regions 24a and 24b, and the body potential fixing in the MOS transistor Q4 by applying the fixed potentials from the tap regions 25a and 25b.

The third mode is slightly inferior in body fixing effect and superior in integration increasing effect to the second mode because forming the tap regions 24a and 24b independently and the tap regions 25a and 25b independently reduces the margin for forming contacts. Further, the third mode is superior in capacitance reducing effect to the second mode because the reduction in area of the tap regions as a whole achieves reduction in wiring capacitance.

On the other hand, forming the tap regions 24a and 24b independently and the tap regions 25a and 25b independently achieves the effect of independently controlling the body potential fixing in each of the MOS transistors Q3 and Q4.

Fourth Mode

Figure 21:
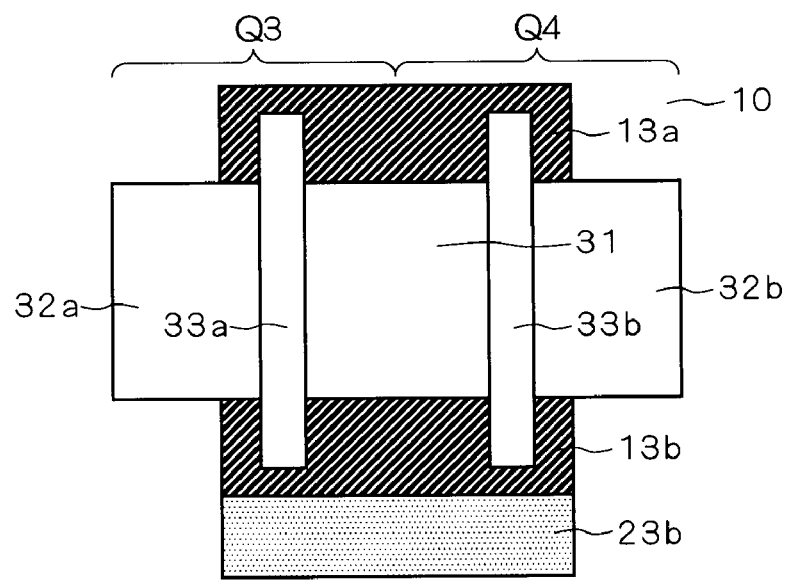
FIG. 21 is a plan view showing the layout of a MOS transistor according to a fourth mode of the fourth preferred embodiment.

FIG. 21 is a plan view showing the fourth mode of the fourth preferred embodiment. As shown in the drawing, the fourth mode differs from the first mode in that no tap region is provided adjacent to the partial isolation region 13a on the one-side gate extension. Other configuration is similar to the first mode shown in FIG. 18, and repeated description will be omitted here.

The fourth mode with such configuration achieves the body potential fixing by applying the fixed potential from the tap region 23b, charging into the PN junction capacitance generated by the under-PTI semiconductor region under the partial isolation region 13a, and diffusion of carriers.

The fourth mode is inferior in body fixing effect and superior in integration increasing effect to the first mode because of the absence of the tap region 23a. Further, the fourth mode is superior in capacitance reducing effect to the first mode because the absence of the tap region 23a removes wiring capacitance which would be generated by the tap region 23a.

Further, the fourth mode is not provided with the tap region 23a and hence suitable for a CMOS transistor in which a tap region is generally difficult to be provided at its center.

Furthermore, in the fourth mode, in order to increase the stability in body potential fixing as well as charging into the PN junction capacitance generated by the under-PTI semiconductor region 53a under the partial isolation region 13a, it is effective to dope the under-PTI semiconductor region 53a under the partial isolation region 13a with impurities of high concentration to generate a damage region (crystal defect region). When placing importance on the stability in body potential fixing, it is more preferable to form the partial isolation region 13a in a larger area to increase the PN junction capacitance and extend the region into which carriers diffuse.

Fifth Mode

Figure 22:
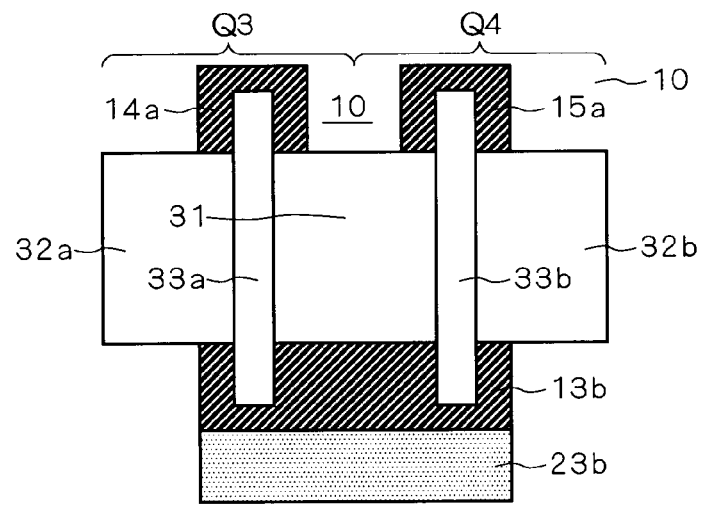
FIG. 22 is a plan view showing the layout of a MOS transistor according to a fifth mode of the fourth preferred embodiment.

FIG. 22 is a plan view showing the fifth mode of the fourth preferred embodiment. As shown in the drawing, the fifth mode differs from the fourth mode in that the partial isolation region 13a is replaced by partial isolation regions 14a and 15a isolated from each other between the MOS transistors Q3 and Q4. Other configuration is similar to the fourth mode shown in FIG. 21, and repeated description will be omitted here.

The fifth mode with such configuration achieves the body potential fixing by applying the fixed potential from the tap region 23b, charging into the PN junction capacitance generated by under-PTI semiconductor regions under the partial isolation regions 14a and 15a, and diffusion of carriers.

The fifth mode is inferior in body fixing effect and superior in integration increasing effect to the fourth mode because of the reduction in area of the partial isolation regions in the one-end gate region. Further, the fifth mode is superior in capacitance reducing effect to the fourth mode because the reduction in area of the partial isolation regions 14a and 15a in the one-end gate region reduces the PN parasitic capacitance generated by the under-PTI semiconductor regions thereunder.

Further, in the fifth mode, in order to increase the stability in body potential fixing as well as charging into the PN junction capacitance generated by the under-PTI semiconductor regions under the partial isolation regions 14a and 15a, it is effective to dope the under-PTI semiconductor regions under the partial isolation region 14a and 15a with impurities of high concentration to generate damage regions. When placing importance on the stability in body potential fixing, it is more preferable to form the partial isolation regions 14a and 15a in a larger area to increase the PN junction capacitance and extend the region into which carriers diffuse.

Sixth Mode

Figure 23:
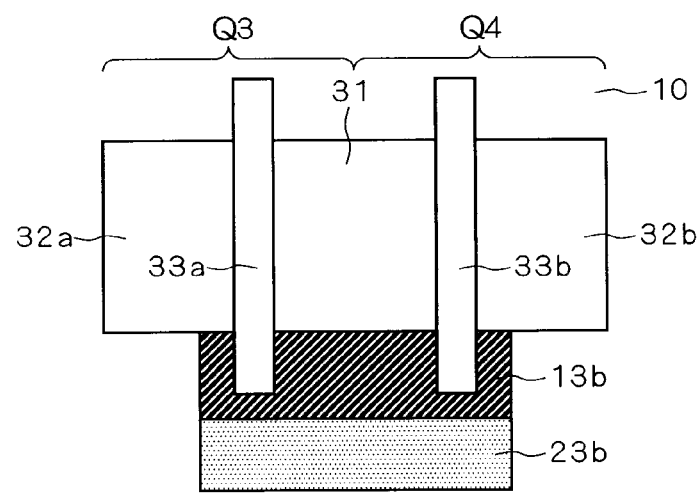
FIG. 23 is a plan view showing the layout of a MOS transistor according to a sixth mode of the fourth preferred embodiment.

FIG. 23 is a plan view showing the sixth mode of the fourth preferred embodiment. As shown in the drawing, the sixth mode differs from the fourth mode in that the partial isolation region 13a is removed, and the full isolation region 10 is provided instead. Other configuration is similar to the fourth mode shown in FIG. 21, and repeated description will be omitted here.

The sixth mode with such configuration achieves the body potential fixing only by applying the fixed potential from the tap region 23b.

The sixth mode is inferior in body fixing effect and superior in integration increasing effect to the fourth mode because of the absence of the partial isolation region 13a. Further, the sixth mode is superior in capacitance reducing effect to the fourth mode because the absence of the partial isolation region 13a removes PN parasitic capacitance which would be generated by the under-PTI semiconductor region under the partial isolation region 13a.

Seventh Mode

Figure 24:
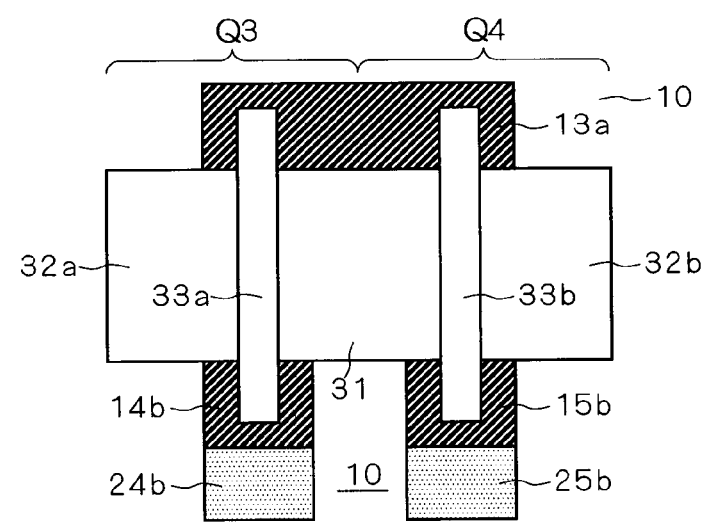
FIG. 24 is a plan view showing the layout of a MOS transistor according to a seventh mode of the fourth preferred embodiment.

FIG. 24 is a plan view showing the seventh mode of the fourth preferred embodiment. As shown in the drawing, the seventh mode differs from the fourth mode in that the partial isolation region 13b and tap region 23b are respectively replaced by partial isolation regions 14b, 15b and tap regions 24b, 25b isolated from each other between the MOS transistors Q3 and Q4. Other configuration is similar to the fourth mode shown in FIG. 21, and repeated description will be omitted here.

The seventh mode with such configuration achieves the body potential fixing by applying the fixed potentials from the tap regions 24b and 25b, charging into the PN junction capacitance generated by the under-PTI semiconductor region under the partial isolation region 13a, and diffusion of carriers.

The seventh mode is slightly inferior in body fixing effect and superior in integration increasing effect to the fourth mode because forming the tap regions 24b and 25b independently reduces the margin for forming contacts. Further, the seventh mode is superior in capacitance reducing effect to the fourth mode because the reduction in area of the partial isolation regions and tap regions as a whole in the other-end gate region achieves reduction in PN junction capacitance and wiring capacitance.

Further, in the seventh mode, in order to increase the stability in body potential fixing as well as charging into the PN junction capacitance generated by the under-PTI semiconductor region under the partial isolation region 13a, it is effective to dope the under-PTI semiconductor region under the partial isolation region 13a with impurities of high concentration to generate a damage region. When placing importance on the stability in body potential fixing, it is more preferable to form the partial isolation region 13a in a larger area to increase the PN junction capacitance and extend the region into which carriers diffuse.

Eighth Mode

Figure 25:
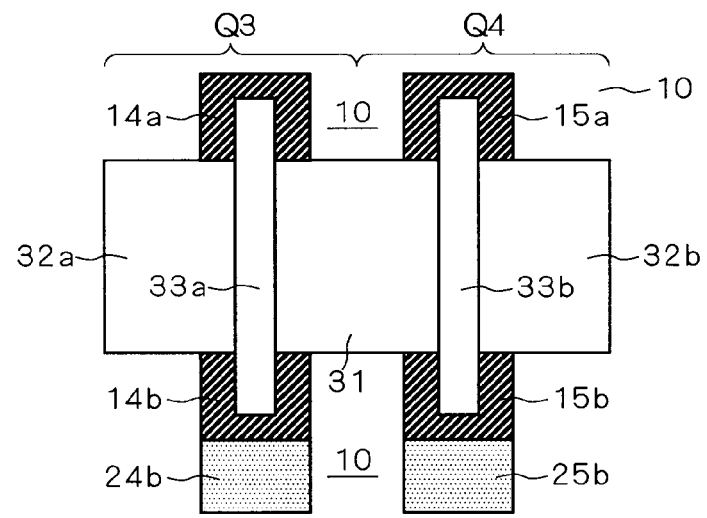
FIG. 25 is a plan view showing the layout of a MOS transistor according to an eighth mode of the fourth preferred embodiment.

FIG. 25 is a plan view showing the eighth mode of the fourth preferred embodiment. As shown in the drawing, the eighth mode differs from the seventh mode in that the partial isolation region 13a is replaced by partial isolation regions 14a and 15a isolated from each other between the MOS transistors Q3 and Q4. Other configuration is similar to the seventh mode shown in FIG. 24, and repeated description will be omitted here.

The eighth mode with such configuration achieves the body potential fixing in the MOS transistors Q3 and Q4 by applying the fixed potentials from the tap regions 24b and 25b, respectively, charging into the PN junction capacitance generated by the under-PTI semiconductor regions under the partial isolation regions 14a and 15a, respectively, and diffusion of carriers.

The eighth mode is inferior in body fixing effect and superior in integration increasing effect to the seventh mode because of the reduction in area of the partial isolation regions 14a and 15a in the one-end gate region. Further, the eighth mode is superior in capacitance reducing effect to the seventh mode because the reduction in area of the partial isolation regions 14a and 15a in the one-end gate region reduces the PN parasitic capacitance generated by the under-PTI semiconductor regions thereunder.

Further, in the eighth mode, in order to increase the stability in body potential fixing as well as charging into the PN junction capacitance generated by the under-PTI semiconductor regions under the partial isolation regions 14a and 15a, it is effective to dope the under-PTI semiconductor regions under the partial isolation region 14a and 15a with impurities of high concentration to generate damage regions. When placing importance on the stability in body potential fixing, it is more preferable to form the partial isolation regions 14a and 15a in a larger area to increase the PN junction capacitance and extend the region into which carriers diffuse.

Ninth Mode

Figure 26:
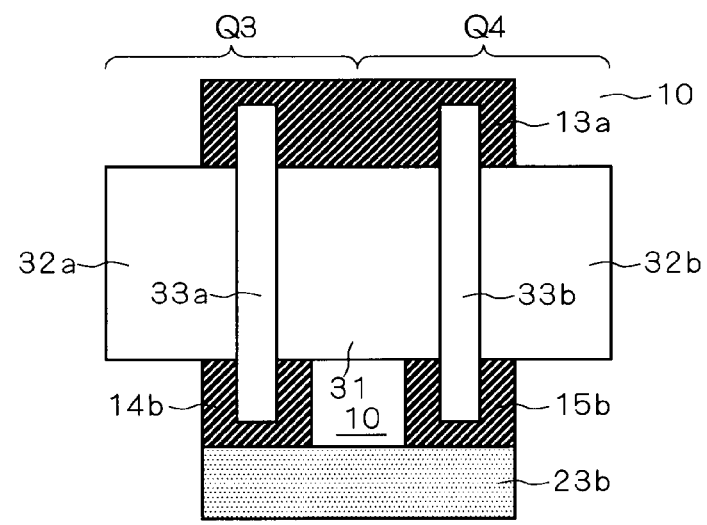
FIG. 26 is a plan view showing the layout of a MOS transistor according to a ninth mode of the fourth preferred embodiment.
Figure 27:
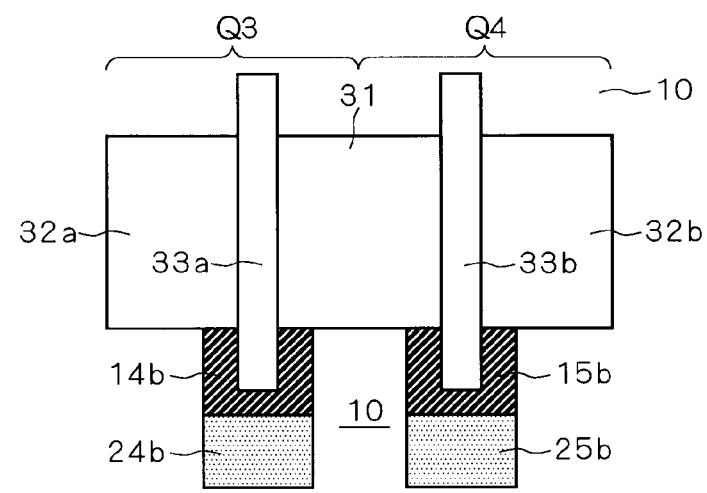
FIG. 27 is a plan view showing the layout of a MOS transistor according to a tenth mode of the fourth preferred embodiment.

FIG. 26 is a plan view showing the ninth mode of the fourth preferred embodiment. As shown in the drawing, the ninth mode differs from the fourth mode in that the partial isolation region 13b is replaced by partial isolation regions 14b and 15b.

More specifically, the partial isolation region 14b is provided in the other-end gate region of the gate electrode 33a, and the partial isolation region 15b is provided on the other-end gate region of the gate electrode 33b. The partial isolation regions 14b and 15b are formed independently to be isolated from each other. Other configuration is similar to the fourth mode shown in FIG. 21, and repeated description will be omitted here.

The ninth mode with such configuration achieves the body potential fixing by applying the fixed potential from the tap region 23b, charging into the PN junction capacitance generated by the under-PTI semiconductor region under the partial isolation region 13a, and diffusion of carriers.

The ninth mode is inferior in body fixing effect and superior in integration increasing effect to the fourth mode because the partial isolation regions 14b and 15b formed independently have a narrower width than the partial isolation region 13b. Further, the ninth mode is superior in capacitance reducing effect to the fourth mode because the reduction in width of the partial isolation regions achieves reduction in PN parasitic capacitance.

Further, in the ninth mode, in order to increase the stability in body potential fixing as well as charging into the PN junction capacitance generated by the under-PTI semiconductor region under the partial isolation region 13a, it is effective to dope the under-PTI semiconductor region under the partial isolation region 13a with impurities of high concentration to generate a damage region. When placing importance on the stability in body potential fixing, it is more preferable to form the partial isolation region 13a in a larger area to increase the PN junction capacitance and extend the region into which carriers diffuse.

Tenth Mode

FIG. 28 is a plan view showing the tenth mode of the fourth preferred embodiment. As shown in the drawing, the tenth mode differs from the seventh mode in that the partial isolation region 13a is removed, and the full isolation region 10 is provided instead. Other configuration is similar to the seventh mode shown in FIG. 24, and repeated description will be omitted here.

The tenth mode with such configuration achieves the body potential fixing independently in the MOS transistors Q3 and Q4 only by applying the fixed potentials from the tap regions 24b and 25b, respectively.

The tenth mode is inferior in body fixing effect and superior in integration increasing effect to the seventh mode because of the absence of the partial isolation region 13a. Further, the tenth mode is superior in capacitance reducing effect to the seventh mode because the absence of the partial isolation region 13a removes PN parasitic capacitance which would be generated by the under-PTI semiconductor region under the partial isolation region 13a.

Eleventh Mode

FIG. 28 is a plan view showing the eleventh mode of the fourth preferred embodiment. As shown in the drawing, the eleventh mode differs from the fourth mode in that no tap region is provided adjacent to the partial isolation region 13b on the other-side gate extension. Other configuration is similar to the fourth mode shown in FIG. 21, and repeated description will be omitted here.

The eleventh mode with such configuration achieves the body potential fixing by charging into the PN junction capacitance generated by the under-PTI semiconductor regions under the partial isolation regions 13a and 13b, and diffusion of carriers.

The eleventh mode is inferior in body fixing effect and superior in integration increasing effect to the fourth mode because of the absence of the tap region 23b. Further, the eleventh mode is superior in capacitance reducing effect to the fourth mode because the absence of the tap region 23b removes wiring capacitance which would be generated by the tap region 23b.

Further, in the eleventh mode, in order to increase the stability in body potential fixing as well as charging into the PN junction capacitance generated by the under-PTI semiconductor regions under the partial isolation regions 13a and 13b, it is effective to dope the under-PTI semiconductor regions under the partial isolation regions 13a and 13b with impurities of high concentration to generate damage regions. When placing importance on the stability in body potential fixing, it is more preferable to form the partial isolation regions 13a and 13b in a larger area to increase the PN junction capacitance and extend the region into which carriers diffuse.

Twelfth Mode

FIG. 29 is a plan view showing the twelfth mode of the fourth preferred embodiment. As shown in the drawing, the twelfth mode differs from the eleventh mode in that the partial isolation region 13b is replaced by partial isolation regions 14b and 15b isolated from each other between the MOS transistors Q3 and Q4. Other configuration is similar to the eleventh mode shown in FIG. 28, and repeated description will be omitted here.

The twelfth mode with such configuration achieves the body potential fixing by charging into the PN junction capacitance generated by the under-PTI semiconductor regions under the partial isolation regions 13a, 14b and 15b, and diffusion of carriers.

The twelfth mode is inferior in body fixing effect and superior in integration increasing effect to the eleventh mode because of the reduction in area of the partial isolation regions 14b and 15b in the other-end gate region. Further, the twelfth mode is superior in capacitance reducing effect to the eleventh mode because the reduction in area of the partial isolation regions 14b and 15b in the other-end gate region reduces the PN parasitic capacitance generated by the under-PTI semiconductor regions thereunder.

Further, in the twelfth mode, in order to increase the stability in body potential fixing as well as charging into the PN junction capacitance generated by the under-PTI semiconductor regions under the partial isolation regions 13a, 14b and 15b, it is effective to dope the under-PTI semiconductor regions under the partial isolation region 13a, 14b and 15b with impurities of high concentration to generate damage regions. When placing importance on the stability in body potential fixing, it is more preferable to form the partial isolation regions 13a, 14b and 15b in a larger area to increase the PN junction capacitance and extend the region into which carriers diffuse.

Thirteenth Mode

FIG. 30 is a plan view showing the thirteenth mode of the fourth preferred embodiment. As shown in the drawing, the thirteenth mode differs from the twelfth mode in that the partial isolation region 13a is replaced by partial isolation regions 14a and 15a isolated from each other between the MOS transistors Q3 and Q4. Other configuration is similar to the twelfth mode shown in FIG. 29, and repeated description will be omitted here.

The thirteenth mode with such configuration achieves the body potential fixing in the MOS transistor Q3 by charging into the PN junction capacitance generated by the under-PTI semiconductor regions under the partial isolation regions 14a and 15a, and diffusion of carriers. The body potential fixing in the MOS transistor Q4 by charging into the PN junction capacitance generated by the under-PTI semiconductor regions under the partial isolation regions 14b and 15b, and diffusion of carriers.

The thirteenth mode is inferior in body fixing effect and superior in integration increasing effect to the twelfth mode because of the reduction in area of the partial isolation regions 14a and 15a in the one-end gate region. Further, the thirteenth mode is superior in capacitance reducing effect to the twelfth mode because the reduction in area of the partial isolation regions 14a and 15a in the one-end gate region reduces the PN parasitic capacitance generated by the under-PTI semiconductor regions thereunder.

Further, in the thirteenth mode, in order to increase the stability in body potential fixing as well as charging into the PN junction capacitance generated by the under-PTI semiconductor regions under the partial isolation regions 14a, 15a, and 14b, 15b, it is effective to dope the under-PTI semiconductor regions under the partial isolation regions 14a, 15a, and 14b, 15b with impurities of high concentration to generate damage regions. When placing importance on the stability in body potential fixing, it is more preferable to form the partial isolation regions 14a, 15a, and 14b, 15b in a larger area to increase the PN junction capacitance and extend the region into which carriers diffuse.

Fourteenth Mode

Figure 31:
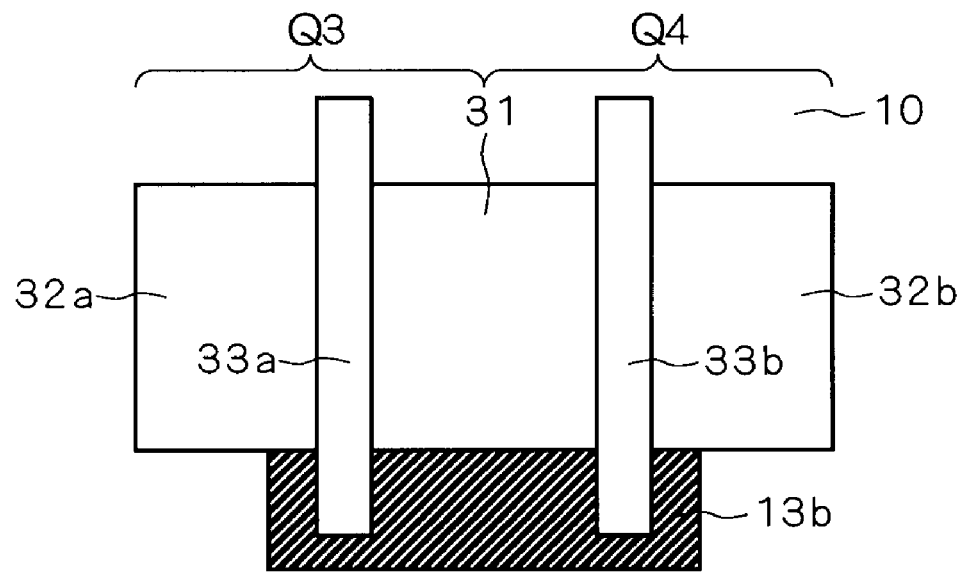
FIG. 31 is a plan view showing the layout of a MOS transistor according to a fourteenth mode of the fourth preferred embodiment.

FIG. 31 is a plan view showing the fourteenth mode of the fourth preferred embodiment. As shown in the drawing, the fourteenth mode differs from the eleventh mode in that the partial isolation region 13a is removed, and the full isolation region 10 is provided instead. Other configuration is similar to the eleventh mode shown in FIG. 28, and repeated description will be omitted here.

The fourteenth mode with such configuration achieves the body potential fixing by charging into the PN junction capacitance generated by the under-PTI semiconductor region under the partial isolation region 13b, and diffusion of carriers.

The fourteenth mode is inferior in body fixing effect and superior in integration increasing effect to the eleventh mode because of the absence of the partial isolation region 13a. Further, the fourteenth mode is superior in capacitance reducing effect to the eleventh mode because the absence of the partial isolation region 13a removes PN parasitic capacitance which would be generated by the under-PTI semiconductor region under the partial isolation region 13a.

Further, in the fourteenth mode, in order to increase the stability in body potential fixing as well as charging into the PN junction capacitance generated by the under-PTI semiconductor region under the partial isolation region 13b, it is effective to dope the under-PTI semiconductor region under the partial isolation region 13b with impurities of high concentration to generate a damage region. When placing importance on the stability in body potential fixing, it is more preferable to form the partial isolation region 13b in a larger area to increase the PN junction capacitance and extend the region into which carriers diffuse.

Fifteenth Mode

Figure 32:
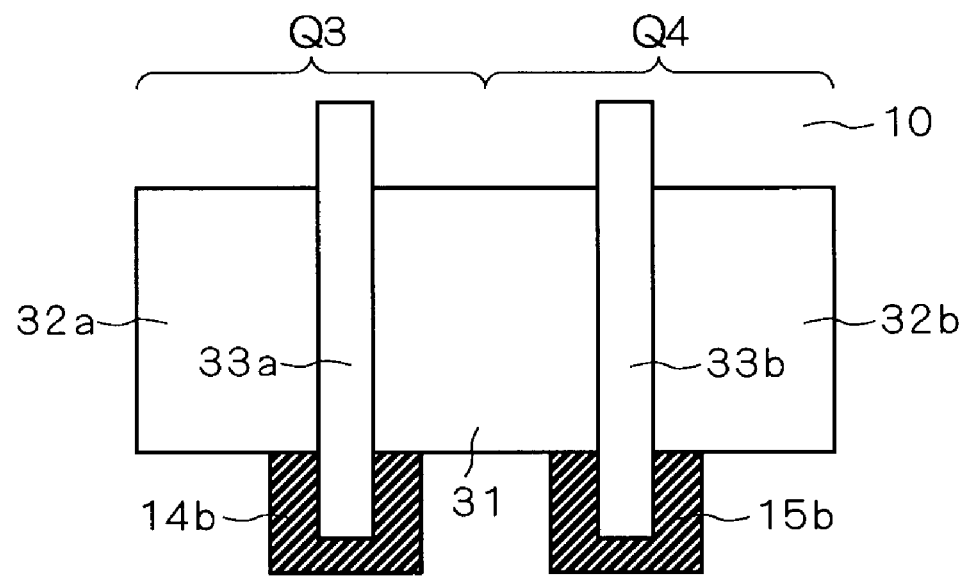
FIG. 32 is a plan view showing the layout of a MOS transistor according to a fifteenth mode of the fourth preferred embodiment.

FIG. 32 is a plan view showing the fifteenth mode of the fourth preferred embodiment. As shown in the drawing, the fifteenth mode differs from the fourteenth mode in that the partial isolation region 13b is replaced by partial isolation regions 14b and 15b isolated from each other between the MOS transistors Q3 and Q4. Other configuration is similar to the fourteenth mode shown in FIG. 31, and repeated description will be omitted here.

The fifteenth mode with such configuration achieves the body potential fixing in the MOS transistors Q3 and Q4 by charging into the PN junction capacitance generated by the under-PTI semiconductor regions under the partial isolation regions 14b and 15b, respectively, and diffusion of carriers.

The fifteenth mode is inferior in body fixing effect and superior in integration increasing effect to the fourteenth mode because of the reduction in area of the partial isolation regions 14b and 15b in the other-end gate region. Further, the fifteenth mode is superior in capacitance reducing effect to the fourteenth mode because the reduction in area of the partial isolation regions 14b and 15b in the other-end gate region reduces the PN parasitic capacitance generated by the under-PTI semiconductor regions thereunder.

Further, in the fifteenth mode, in order to increase the stability in body potential fixing as well as charging into the PN junction capacitance generated by the under-PTI semiconductor regions under the partial isolation regions 14b and 15b, it is effective to dope the under-PTI semiconductor regions under the partial isolation region 14b and 15b with impurities of high concentration to generate damage regions. When placing importance on the stability in body potential fixing, it is more preferable to form the partial isolation regions 14b and 15b in a larger area to increase the PN junction capacitance and extend the region into which carriers diffuse.

Sixteenth Mode (Combination with the Second Preferred Embodiment)

Figure 33:
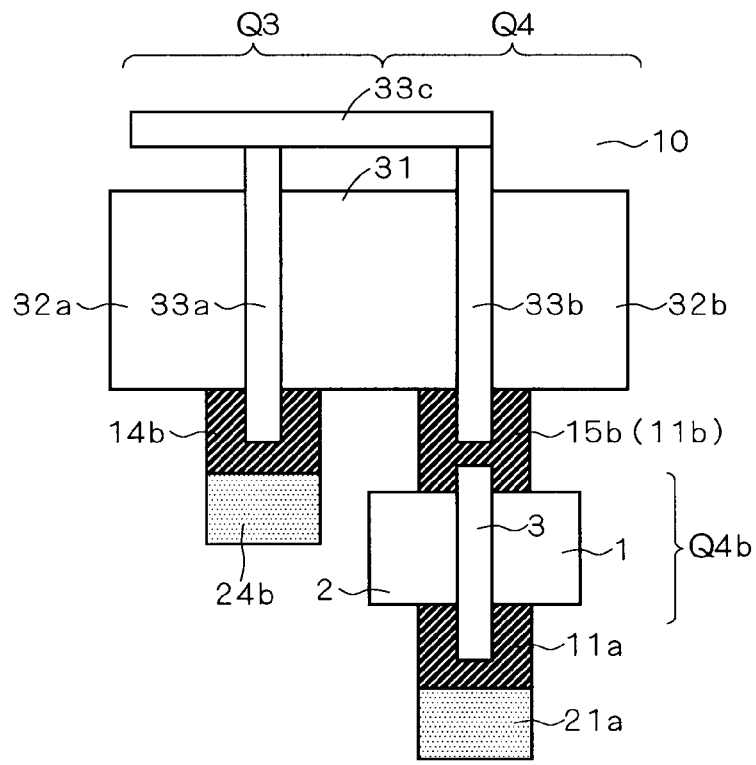
FIG. 33 is a plan view showing the layout of a MOS transistor according to a sixteenth mode of the fourth preferred embodiment.

FIG. 33 is a plan view showing the sixteenth mode of the fourth preferred embodiment. As shown in the drawing, MOS transistors Q3 and Q4a are configured similarly to the tenth mode except that the gate electrodes 33a and 33b are made in common by the gate electrode 33c, and that the tap region 25b is omitted for providing a MOS transistor Q4b.

The MOS transistor Q4b is configured similarly to the MOS transistor according to the second mode of the first preferred embodiment shown in FIG. 2.

In this manner, the layout may be combined with another preferred embodiment, as a matter of course.

Others

In the above-described first to sixteenth modes of the fourth preferred embodiment, the tap regions 23a and 23b (tap regions 24a, 24b, 25a, 25b) may be provided with no contact. With such configuration, the body potential fixing is achieved by charging into the PN junction capacitance generated by the under-PTI semiconductor regions under the partial isolation regions and diffusion of carriers into the tap regions as well as the under-PTI semiconductor regions. When placing importance on the stability in body potential fixing, it is more preferable to form the partial isolation regions and tap regions in a larger area. Further, it is preferable to form the damage region described in the fourth and fifth modes in each tap region.

It is preferable to set the width of the partial isolation regions 13a and 13b (i.e., dimension in the direction that the source/drain extends: in the lateral direction in the drawing) according to the fourth preferred embodiment at the sum of {distance between the outermost gates (i.e., the distance between the gate electrodes 33a and 33b in the fourth preferred embodiment showing only two gate electrodes)+twice the length of the outermost gate (i.e., the sum of lengths of the respective gate electrodes 33a and 33b in the fourth preferred embodiment)+exposure overlay misalignment+process fluctuations}.

For instance, the partial isolation regions may be formed in a width of {distance between the outermost gates+twice the length of the outermost gate+0.1 μm (0.05 μm on each side) (=exposure overlay misalignment+process fluctuations)}.

It is more effective to form the tap regions in a width (i.e., dimension in the direction that the source/drain extends) substantially equal to or larger than the width of the partial isolation regions, but may be smaller to a degree that contacts can be provided.

Further, it is preferable to form the tap regions in a length (i.e., dimension in the direction that the gate electrode extends: in the vertical direction in the drawing) not less than a dimension that contact holes can be formed.

Fifth Preferred Embodiment

FIGS. 34 to 41 are plan views respectively showing the layout of a MOS transistor formed on a SOI substrate according to first to eighth modes of a fifth preferred embodiment. The fifth preferred embodiment will focus attention to the layout of a unit MOS transistor.

First Mode

Figure 34:
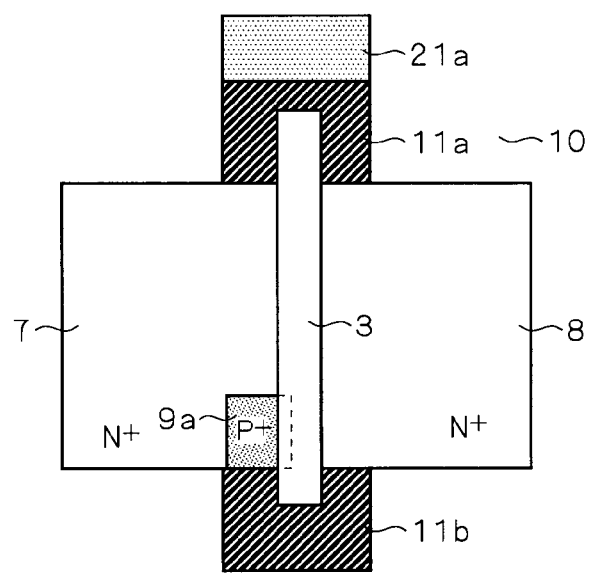
FIG. 34 is a plan view showing the layout of a MOS transistor formed on a SOI substrate according to first to eighth modes of a fifth preferred embodiment.

FIG. 34 is a plan view showing the first mode of the fifth preferred embodiment. In this drawing, the gate electrode 3 is formed on a body region (with a channel region on its surface; both not shown) between the source region 7 and drain region 8 with a gate oxide film (not shown) interposed therebetween. This gate electrode 3 has its both ends respectively extending out in plan view from the forming regions of the source region 7 and drain region 8 (hereinafter may be briefly referred to as "active regions 7 and 8" including the body region between the active regions 7 and 8).

The partial isolation regions 11a and 11b are formed in the one-end gate region and the other-end gate region of the gate electrode 3, respectively. The tap region (body-fixing active region) 21a is provided adjacent to the partial isolation region 11a on the one-side gate extension.

In addition, a P-type source tie region 9a is provided in the vicinity of the other-end gate region to extend from part of the upper portion of the source region 7 to part of the upper portion of the body region.

The full isolation region 10 is provided in the whole area around the partial isolation regions 11a, 11b, tap region 21a, and active regions 7 and 8.

The first mode of the fifth preferred embodiment with such configuration (where the partial isolation regions 11a and 11b are formed in both end gate regions, the tap region 21a is provided on the one-side gate extension, and the source contact region 9a is provided in the vicinity of the other-end gate region) achieves the body potential fixing by applying the fixed potential from the tap region 21a, applying the fixed potential from the source tie region 9a, charging into the PN junction capacitance generated by the under-PTI semiconductor region under the partial isolation region 11b, and diffusion of carriers.

In this manner, the first mode of the fifth preferred embodiment achieves a better body fixing effect than in the second mode of the first preferred embodiment shown in FIG. 2 particularly in the other-end gate region because the application of fixed potential from the source tie region 9a in addition to charging into the PN junction capacitance generated by the under-PTI semiconductor region under the partial isolation region 11b and diffusion of carriers contributes to the body potential fixing.

Further, providing the full isolation region 10 for device isolation in the whole area around the active regions 7 and 8 except the both end gate regions achieves the integration increasing effect, similarly to the second mode of the first preferred embodiment.

In addition, providing the full isolation region 10 for device isolation in the whole area around the active regions 7 and 8 except the both end gate regions achieves the capacitance reducing effect, similarly to the second mode of the first preferred embodiment.

Second Mode

FIG. 35 is a plan view showing the second mode of the fifth preferred embodiment. In this drawing, a P-type source tie region 9b is provided in the vicinity of the central part of the gate electrode 3 to extend from part of the upper portion of the source region 7 to part of the upper portion of the body region under the gate electrode 3. Other configuration is similar to the first mode shown in FIG. 34, and repeated description will be omitted here.

The second mode is superior in body fixing effect to the first mode because of the presence of the source tie region 9b, resulting in more stable device properties.

Third Mode

FIG. 36 is a plan view showing the third mode of the fifth preferred embodiment. As shown in the drawing, the third mode differs from the first mode in that the partial isolation region 11b is not provided in the other-end gate region, and the full isolation region 10 is provided instead. Other configuration is similar to the first mode shown in FIG. 34, and repeated description will be omitted here.

The third mode with such configuration achieves the body potential fixing by applying the fixed potential from the tap region 21a and applying the fixed potential from the source tie region 9a.

The third mode is inferior in body fixing effect and superior in integration increasing effect to the first mode because of the absence of the partial isolation region 11b. Further, the third mode is superior in capacitance reducing effect to the first mode because the absence of the partial isolation region 11b removes the PN parasitic capacitance which would be generated by the partial isolation region 11b.

Fourth Mode

Figure 37:
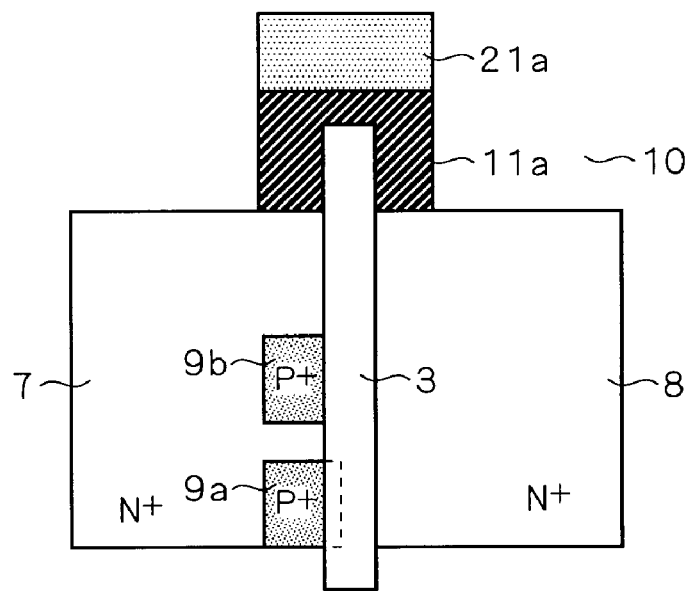
FIG. 37 is a plan view showing the layout of a MOS transistor according to the fourth mode of the fifth preferred embodiment.

FIG. 37 is a plan view showing the fourth mode of the fifth preferred embodiment. As shown in the drawing, the fourth mode differs from the second mode in that the partial isolation region 11b is not provided in the other-end gate region, and the full isolation region 10 is provided instead. Other configuration is similar to the second mode shown in FIG. 35, and repeated description will be omitted here.

The fourth mode with such configuration achieves the body potential fixing by applying the fixed potential from the tap region 21a and applying the fixed potentials from the source tie regions 9a and 9b.

The fourth mode is inferior in body fixing effect and superior in integration increasing effect to the second mode because of the absence of the partial isolation region 11b. Further, the fourth mode is superior in capacitance reducing effect to the second mode because the absence of the partial isolation region 11b removes PN parasitic capacitance which would be generated by the partial isolation region 11b.

Fifth Mode

Figure 38:
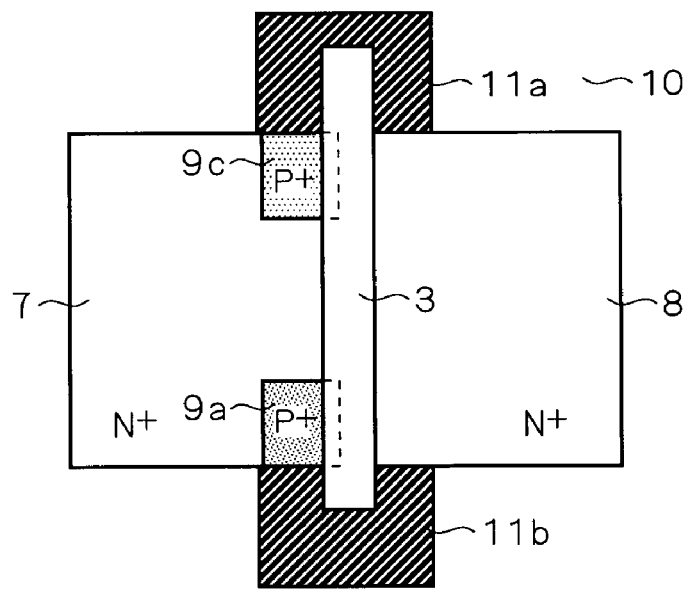
FIG. 38 is a plan view showing the layout of a MOS transistor according to the fifth mode of the fifth preferred embodiment.

FIG. 38 is a plan view showing the fifth mode of the fifth preferred embodiment. As shown in the drawing, the fifth mode differs from the first mode in that the tap region 21a is not provided, and a P-type source tie region 9c is added. The source tie region 9c is provided in the vicinity of the one-end gate region to extend from part of the upper portion of the source region 7 to part of the upper portion of the body region. Other configuration is similar to the first mode shown in FIG. 34, and repeated description will be omitted here.

The fifth mode with such configuration achieves the body potential fixing by applying the fixed potentials from the source tie regions 9a and 9c, charging into the PN junction capacitance generated by the under-PTI semiconductor regions under the partial isolation regions 11a and 11b, and diffusion of carriers.

The fifth mode is inferior in body fixing effect and superior in integration increasing effect to the first mode because of the absence of the tap region 21a, but superior in body fixing effect because of the presence of the source tie region 9c. Further, the fifth mode is superior in capacitance reducing effect to the first mode because the absence of the tap region 21a removes wiring capacitance which would be generated by the tap region 21a.

In order to increase the stability in body potential fixing as well as charging into the PN junction capacitance generated by the under-PTI semiconductor regions under the partial isolation regions 11a and 11b, the under-PTI semiconductor regions under the partial isolation regions 11a and 11b may be doped with impurities of high concentration to generate damage regions, which prevents the body potential from becoming unstable due to electron-hole recombination. When placing importance on the stability in body potential fixing, it is more preferable to form the partial isolation regions 11a and 11b in a larger area to increase the PN junction capacitance and extend the region into which carriers diffuse.

Sixth Mode

FIG. 39 is a plan view showing the sixth mode of the fifth preferred embodiment. As shown in the drawing, the P-type source tie region 9b is further provided in the vicinity of the central part of the gate electrode 3 to extend from part of the upper portion of the source region 7 to part of the upper portion of the body region under the gate electrode 3. Other configuration is similar to the fifth mode shown in FIG. 38, and repeated description will be omitted here.

The sixth mode is superior in body fixing effect to the fifth mode because of the presence of the source tie region 9b, resulting in more stable device properties.

In order to increase the stability in body potential fixing as well as charging into the PN junction capacitance generated by the under-PTI semiconductor regions under the partial isolation regions 11a and 11b, the under-PTI semiconductor regions under the partial isolation regions 11a and 11b may be doped with impurities of high concentration to generate damage regions, which prevents the body potential from becoming unstable due to electron-hole recombination. When placing importance on the stability in body potential fixing, it is more preferable to form the partial isolation regions 11a and 11b in a larger area to increase the PN junction capacitance and extend the region into which carriers diffuse.

Seventh Mode

FIG. 40 is a plan view showing the seventh mode of the fifth preferred embodiment. As shown in the drawing, the seventh mode differs from the third mode in that the tap region 21a is not provided. Other configuration is similar to the third mode shown in FIG. 36, and repeated description will be omitted here.

The seventh mode with such configuration achieves the body potential fixing by applying the fixed potential from the source tie region 9a, charging into the PN junction capacitance generated by the under-PTI semiconductor region under the partial isolation region 11a, and diffusion of carriers.

The seventh mode is inferior in body fixing effect and superior in integration increasing effect to the third mode because of the absence of the tap region 21a. Further, the seventh mode is superior in capacitance reducing effect to the third mode because the absence of the tap region 21a removes wiring capacitance which would be generated by the tap region 21a.

In order to increase the stability in body potential fixing as well as charging into the PN junction capacitance generated by the under-PTI semiconductor region under the partial isolation region 11a, the under-PTI semiconductor region under the partial isolation region 11a may be doped with impurities of high concentration to generate a damage region, which prevents the body potential from becoming unstable due to electron-hole recombination. When placing importance on the stability in body potential fixing, it is more preferable to form the partial isolation region 11a in a larger area to increase the PN junction capacitance and extend the region into which carriers diffuse.

Eighth Mode

FIG. 41 is a plan view showing the eighth mode of the fifth preferred embodiment. As shown in the drawing, the P-type source tie region 9b is further provided in the vicinity of the central part of the gate electrode 3 to extend from part of the upper portion of the source region 7 to part of the upper portion of the body region under the gate electrode 3. Other configuration is similar to the seventh mode shown in FIG. 40, and repeated description will be omitted here.

The eighth mode with such configuration is superior in body fixing effect to the seventh mode because of the presence of the source tie region 9b, resulting in more stable device properties.

In order to increase the stability in body potential fixing as well as charging into the PN junction capacitance generated by the under-PTI semiconductor region under the partial isolation region 11a, the under-PTI semiconductor region under the partial isolation region 11a may be doped with impurities of high concentration to generate a damage region, which prevents the body potential from becoming unstable due to electron-hole recombination. When placing importance on the stability in body potential fixing, it is more preferable to form the partial isolation region 11a in a larger area to increase the PN junction capacitance and extend the region into which carriers diffuse.

Others

In the above-described first to eighth modes of the fifth preferred embodiment, the tap regions 21a and 21b may be provided with no contact. With such configuration, the body potential fixing is achieved by charging into the PN junction capacitance generated by the under-PTI semiconductor regions under the partial isolation regions and diffusion of carriers into the tap regions as well as the under-PTI semiconductor regions. When placing importance on the stability in body potential fixing, it is more preferable to form the partial isolation regions and tap regions in a larger area. Further, it is preferable to form a damage region in each tap region.

While the fifth preferred embodiment has been directed to an NMOS transistor by way of example, source tie regions may be arranged at wider spacing in a PMOS transistor because the PMOS transistor is characterized by small amount of supply current, which less likely to bring about impact ionization than in the NMOS transistor.

It is also preferable to set the width of each of the partial isolation regions 11a and 11b (i.e., dimension in the direction that the source/drain extends: in the lateral direction in the drawing) according to the fifth preferred embodiment at the sum of {gate length of the gate electrode 3+exposure overlay misalignment+process fluctuations}.

For instance, the partial isolation regions may be formed in a width of {gate length+0.1 μm (0.05 μm on each side)(=exposure overlay misalignment+process fluctuations)} (min=0.2 μm).

Damage Region Generating Process

First Mode

Figure 48:
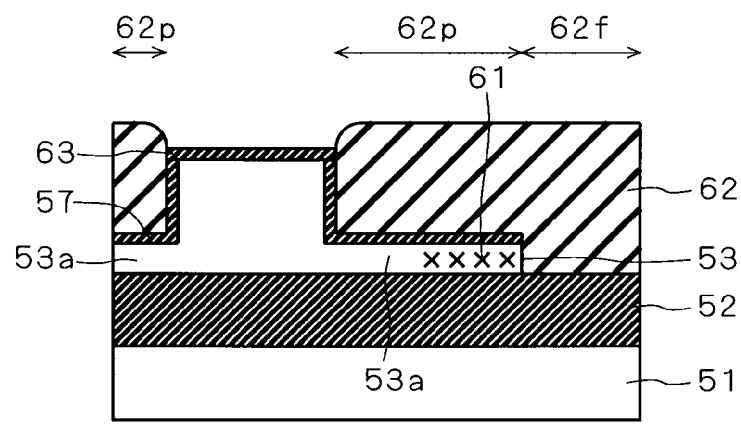
Figure 49:
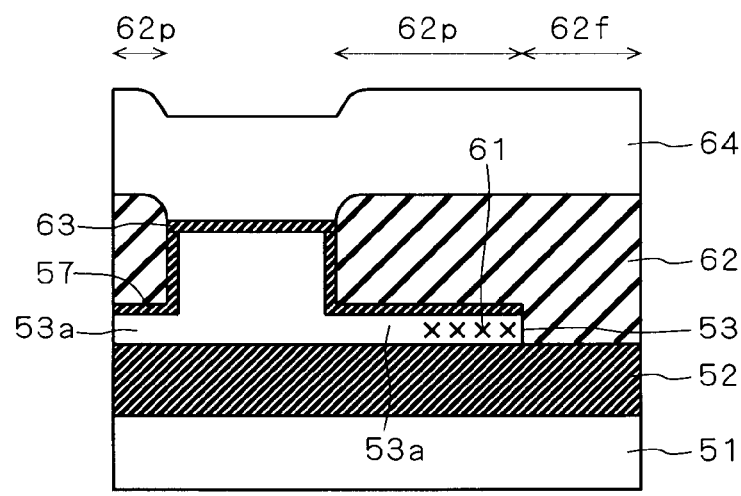
Figure 50:
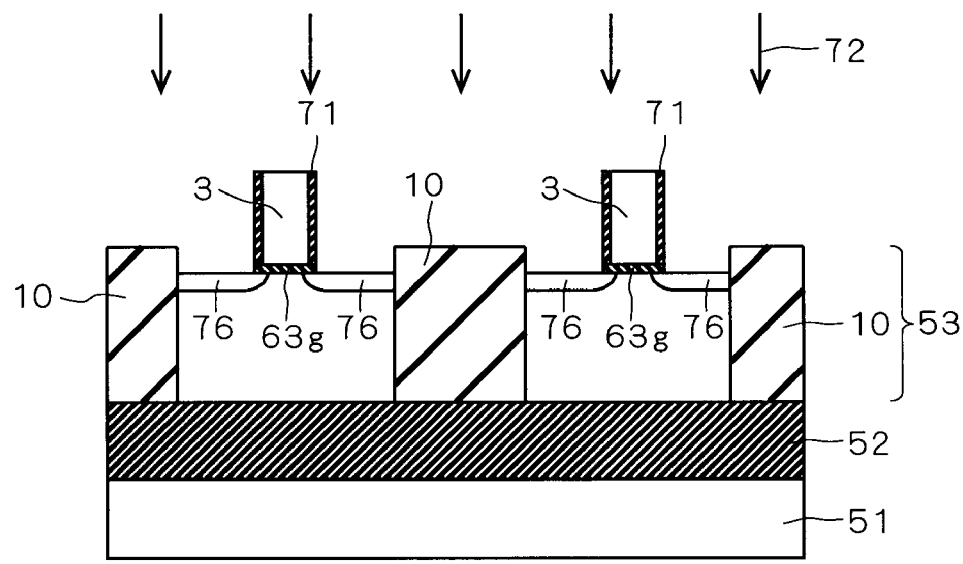
Figure 51:
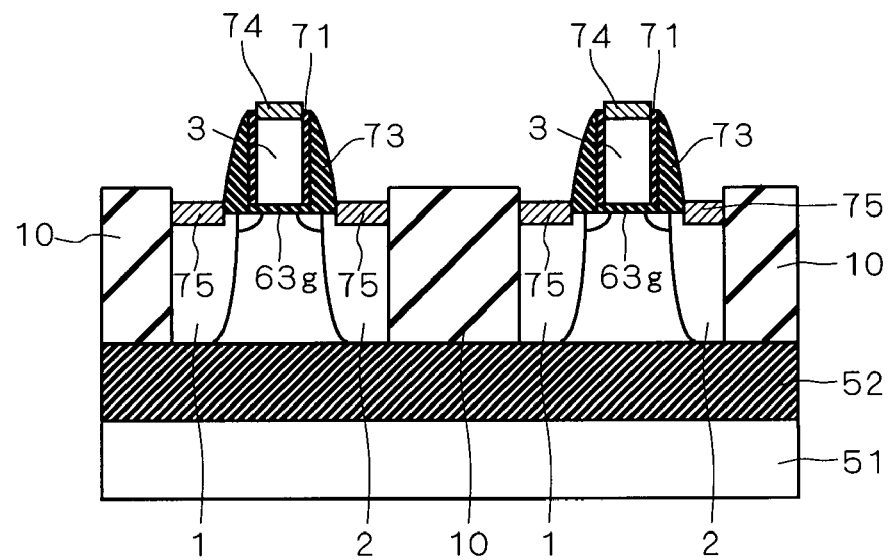
Figure 52:
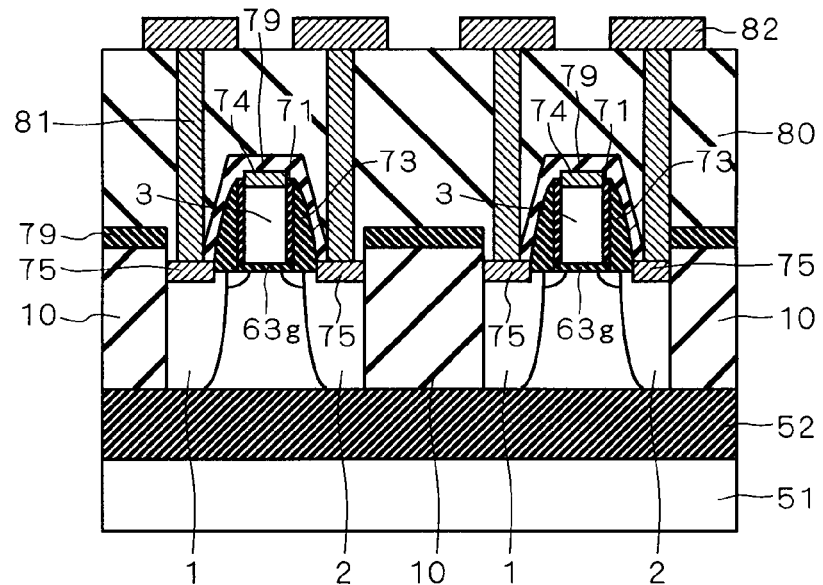

FIGS. 42 through 52 are sectional views showing a first mode of damage region generation process in the under-PTI semiconductor regions as described in the fourth and fifth modes of the first preferred embodiment. Hereinafter, a manufacturing method of the first mode will be described with reference to these drawings. The cross sections shown in FIGS. 41 to 49 are taken along the line B-B of FIG. 5, and the cross sections shown in FIGS. 50 to 52 are taken along the line C-C of FIG. 5 (showing two MOS transistors).

Figure 42:
FIGS. 42 through 52 are sectional views showing a first mode of damage region generation.

As shown in FIG. 42, the buried insulating film 52 having a thickness of 10 to 1000 nm is formed on the silicon support substrate 51, and the SOI layer 53 having a thickness of 30 to 200 nm is formed on the buried insulating film 52. These silicon support substrate 51, buried insulating film 52 and SOI layer 53 constitute a SOI substrate. Then, a silicon oxide film 54 having a thickness of 1 to 100 nm and a silicon nitride film 55 having a thickness of 10 to 1000 nm are sequentially deposited on the SOI layer 53.

Figure 43:
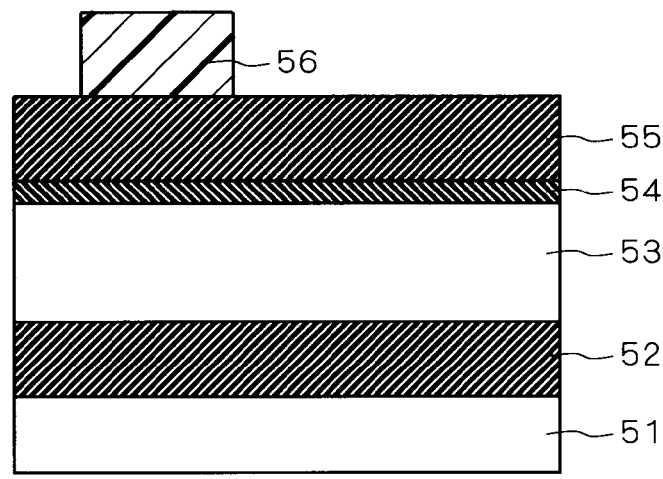

Next, as shown in FIG. 43, a resist film is applied to the whole surface, and is patterned by photolithography, to thereby form a resist pattern 56 for trench formation.

Figure 44:
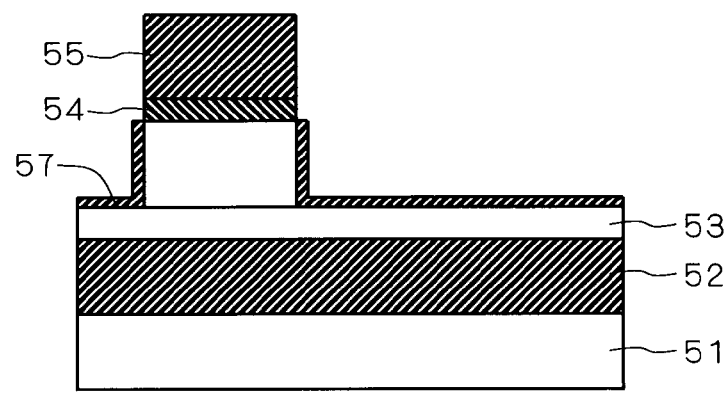

Then, as shown in FIG. 44, the silicon nitride film 55, silicon oxide film 54 and SOI layer 53 are subjected to etching using the resist pattern 56 as a mask. At this time, etching is carried out to leave part of the SOI layer 53 in order to form partial isolation regions. Further, the inner wall of the trench is oxidized (into a thickness of 5 to 50 nm) to form a silicon oxide film 57 on the surface and side face of the remaining SOI layer 53. This silicon oxide film 57 does not necessarily need to be formed.

Figure 45:
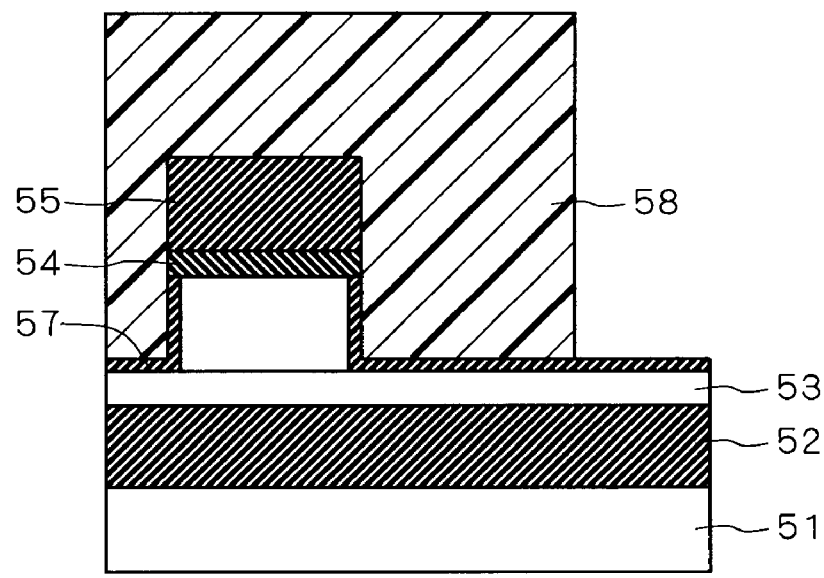

Subsequently, as shown in FIG. 45, a resist pattern 58 for forming a full isolation region (FTI) is formed by photolithography. The silicon oxide film 57 and SOI layer 53 positioned at the trench opening are then etched using the resist pattern 58 as a mask, to thereby form an FTI trench 38 (cf. FIG. 46).

Figure 46:
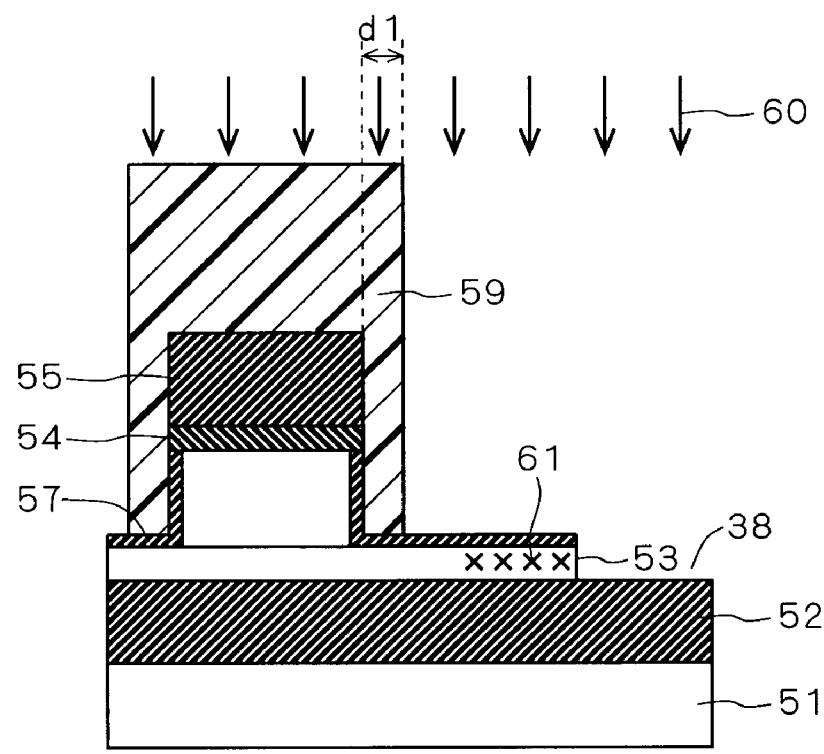
Figure 47:
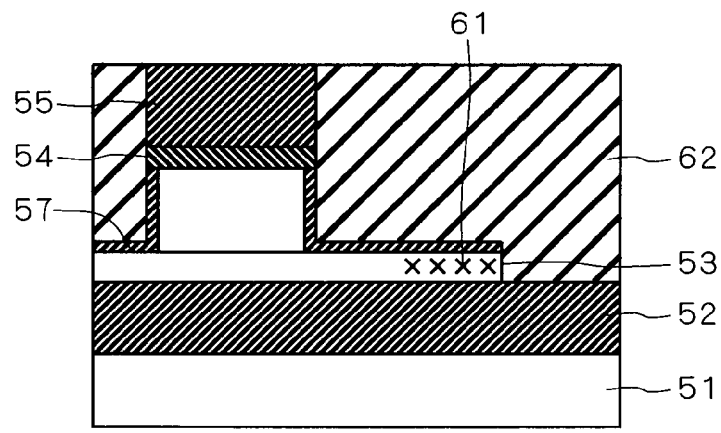

Next, as shown in FIG. 46, a resist pattern 59 patterned to cover a width d1 or more is formed from the side face of the silicon nitride film 55 toward a partial-isolation-region to-be-formed region (PTI region), and a damage-region generation impurity 60 is implanted using the resist pattern 59 as a mask, to thereby form crystal defects 61 in part of the SOI layer 53.

The damage-region generation impurity 60 may be silicon (Si), argon (Ar), nitride (N), arsenic (As), or the like when forming N well regions at the same time, and may be indium (In) when forming P well regions at the same time. The impurity 60 has a concentration of about $1e13/cm^2$ to $1e16/cm^2$. The width d1 shall satisfy the relation d1>Xdmax (maximum depletion layer width).

Figure 53:
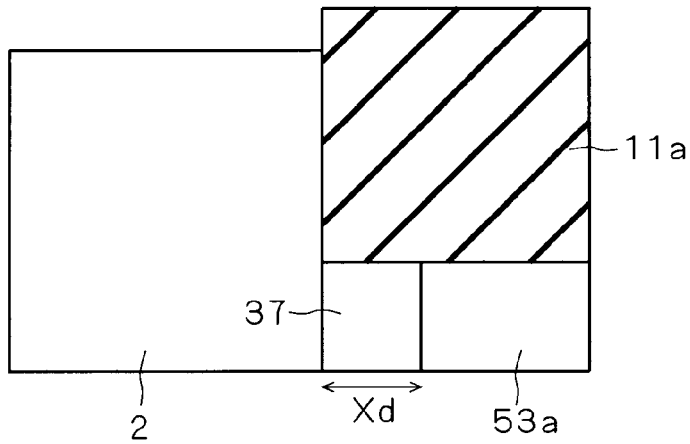
FIG. 53 is an explanatory view schematically showing the width of a depletion layer.

This will be described in detail. FIG. 53 is an explanatory view schematically showing a depletion layer width Xd. This cross section is taken along the line B-B of FIG. 5. As shown in the drawing, the drain region 2 and under-PTI semiconductor region 53a under the partial isolation region 11a are adjacent to each other at a position.

While the drain region 2 has a relatively high concentration (of the order of $10^{20}$ $cm^{-3}$), the under-PTI semiconductor region 53a has a relatively low concentration (of the order of $10^{18}$ $cm^{-3}$), causing a depletion layer 37 to extend from the drain region 2 toward the under-PTI semiconductor region 53a. The depletion layer width Xd of the depletion layer 37 is determined by the impurity concentration of the drain region 2, applied voltage, and the like. For instance, applying a drain voltage of about 1.2 V with the aforementioned impurity concentration of the drain region 2 results in a depletion layer width Xd of about 54 nm. The expression for obtaining the depletion layer width Xd is already known, and is disclosed in, for example, Japanese translation of "Semiconductor Device" by S. M. Sze, 14th edition, published by Sangyo Tosho Co. Ltd., Mar. 16, 2001 (pp. 72-79).

As described, previously obtaining the maximum depletion layer width Xdmax by the known expression to previously obtain the width d1 of the resist pattern 59 ensures avoidance of leakage current due to damage to the depletion layer.

Referring back to FIG. 47, a silicon oxide film 62 is buried, and annealing is done at 500 to 1300° C. This annealing is not always necessary. Then, the silicon oxide film 62 is subjected to CMP processing to be planarized. At this time, highly accurate planarization is achieved using the silicon nitride film 55 as a polishing stopper.

As shown in FIG. 48, the silicon oxide film 62 is further etched back to any thickness so as to control the thickness of the isolation oxide film, and the silicon nitride film 55 and silicon oxide film 54 are removed. As a result, in the remaining silicon oxide film 62, a full isolation region 62f reaching the buried insulating film 52 and a partial isolation region 62p with the under-PTI semiconductor region 53a remaining thereunder are completed.

Next, as shown in FIG. 49, the silicon oxide film 63 (gate insulating film) is formed on the SOI layer 53, and the polysilicon layer 64 is deposited thereon and patterned by photolithography, to thereby form the gate electrode 3 (cf. FIG. 50).

Thereafter, as shown in FIG. 50, a silicon oxide film spacer 71 is formed on the side face of the gate electrode 3, and impurity ions 72 of different conductivities are then implanted twice, to thereby form an extension region and a pocket region 76. In FIG. 50, the full isolation region 62f shown in FIGS. 48 and 49 is shown as the full isolation region 10.

Next, as shown in FIG. 51, a sidewall 73 is formed on the side face of the silicon oxide film spacer 71, and impurities for forming source/drain regions are implanted, to thereby form the source region 1 and drain region 2. Then, after annealing, a metal silicide region 75 is formed on the source region 1 and drain region 2, and a metal silicide region 74 is formed on the gate electrode 3.

Then, as shown in FIG. 52, a silicon nitride film 79 and interlayer insulating film 80 are formed on the whole surface, and the interlayer insulating film 80 is planarized by CMP processing. A resist pattern for etching is formed by photolithography, and contact holes are created by etching on the source region 1 and drain region 2. The contact holes are then buried with metal, to thereby form metal plugs 81. Then, metal interconnections 82 made of aluminum (Al), copper (Cu) or the like are electrically connected to the metal plugs 81.

Second Mode

FIGS. 54 through 62 are sectional views showing a second mode of damage region generation process. Hereinafter, a manufacturing method of the second mode will be described with reference to these drawings. The cross sections shown in FIGS. 54 through 62 are taken along the line B-B of FIG. 5.

Figure 54:
FIG. 54 through 62 are sectional views showing a second mode of damage region generation.

As shown in FIG. 54, the buried insulating film 52 having a thickness of 10 to 1000 nm is formed on the silicon support substrate 51, and the SOI layer 53 having a thickness of 30 to 200 nm is formed on the buried insulating film 52. These silicon support substrate 51, buried insulating film 52 and SOI layer 53 constitute a SOI substrate. Then, the silicon oxide film 54 having a thickness of 1 to 100 nm and silicon nitride film 55 having a thickness of 10 to 1000 nm are sequentially deposited on the SOI layer 53.

Figure 55:
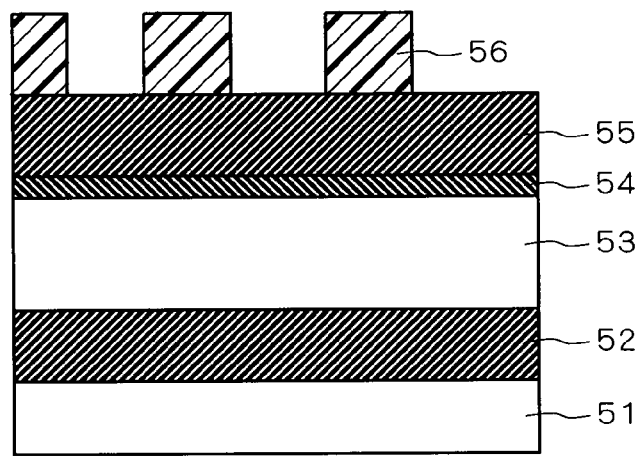

Next, as shown in FIG. 55, a resist film is applied to the whole surface, and is patterned by photolithography, to thereby form the resist pattern 56 for trench formation.

Figure 56:
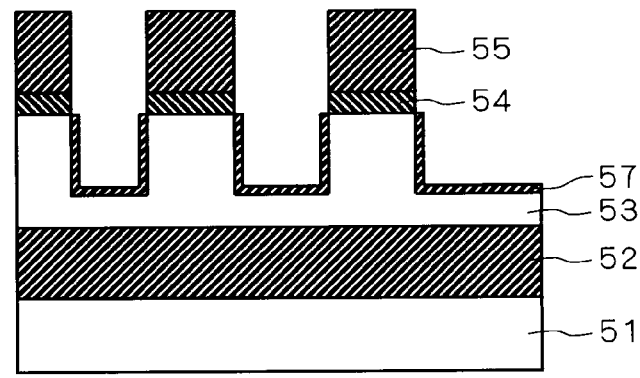

Then, as shown in FIG. 56, the silicon nitride film 55, silicon oxide film 54 and SOI layer 53 are subjected to etching using the resist pattern 56 as a mask. At this time, etching is carried out to leave part of the SOI layer 53 in order to form partial isolation regions. Further, the inner wall of the trench is oxidized (into a thickness of 5 to 50 nm) to form the silicon oxide film 57 on the surface and side face of the remaining SOI layer 53. This silicon oxide film 57 does not necessarily need to be formed.

Figure 57:
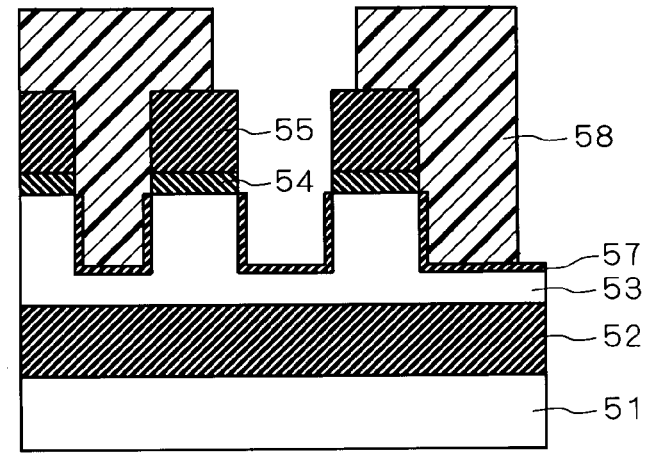

Subsequently, as shown in FIG. 57, the resist pattern 58 for forming a full isolation region (FTI) is formed by photolithography. The silicon oxide film 57 and SOI layer 53 positioned at the trench opening are then etched using the resist pattern 58 as a mask, to thereby form the FTI trench 38 (cf. FIG. 58).

Figure 58:
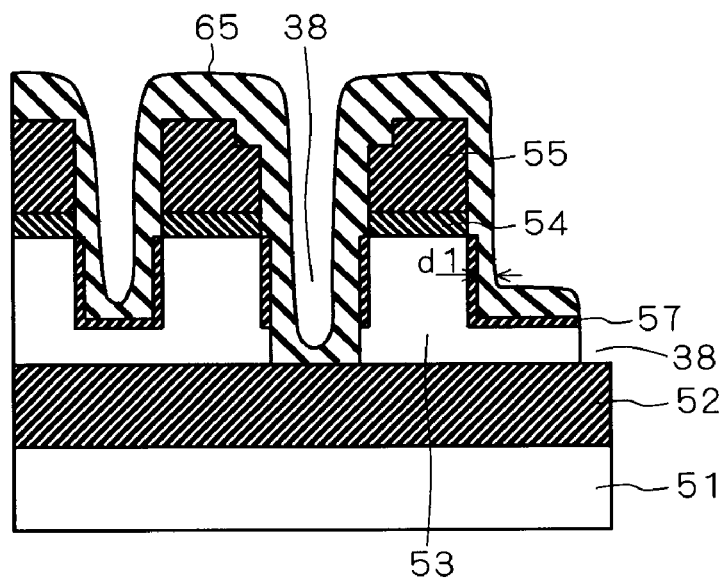

Then, as shown in FIG. 58, the silicon oxide film 65 is deposited conformally in a width d1. The width d1 shall satisfy the relation d1>Xdmax at this time.

Figure 59:
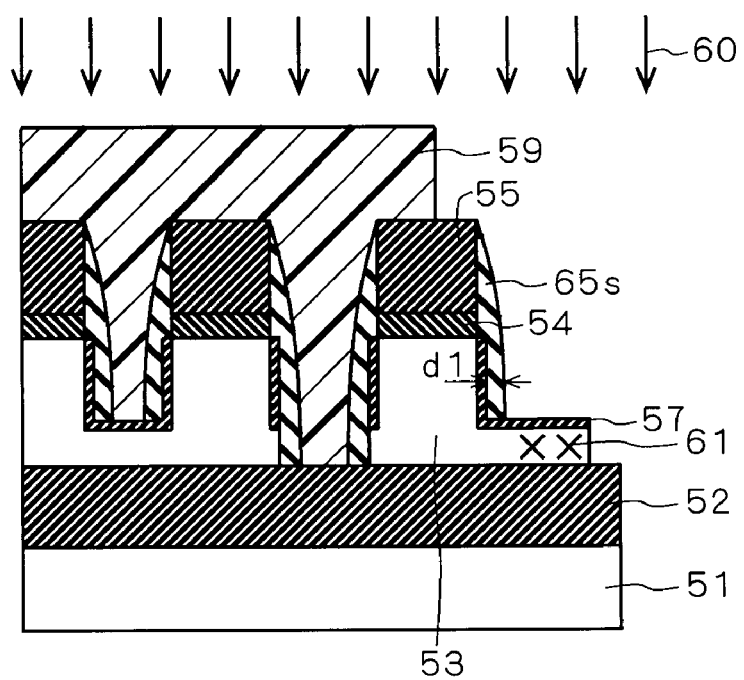

Next, as shown in FIG. 59, the silicon oxide film 65 is subjected to anisotropic dry etching (etched back) to form a silicon oxide film spacer 65s, which serves as a spacer for active regions. Thereafter, the resist pattern 59 as patterned is provided in a region not to be damaged (such as the under-PTI semiconductor region for making an electric connection between the tap region and body region). The damage-region generation impurity 60 such as Si, Ar, N, As (for forming N well regions), In (for forming P well regions) or the like is implanted at a concentration of about 1e13/cm² to 1e16/cm², to thereby form crystal defects 61 in part of the SOI layer 53.

Figure 60:
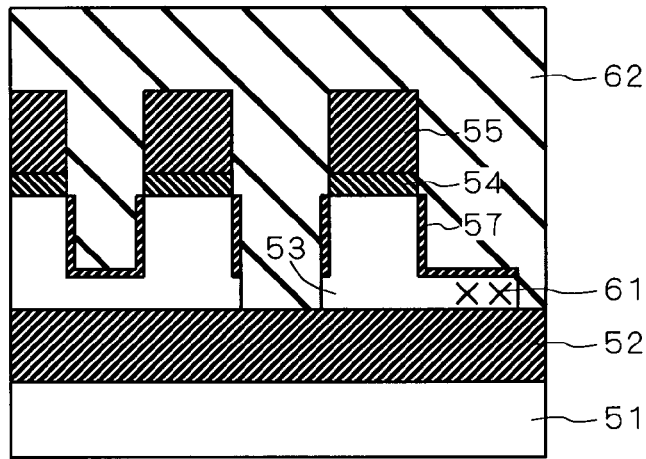

Next, as shown in FIG. 60, the silicon oxide film 62 is buried, and annealing is done at 500 to 1300° C. This annealing is not always necessary. Then, the silicon oxide film 62 is subjected to CMP processing to be planarized. At this time, highly accurate planarization is achieved using the silicon nitride film 55 as a polishing stopper.

Figure 61:
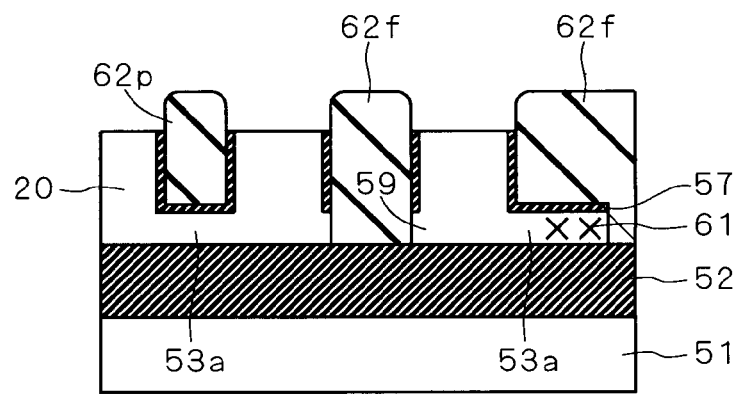

As shown in FIG. 61, the silicon oxide film 62 is further etched back to any thickness so as to control the thickness of the isolation oxide film, and the silicon nitride film 55 and silicon oxide film 54 are removed. As a result, in the remaining silicon oxide film 62, the full isolation region 62f reaching the buried insulating film 52 and partial isolation region 62p with the under-PTI semiconductor region 53a remaining thereunder are completed.

Figure 62:
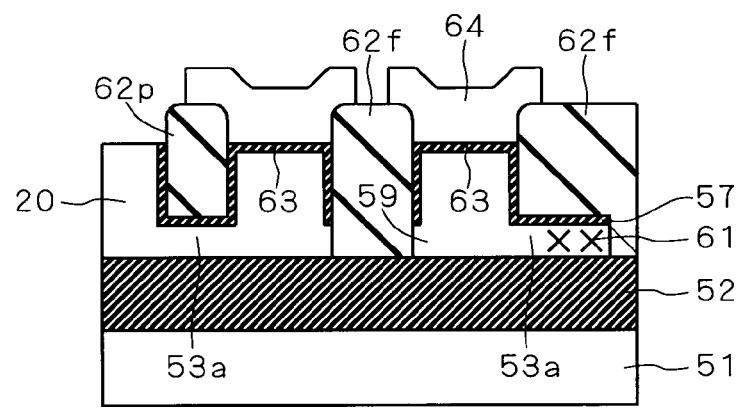
Figure 63:
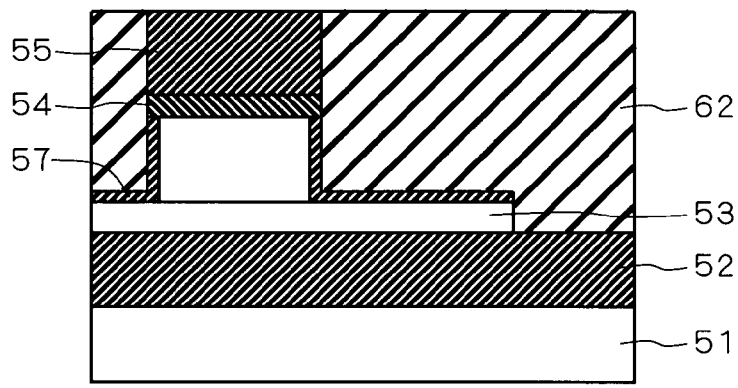
FIGS. 63 through 68 are sectional views showing a third mode of damage region generation.

Next, as shown in FIG. 62, the silicon oxide film 63 (gate insulating film) is formed on the SOI layer 53, and the polysilicon layer 64 is deposited thereon and patterned by photolithography, to thereby form the gate electrode.

A MOS transistor with a damage region formed through a manufacturing process similar to the first mode shown in FIGS. 49 to 51 is completed.

The second mode in which the width d1 is determined by the thickness of the silicon oxide film spacer 65s achieves the effect of setting the width d1 with better controllability than in the first mode in which the width d1 is determined by the resist pattern 59.

Third Mode

FIGS. 63 through 68 are sectional views showing a third mode of damage region generation process. Hereinafter, a manufacturing method of the third mode will be described with reference to these drawings. The cross sections shown in FIGS. 63 through 68 are taken along the line B-B of FIG. 5.

Upon carrying out the steps shown in FIGS. 42 to 45 according to the first mode, the silicon oxide film 62 is buried, and annealing is done at 500 to 1300° C. This annealing is not always necessary. Then, the silicon oxide film 62 is subjected to CMP processing to be planarized. At this time, highly accurate planarization is achieved using the silicon nitride film 55 as a polishing stopper.

Figure 64:
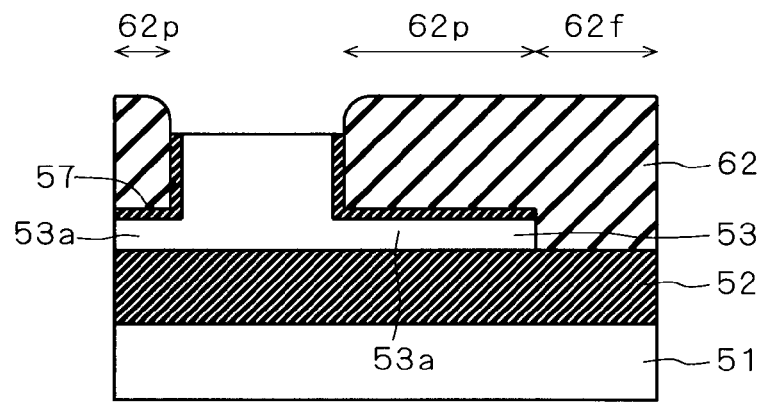

Next, as shown in FIG. 64, the silicon oxide film 62 is further etched back to any thickness so as to control the thickness of the isolation oxide film, and the silicon nitride film 55 and silicon oxide film 54 are removed. As a result, in the remaining silicon oxide film 62, the full isolation region 62f reaching the buried insulating film 52 and partial isolation region 62p with the under-PTI semiconductor region 53a remaining thereunder are completed.

Figure 65:
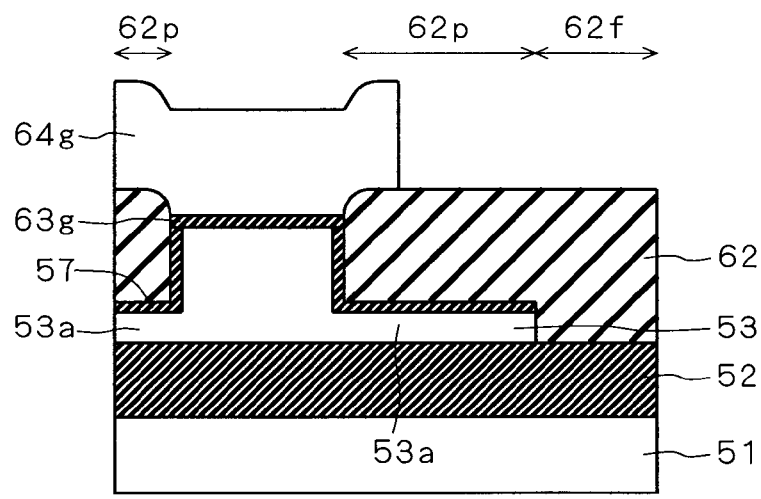

Then, as shown in FIG. 65, a silicon oxide film 63g (gate insulating film) is formed, and a polysilicon layer is deposited thereon and patterned by photolithography, to thereby form a gate electrode 64g.

Figure 66:
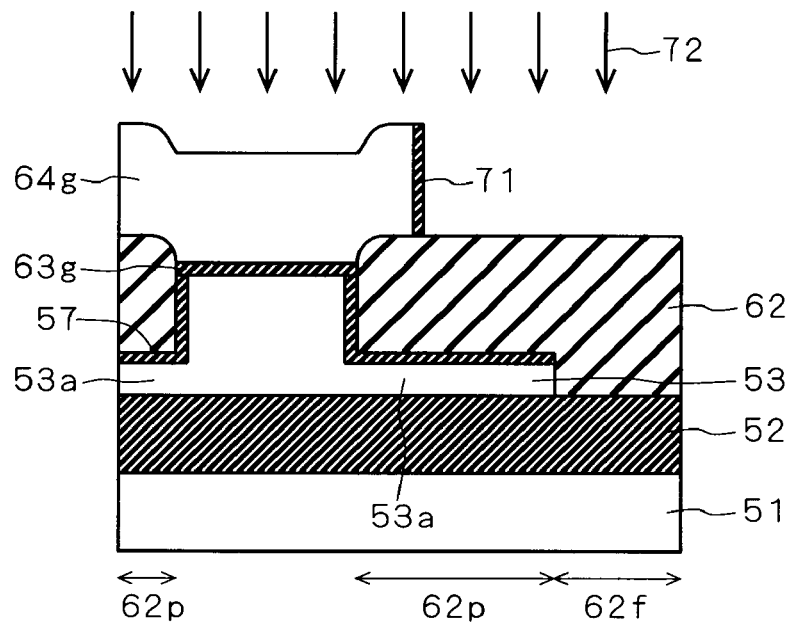

Further, as shown in FIG. 66, the silicon oxide film spacer 71 is formed on the side face of the gate electrode 64g, and impurity ions 72 of different conductivities are then implanted twice, to thereby form an extension region and a pocket region (not shown).

Figure 67:
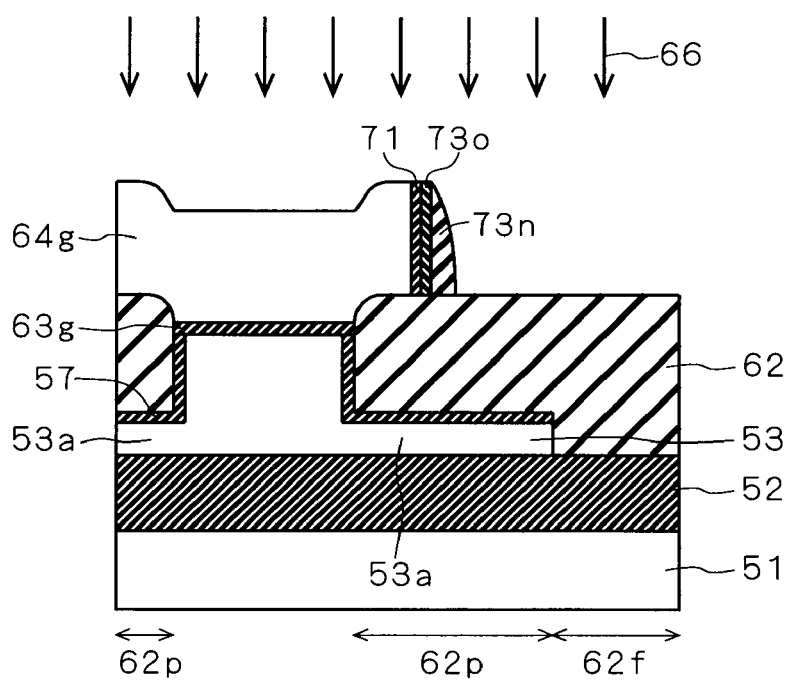

Then, as shown in FIG. 67, a silicon oxide film sidewall 73o and a silicon nitride film sidewall 73n are formed on the side face of the silicon oxide film spacer 71, and impurity ions 66 for forming source/drain regions are implanted, to thereby form the source region and drain region (not shown).

Figure 68:
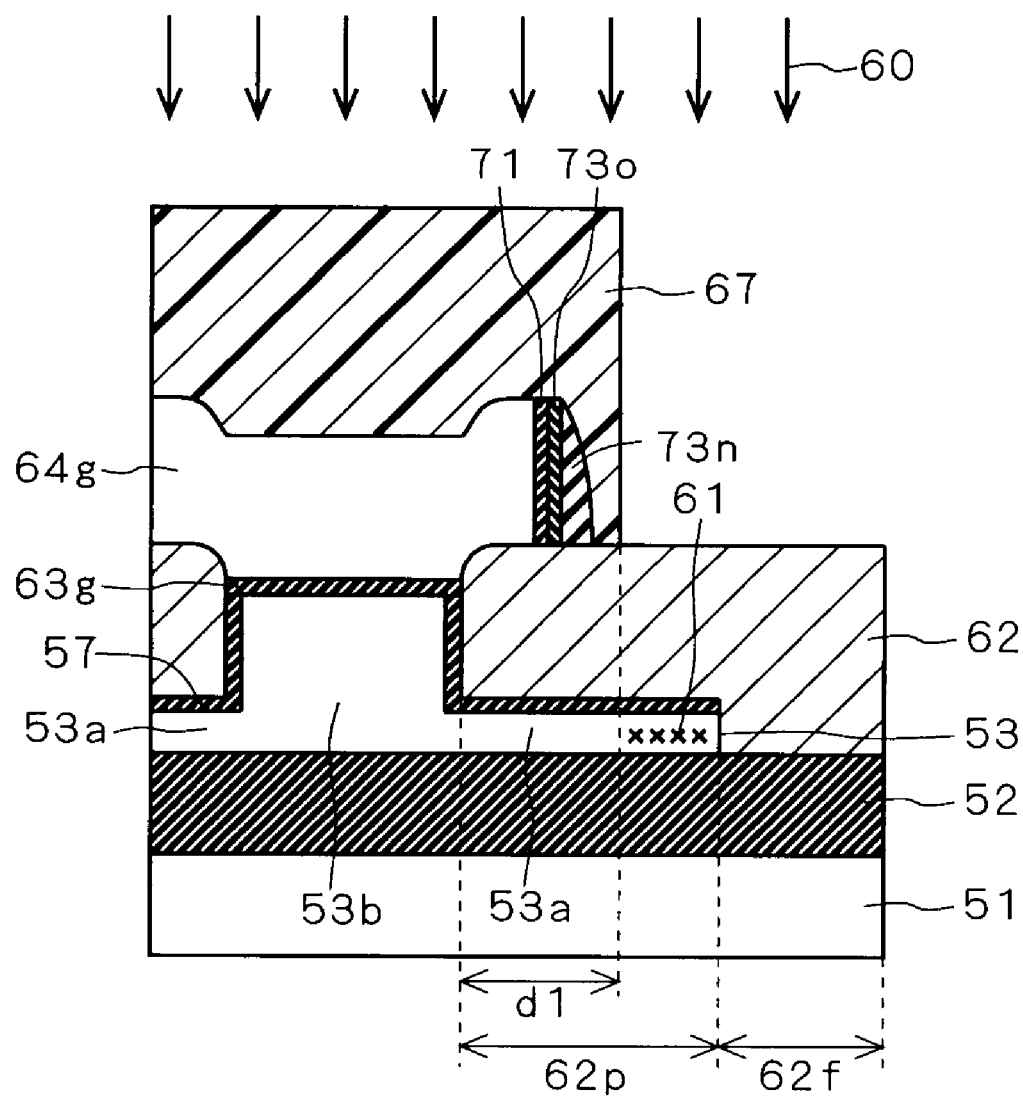

Thereafter, as shown in FIG. 68, a resist pattern 67 patterned such that the distance from the body region 53b is d1 is formed, and the damage-region generation impurity 60 such as Si, Ar, N, As (for forming N well regions), In (for forming P well regions) or the like is implanted at a concentration of about 1e13/cm² to 1e16/cm² using the resist pattern 67 as a mask, to thereby generate crystal defects 61 in part of the SOI layer 53. The width d1 shall satisfy the relation d1>Xdmax (maximum depletion layer width).

A MOS transistor with a damage region formed through a manufacturing process similar to the first mode shown in FIG. 51 is completed.

APPLICATION

Application of First Preferred Embodiment

Figure 69:
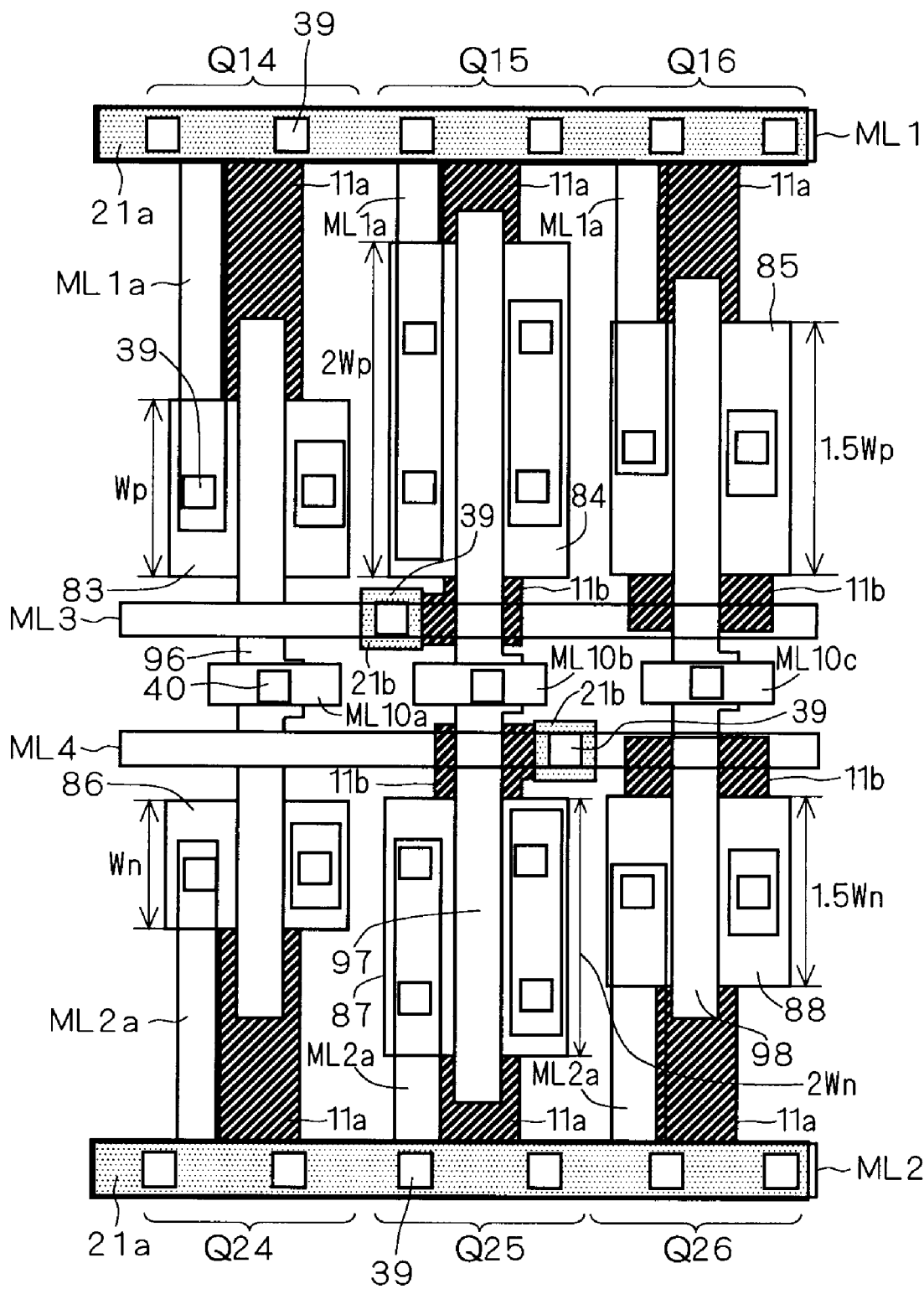
FIG. 69 is a plan view showing a combined layout pattern according to an application of the first preferred embodiment.

FIG. 69 is a plan view showing a combined layout pattern according to an application of the first preferred embodiment. As shown in the drawing, P-type diffusion layers 83, 84 and 85 having gate width (width of channel or active region) of Wp, 2Wp and 1.5Wp, respectively, are provided in the upper part of the drawing, and N-type diffusion regions 86, 87 and 88 having gate width of Wp, 2Wn and 1.5Wn, respectively, are provided in the lower part of the drawing. In FIG. 69, the background not indicated by any reference character is a full isolation region.

The P-type diffusion regions 83 to 85 are arranged in the lateral direction in the drawing, and the N-type diffusion regions 86 to 88 are also arranged in the lateral direction in the drawing. A gate electrode 96 extends longitudinally above the central portions of the P-type diffusion region 83 and N-type diffusion region 86. A gate electrode 97 extends longitudinally above the central portions of the P-type diffusion region 84 and N-type diffusion region 87. A gate electrode 98 extends longitudinally above the central portions of the P-type diffusion region 85 and N-type diffusion region 88. The gate electrodes 96 to 98 are electrically connected to metal interconnections ML10a to ML10c installed thereabove through via holes 40.

Accordingly, the P-type diffusion region 83 and gate electrode 96 constitute a PMOS transistor Q14, the P-type diffusion region 84 and gate electrode 97 constitute a PMOS transistor Q15, the P-type diffusion region 85 and gate electrode 98 constitute a PMOS transistor Q16, the N-type diffusion region 86 and gate electrode 96 constitute an NMOS transistor Q24, the N-type diffusion region 87 and gate electrode 97 constitute an NMOS transistor Q25, and the N-type diffusion region 88 and gate electrode 98 constitute an NMOS transistor Q26.

The PMOS transistor Q14 has the partial isolation region 11a formed in the one-end gate region, with the tap region 21a provided adjacent to the partial isolation region 11a. Accordingly, the PMOS transistor Q14 has an equivalent configuration to the third mode of the first preferred embodiment (cf. FIG. 3).

The PMOS transistor Q15 has the partial isolation regions 11a and 11b formed in the both end gate regions, respectively, with the tap region 21a provided adjacent to the partial isolation region 11a and the tap region 21b provided adjacent to the partial isolation region 11b. Accordingly, the PMOS transistor Q15 has an equivalent configuration to the first mode of the first preferred embodiment (cf. FIG. 1).

The PMOS transistor Q16 has the partial isolation regions 11a and 11b formed in the both end gate regions, respectively, with the tap region 21a provided adjacent to the partial isolation region 11a. Accordingly, the PMOS transistor Q16 has an equivalent configuration to the second mode of the first preferred embodiment (cf. FIG. 2).

The tap region 21a is shared among the PMOS transistors Q14 to Q16, and electrically connected to a metal interconnection ML1 installed thereabove through contact holes 39. The tap region 21b of the PMOS transistor Q15 is electrically connected to a metal interconnection ML3 installed thereabove through a contact hole 39.

The NMOS transistor Q24 has the partial isolation region 11a formed in the one-end gate region (the lower part of the drawing will be assumed as the one-end gate region in the NMOS transistors Q24 to Q26), with the tap region 21a provided adjacent to the partial isolation region 11a. Accordingly, the PMOS transistor Q24 has an equivalent configuration to the third mode of the first preferred embodiment.

The NMOS transistor Q25 has the partial isolation regions 11a and 11b formed in the both end gate regions, respectively, with the tap region 21a provided adjacent to the partial isolation region 11a and the tap region 21b provided adjacent to the partial isolation region 11b. Accordingly, the NMOS transistor Q25 has an equivalent configuration to the first mode of the first preferred embodiment.

The NMOS transistor Q26 has the partial isolation regions 11a and 11b formed in the both end gate regions, respectively, with the tap region 21a provided adjacent to the partial isolation region 11a. Accordingly, the NMOS transistor Q26 has an equivalent configuration to the second mode of the first preferred embodiment (cf. FIG. 2).

The tap region 21a is shared among the NMOS transistors Q24 to Q26, and electrically connected to the metal interconnection ML1 installed thereabove through contact holes 39. The tap region 21b of the NMOS transistor Q25 is electrically connected to a metal interconnection ML4 installed thereabove through a contact hole 39.

Since the PMOS transistor Q14 and NMOS transistor Q24 have relatively narrow gate widths of Wp and Wn, respectively, body potential fixing can be achieved with stability even in the third mode of the first preferred embodiment. Since the PMOS transistor Q15 and NMOS transistor Q25 have relatively large gate widths of 2Wp and 2Wn, respectively, the first mode of the first preferred embodiment is employed to achieve body potential fixing with stability.

Since the PMOS transistor Q16 and NMOS transistor Q26 have the gate widths of 1.5Wp and 1.5Wn, respectively, which is larger than that of the PMOS transistor Q14 and smaller than that of the PMOS transistor Q15, the second mode of the first preferred embodiment having an intermediate body-potential fixing ability between the first and third modes is employed. Further, a damage region is generated in the under-PTI semiconductor region under the partial isolation region 11b of each of the PMOS transistor Q16 and NMOS transistor Q26 to increase the body-potential fixing ability utilizing electron-hole recombination.

In FIG. 69, for the sake of convenience, the P-type diffusion regions 83 to 85 are aligned in the other-end gate region, and the N-type diffusion regions 86 to 88 are aligned in the other-end gate region. To increase the stability in body potential fixing, it is preferable to align the P-type diffusion regions 83 to 85 in the one-end gate region and the N-type diffusion regions 86 to 88 in the one-end gate region.

Application of Second Preferred Embodiment

Figure 70:
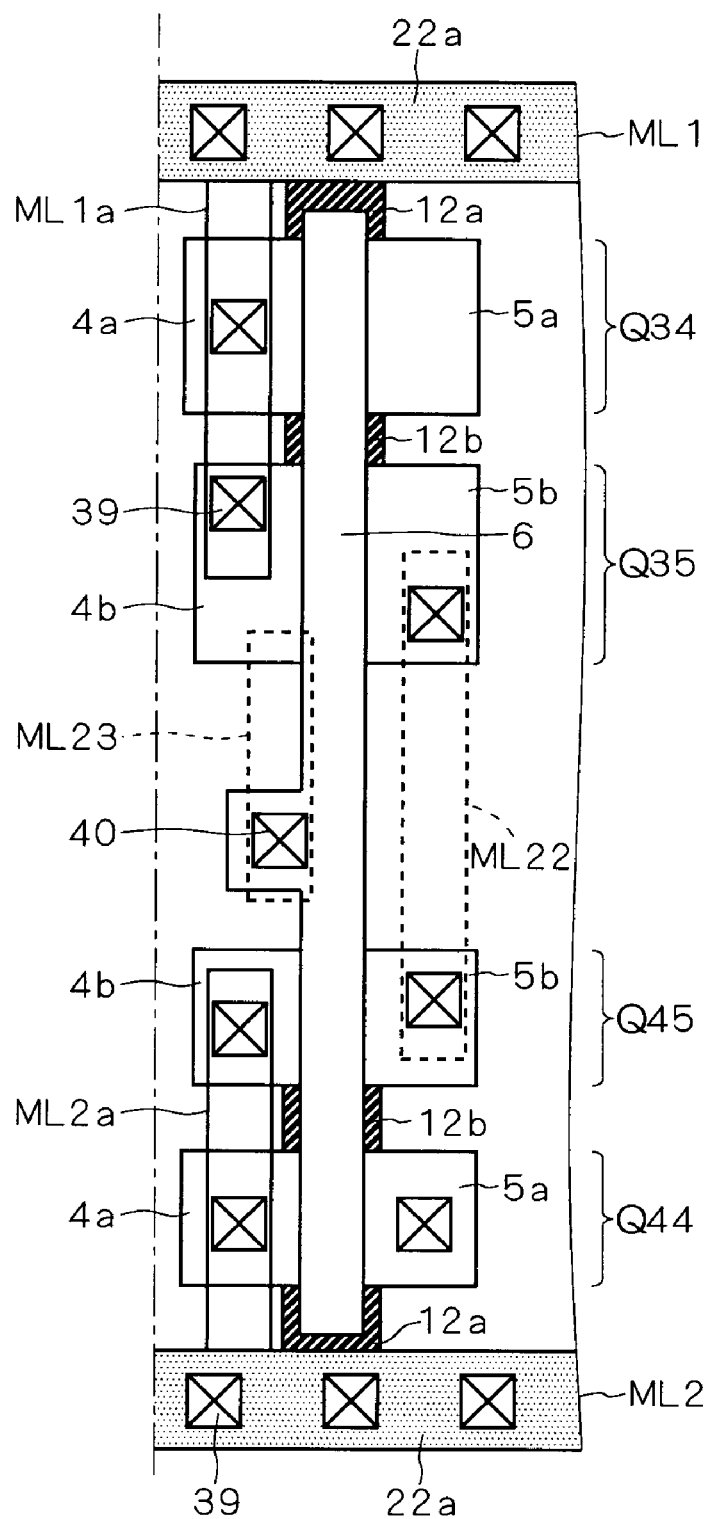
FIG. 70 is a plan view showing a combined layout pattern according to an application of the second preferred embodiment.

FIG. 70 is a plan view showing a combined layout pattern according to an application of the second preferred embodiment. As shown in the drawing, in the upper part of the drawing, the source region 4a and drain region 5a for a PMOS transistor Q34 are provided, and the source region 4b and drain region 5b for a PMOS transistor Q35 are provided. In the lower part of the drawing, the source region 4a and drain region 5a for an NMOS transistor Q44 are provided, and the source region 4b and drain region 5b for an NMOS transistor Q45 are provided. In FIG. 70, the background not indicated by any reference character is a full isolation region.

The common (shared) gate electrode 6 extends longitudinally between the source and drain regions of the PMOS transistors Q34 and Q35 and those of the NMOS transistors Q44 and Q45. The gate electrode 6 is electrically connected to a metal interconnection ML23 installed thereabove through a via hole 40. The drain region 5b of the PMOS transistor Q35 and drain region 5b of the NMOS transistor Q45 are both electrically connected to a metal interconnection ML22 installed thereabove through contact holes 39, so that the PMOS transistor Q35 and NMOS transistor Q45 are electrically connected to each other.

The PMOS transistor Q34 has the partial isolation regions 12a and 12b formed in the both end gate regions, respectively, with the tap region 22a provided adjacent to the partial isolation region 12a. The PMOS transistor Q35 has the partial isolation region 12b formed in the one-end gate region. Accordingly, the PMOS transistors Q34 and Q35 have an equivalent configuration to the MOS transistors Q1 and Q2 according to the third mode of the second preferred embodiment (cf. FIG. 9).

The NMOS transistor Q44 has the partial isolation regions 12a and 12b formed in the both end gate regions, respectively (the lower part of the drawing will be assumed as the one-end gate region in the NMOS transistors Q44 to Q45), with the tap region 22a provided adjacent to the partial isolation region 12a. The NMOS transistor Q45 has the partial isolation region 12b formed in the one-end gate region. Accordingly, the NMOS transistors Q44 and Q45 have an equivalent configuration to the MOS transistors Q1 and Q2 according to the third mode of the second preferred embodiment (cf. FIG. 9).

The tap region 22a provided for the PMOS transistors Q34 and Q35 is electrically connected to the metal interconnection ML1 installed thereabove through contact holes 39. The tap region 22a provided for the NMOS transistors Q44 and Q45 is electrically connected to the metal interconnection ML2 installed thereabove through contact holes 39.

A metal interconnection ML1a branched off from the metal interconnection ML1 and extending above the source regions 4a and 4b of the PMOS transistors Q34 and Q35 is electrically connected to the source regions 4a and 4b through contact holes 39, respectively. A metal interconnection ML2a branched off from the metal interconnection ML2 and extending above the source regions 4a and 4b of the NMOS transistors Q44 and Q45 is electrically connected to the source regions 4a and 4b through contact holes 39, respectively.

In the layout shown in FIG. 70, a supply voltage Vcc is applied to the metal interconnection ML1, and a ground potential Vss is applied to the metal interconnection ML2. Accordingly, the PMOS transistor Q35 is fixed at the supply voltage Vcc through the body region of the PMOS transistor Q34, and the NMOS transistor Q45 is fixed at the ground potential Vss through the body region of the NMOS transistor Q44.

Figure 71:
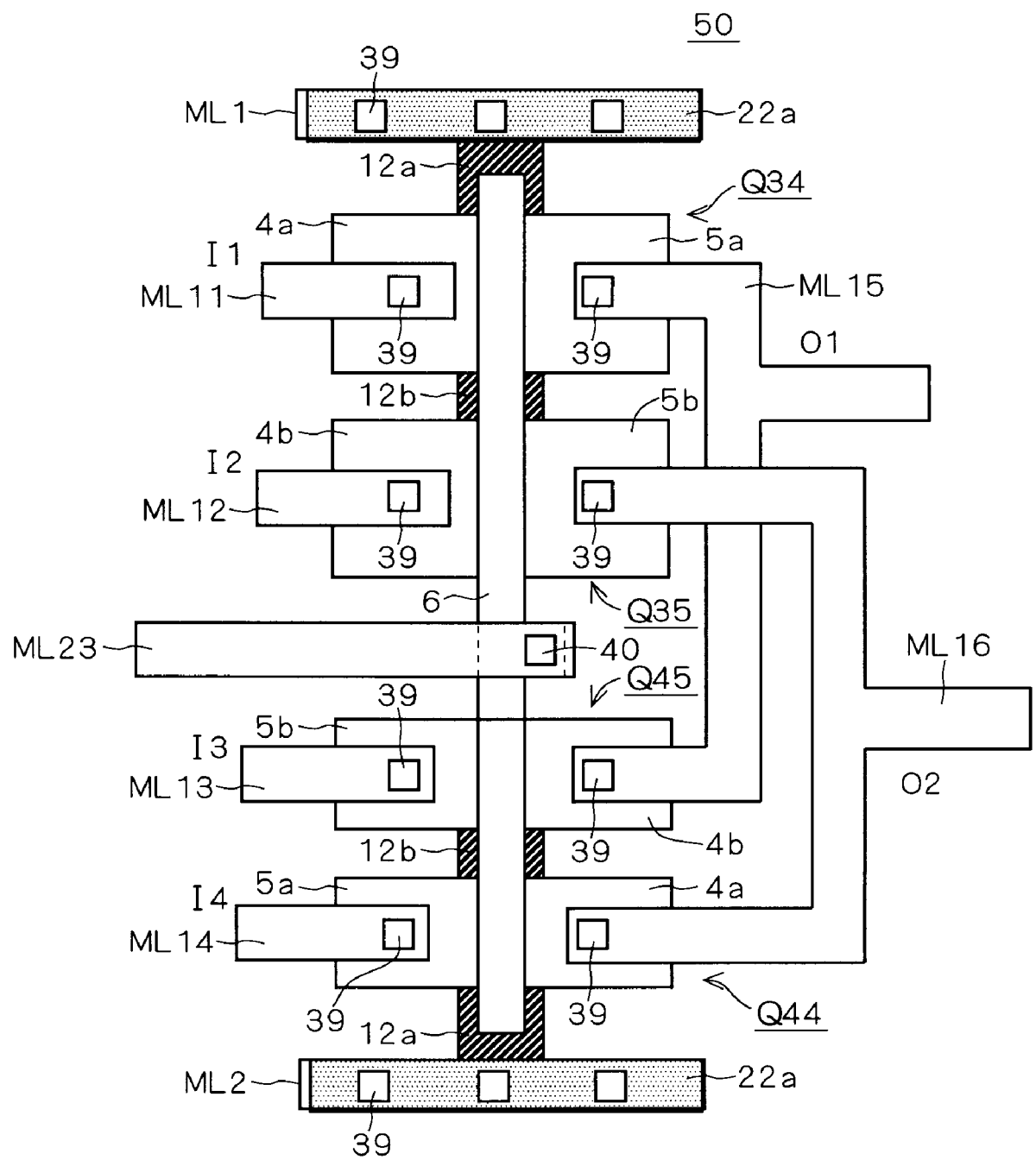
FIG. 71 is a plan view showing a layout pattern of a semiconductor integrated circuit according to an application of the second preferred embodiment.

FIG. 71 is a plan view showing a layout pattern of a semiconductor integrated circuit 50 according to an application of the second preferred embodiment. As shown in the drawing, in the upper part of the drawing, the source region 4a and drain region 5a for the PMOS transistor Q34 are provided, and the source region 4b and drain region 5b for the PMOS transistor Q35 are provided. In the lower part of the drawing, the source region 4a and drain region 5a for the NMOS transistor Q44 are provided, and the source region 4b and drain region 5b for the NMOS transistor Q45 are provided.

The common gate electrode 6 extends longitudinally between the source and drain regions of the PMOS transistors Q34 and Q35 and those of the NMOS transistors Q44 and Q45. The gate electrode 6 is electrically connected to the metal interconnection ML23 installed thereabove through a via hole 40.

The source region 4a of the PMOS transistor Q34 is electrically connected to a metal interconnection ML11 installed thereabove through a contact hole 39. The source region 4b of the PMOS transistor Q35 is electrically connected to a metal interconnection ML12 installed thereabove through a contact hole 39. The drain region 5b of the NMOS transistor Q45 is electrically connected to a metal interconnection ML13 installed thereabove through a contact hole 39. The drain region 5a of the NMOS transistor Q44 is electrically connected to a metal interconnection ML14 installed thereabove through a contact hole 39. The metal interconnections ML11 to ML14 receive input signals I1 to I4, respectively.

The drain region 5a of the PMOS transistor Q34 and source region 4b of the NMOS transistor Q45 are both connected to a metal interconnection ML15 installed thereabove through contact holes 39, respectively. The metal interconnection ML15 outputs a signal O1.

The drain region 5b of the PMOS transistor Q35 and source region 4a of the NMOS transistor Q44 are both connected to a metal interconnection ML16 installed thereabove through contact holes 39, respectively. The metal interconnection ML16 outputs a signal O2.

The PMOS transistor Q34 has the partial isolation regions 12a and 12b formed in the both end gate regions, respectively, with the tap region 22a provided adjacent to the partial isolation region 12a. The PMOS transistor Q35 has the partial isolation region 12b formed in the one-end gate region. Accordingly, the PMOS transistors Q34 and Q35 have an equivalent configuration to the MOS transistors Q1 and Q2 according to the third mode of the second preferred embodiment (cf. FIG. 9).

The NMOS transistor Q44 has the partial isolation regions 12a and 12b formed in the both end gate regions, respectively (the lower part of the drawing will be assumed as the one-end gate region in the NMOS transistors Q44 to Q45), with the tap region 22a provided adjacent to the partial isolation region 12a. The NMOS transistor Q45 has the partial isolation region 12b formed in the one-end gate region. Accordingly, the NMOS transistors Q44 and Q45 have an equivalent configuration to the MOS transistors Q1 and Q2 according to the third mode of the second preferred embodiment.

The tap region 22a provided for the PMOS transistors Q34 and Q35 is electrically connected to the metal interconnection ML1 installed thereabove through contact holes 39. The tap region 22a provided for the NMOS transistors Q44 and Q45 is electrically connected to the metal interconnection ML2 installed thereabove through contact holes 39.

In the layout shown in FIG. 71, the supply voltage Vcc is applied to the metal interconnection ML1, and the ground potential Vss is applied to the metal interconnection ML2. Accordingly, the PMOS transistor Q35 is fixed at the supply voltage Vcc through the body region of the PMOS transistor Q34, and the NMOS transistor Q45 is fixed at the ground potential Vss through the body region of the NMOS transistor Q44.

Figure 72:
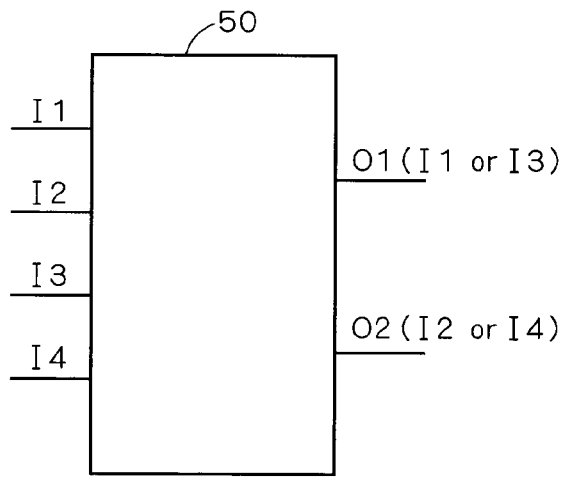
FIG. 72 is an explanatory view schematically showing the semiconductor integrated circuit shown in FIG. 71.

FIG. 72 is an explanatory view schematically showing the semiconductor integrated circuit 50 shown in FIG. 71. As shown in the drawing, upon receipt of the input signals I1 to I4, the semiconductor integrated circuit 50 outputs one of the input signals I1 and I3 as the output signal O1 and one of the input signals I2 and I4 as the output signal O2, on the basis of a voltage applied to the gate electrode 6.

Application of Fourth Preferred Embodiment

First Layout Example

Figure 73:
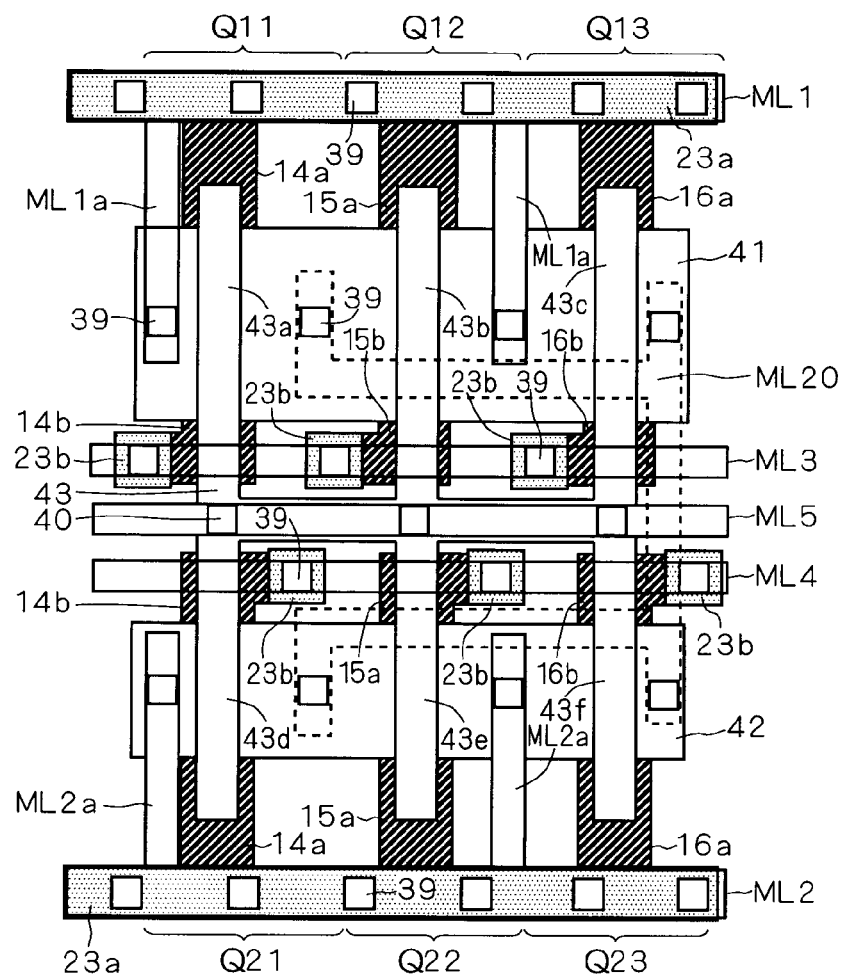
FIG. 73 is a plan view showing a first layout example of a combined layout pattern according to an application of the fourth preferred embodiment.

FIG. 73 is a plan view showing a first layout example of a combined layout pattern according to an application of the fourth preferred embodiment. As shown in the drawing, a P-type active region 41 is provided in the upper part of the drawing, and an N-type active region 42 is provided in the lower part of the drawing. In FIGS. 73 through 82, the background not indicated by any reference character is a full isolation region.

A gate electrode 43 includes N-type first gate portions 43a to 43c crossing longitudinally at three positions above the P-type active region 41 and P-type first gate portions 43d to 43f crossing longitudinally at three positions above the N-type active region 42. The gate electrode 43 is electrically connected to a metal interconnection ML5 installed thereabove through via holes 40.

Accordingly, the P-type active region 41 and N-type first gate portion 43a constitute a PMOS transistor Q11, the P-type active region 41 and N-type first gate portion 43b constitute a PMOS transistor Q12, and the P-type active region 41 and N-type first gate portion 43c constitute a PMOS transistor Q13. The N-type active region 42 and P-type first gate portion 43d constitute an NMOS transistor Q21, the N-type active region 42 and P-type first gate portion 43e constitute an NMOS transistor Q22, and the N-type active region 42 and P-type first gate portion 43f constitute an NMOS transistor Q23.

The PMOS transistor Q11 has the partial isolation regions 14a and 14b formed in the both end gate regions, respectively, with the tap region 23a provided adjacent to the partial isolation region 14a and the tap region 23b provided adjacent to the partial isolation region 14b. The PMOS transistor Q12 has the partial isolation regions 15a and 15b formed in the both end gate regions, respectively, with the tap region 23a provided adjacent to the partial isolation region 15a and the tap region 23b provided adjacent to the partial isolation region 15b. The PMOS transistor Q13 has the partial isolation regions 16a and 16b formed in the both end gate regions, respectively, with the tap region 23a provided adjacent to the partial isolation region 16a and the tap region 23b provided adjacent to the partial isolation region 16b.

The tap region 23a is shared among the PMOS transistors Q11 to Q13, and is electrically connected to the metal interconnection ML1 installed thereabove through contact holes 39. The tap regions 23b of the PMOS transistors Q11 to Q13 are isolated from each other, but are electrically connected in common to the metal interconnection ML3 installed thereabove through contact holes 39, respectively.

The metal interconnection ML1a branched off from the metal interconnection ML1 extends above the P-type active region 41 of the PMOS transistor Q11 (on the side of its source region) and above the P-type active region 41 between the PMOS transistors Q12 and Q13 (on the side of each source region), and is electrically connected to corresponding positions of the P-type active region 41 through contact holes 39, respectively.

The NMOS transistor Q21 has the partial isolation regions 14a and 14b formed in the both end gate regions, respectively (the lower part of the drawing will be assumed as the one-end gate region in the NMOS transistors Q21 to Q23), with the tap region 23a provided adjacent to the partial isolation region 14a and the tap region 23b provided adjacent to the partial isolation region 14b. The NMOS transistor Q22 has the partial isolation regions 15a and 15b formed in the both end gate regions, respectively, with the tap region 23a provided adjacent to the partial isolation region 15a and the tap region 23b provided adjacent to the partial isolation region 15b. The NMOS transistor Q23 has the partial isolation regions 16a and 16b formed in the both end gate regions, respectively, with the tap region 23a provided adjacent to the partial isolation region 16a and the tap region 23b provided adjacent to the partial isolation region 16b.

The tap region 23a is shared among the NMOS transistors Q21 to Q23, and is electrically connected to the metal interconnection ML2 installed thereabove through contact holes 39. The tap regions 23b of the NMOS transistors Q21 to Q23 are isolated from each other, but are electrically connected in common to the metal interconnection ML4 installed thereabove through contact holes 39, respectively.

The metal interconnection ML2a branched off from the metal interconnection ML2 extends above the N-type active region 42 of the NMOS transistor Q21 (on the side of its source region) and above the N-type active region 42 between the NMOS transistors Q22 and Q23 (on the side of each source region), and is electrically connected to corresponding positions of the N-type active region 42 through contact holes 39, respectively.

Further, a metal interconnection ML20 installed above the metal interconnections ML1 to ML5 extends from above the P-type active region 41 between the PMOS transistors Q12 and Q13 (on the side of each drain region) to the P-type active region 41 of the PMOS transistor Q11 (on the side of its drain region), and from above the N-type active region 42 of the NMOS transistor Q23 (on the side of its drain region) to the N-type active region 42 between the NMOS transistors Q21 and Q22 (on the side of each drain region), and is electrically connected to corresponding positions of the P-type active region 41 and N-type active region 42 through contact holes 39, respectively.

The first layout example with such configuration is an application of an equivalent configuration to the second mode of the fourth preferred embodiment (cf. FIG. 19) in which each tap region is shared in each side gate region (also electrically shared) and partial isolation regions are isolated from each other in each side gate region.

The tap regions 23b may be provided also under the gate electrode 43 to increase their areas. In this case, a gate capacitance generated from the gate electrode 43 increases a little, however, there is little influence on substantial operations of the MOS transistors.

Second Layout Example

Figure 74:
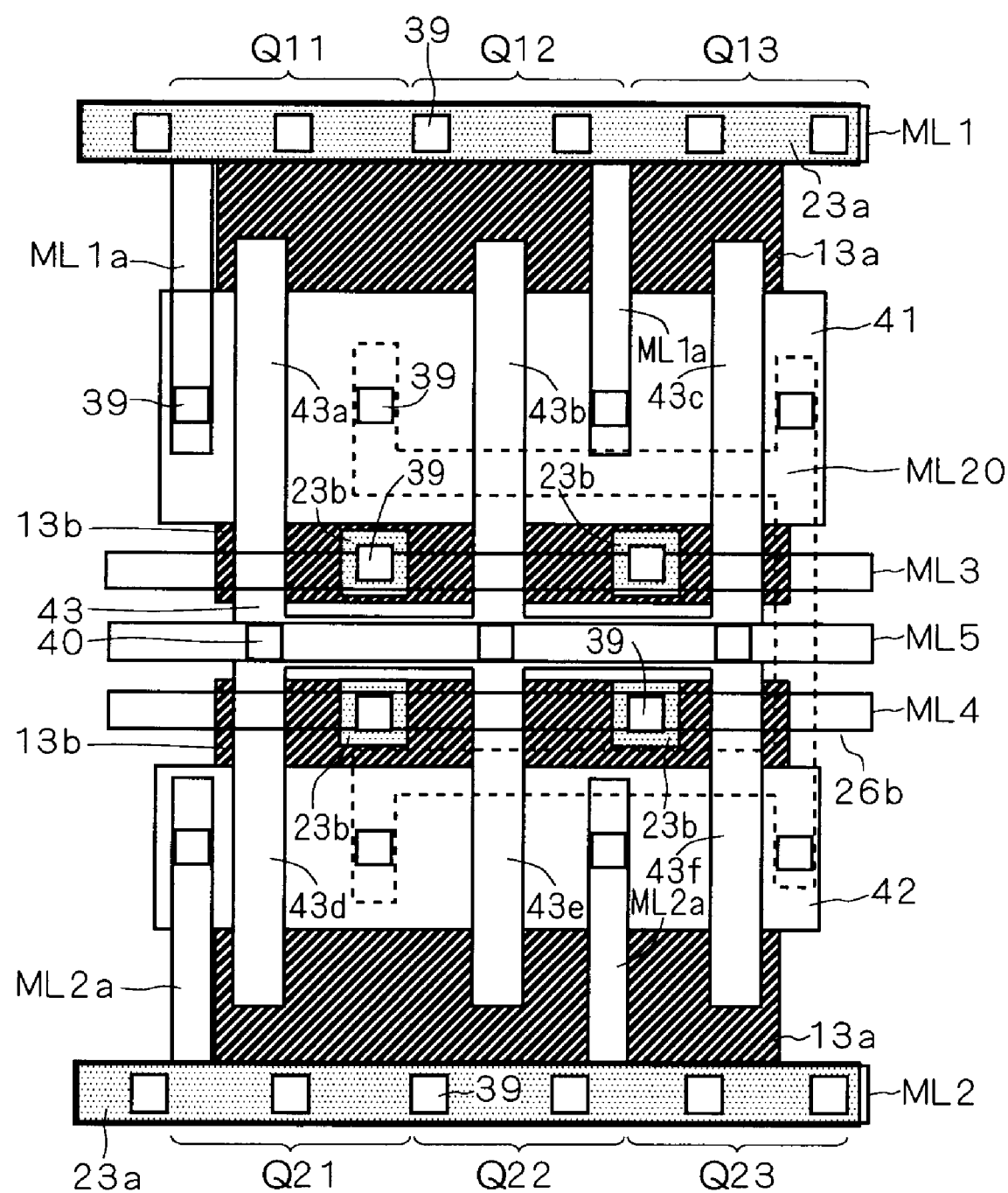
FIG. 74 is a plan view showing a second layout example of a combined layout pattern according to an application of the fourth preferred embodiment.

FIG. 74 is a plan view showing a second layout example of a combined layout pattern according to an application of the fourth preferred embodiment. As shown in the drawing, the P-type active region 41 is provided in the upper part of the drawing, and the N-type active region 42 is provided in the lower part of the drawing.

The PMOS transistors Q11 to Q13 all have the partial isolation regions 13a and 13b formed in the both end gate regions, respectively, with the tap region 23a provided adjacent to the partial isolation region 13a and two tap regions 23b provided in and adjacent to the partial isolation region 13b.

The tap region 23a is shared among the PMOS transistors Q11 to Q13, and is electrically connected to the metal interconnection ML1 installed thereabove through contact holes 39. The tap regions 23b are isolated from each other in the partial isolation region 13b, but are electrically connected in common to the metal interconnection ML3 installed thereabove through contact holes 39, respectively.

The NMOS transistors Q21 to Q23 all have the partial isolation regions 13a and 13b formed in the both end gate regions, respectively, with the tap region 23a provided adjacent to the partial isolation region 13a and two tap regions 23b provided in and adjacent to the partial isolation region 13b.

The tap region 23a is shared among the NMOS transistors Q21 to Q23, and is electrically connected to the metal interconnection ML2 installed thereabove through contact holes 39. The tap regions 23b are isolated from each other in the partial isolation region 13b, but are electrically connected in common to the metal interconnection ML4 installed thereabove through contact holes 39, respectively. Other configuration is similar to the first layout example shown in FIG. 73, and repeated description will be omitted herein.

The second layout example with such configuration is an application of an equivalent configuration to the first mode of the fourth preferred embodiment (cf. FIG. 18) in which each tap region is shared in each side gate region (also electrically shared) and partial isolation region is shared in each side gate region.

The tap regions 23b may be provided also under the gate electrode 43 to increase their areas. In this case, a gate capacitance generated by the gate electrode 43 increases a little, however, there is little influence on substantial operations of the MOS transistors.

Comparing the first and second layout examples, first layout example is superior in terms of reduction in parasitic capacitance, and the second layout example is superior in terms of stability in body fixing. In another combination, the tap regions 23b may be electrically isolated from each other among the MOS transistors.

Third Layout Example

Figure 75:
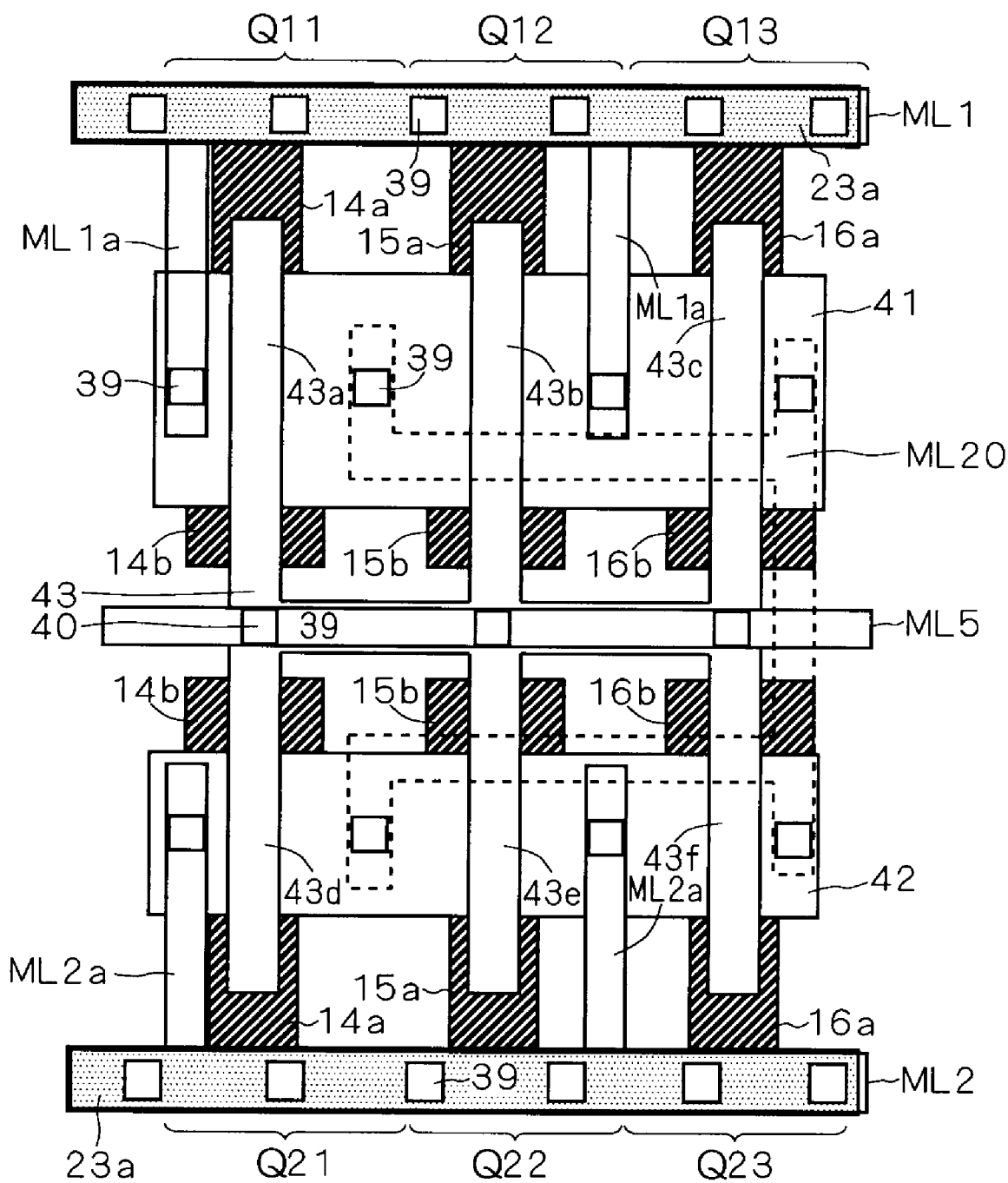
FIG. 75 is a plan view showing a third layout example of a combined layout pattern according to an application of the fourth preferred embodiment.

FIG. 75 is a plan view showing a third layout example of a combined layout pattern according to an application of the fourth preferred embodiment. As shown in the drawing, the P-type active region 41 is provided in the upper part of the drawing, and the N-type active region 42 is provided in the lower part of the drawing.

The third layout example differs from the first layout example shown in FIG. 73 in the absence of the tap regions 23b in the PMOS transistors Q11 to Q13, the tap regions 23b in the NMOS transistors Q21 to Q23, and the metal interconnections ML3 and ML4. Other configuration is similar to the first layout example shown in FIG. 73, and repeated description will be omitted herein.

The third layout example with such configuration is an application of a configuration in which the tap region is shared in the one-end gate region, and partial isolation regions are isolated from each other in each side gate region, which is substantially equivalent to the ninth mode of the fourth preferred embodiment (cf. FIG. 26) (the only difference is whether one of the partial isolation regions is shared or isolated).

Fourth Layout Example

Figure 76:
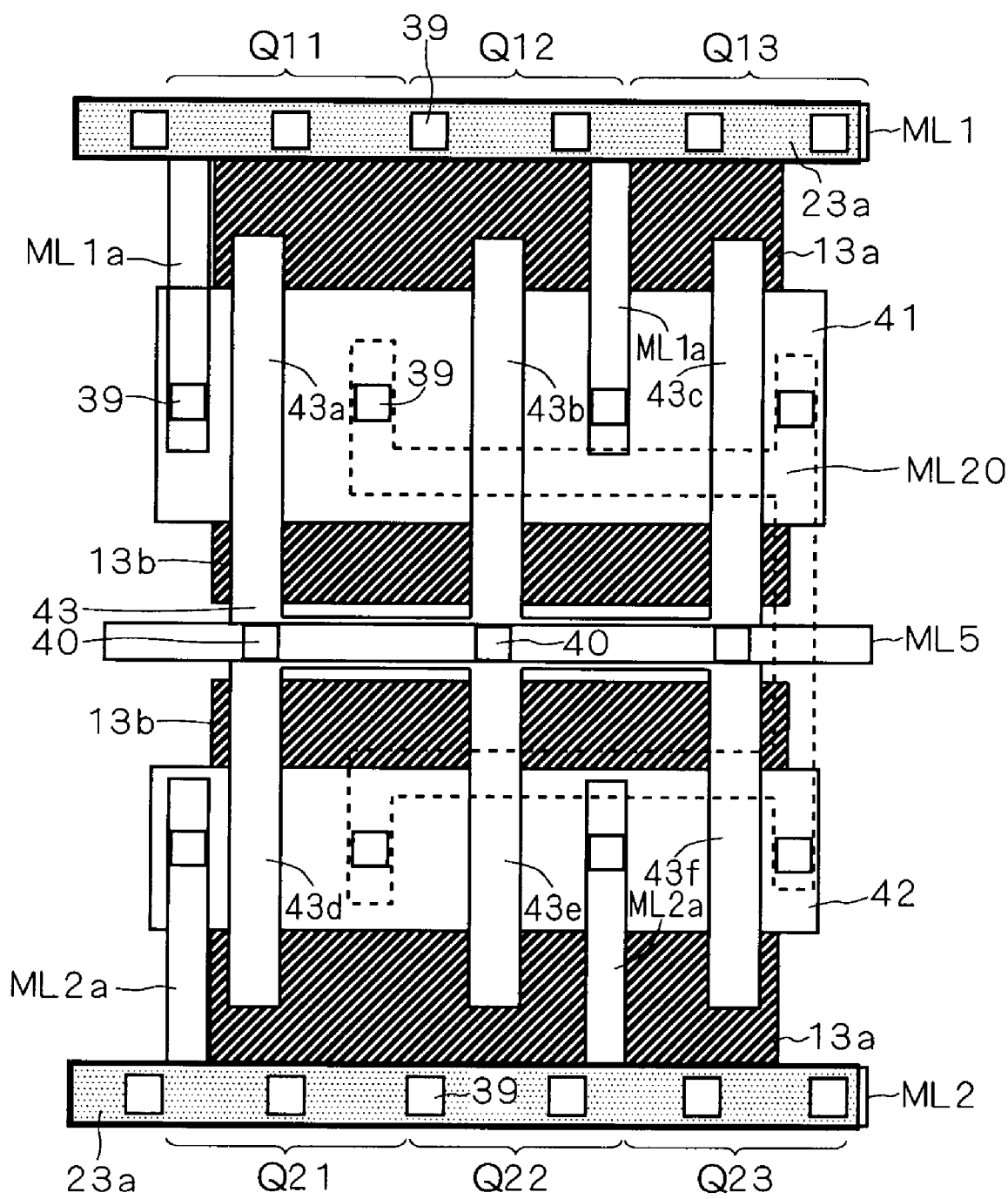
FIG. 76 is a plan view showing a fourth layout example of a combined layout pattern according to an application of the fourth preferred embodiment.

FIG. 76 is a plan view showing the fourth layout example of a combined layout pattern according to an application of the fourth preferred embodiment. As shown in the drawing, the P-type active region 41 is provided in the upper part of the drawing, and the N-type active region 42 is provided in the lower part of the drawing.

The fourth layout example differs from the second layout example shown in FIG. 74 in the absence of the tap regions 23b in the PMOS transistors Q11 to Q13, the tap regions 23b in the NMOS transistors Q21 to Q23, and the metal interconnections ML3 and ML4. Other configuration is similar to the second layout example shown in FIG. 74, and repeated description will be omitted herein.

The fourth layout example with such configuration is an application of an equivalent configuration to the fourth mode of the fourth preferred embodiment (cf. FIG. 21) in which the tap region is shared in the one-end gate region, and the partial isolation region is shared in each side gate region.

Comparing the third and fourth layout examples, third layout example is superior in terms of reduction in parasitic capacitance, and the fourth layout example is superior in terms of stability in body fixing.

Fifth Layout Example

Figure 77:
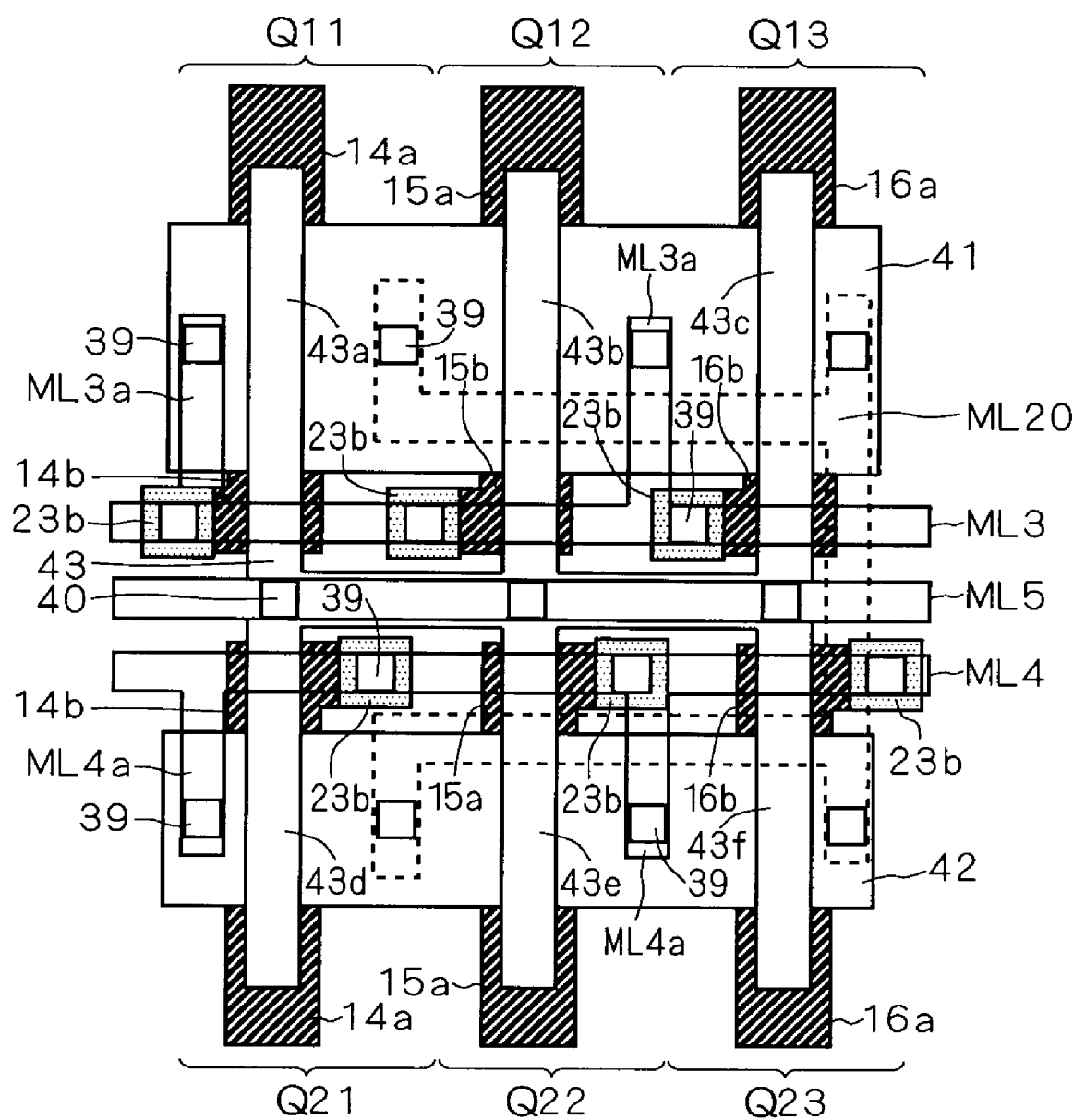
FIG. 77 is a plan view showing a fifth layout example of a combined layout pattern according to an application of the fourth preferred embodiment.

FIG. 77 is a plan view showing a fifth layout example of a combined layout pattern according to an application of the fourth preferred embodiment. As shown in the drawing, the P-type active region 41 is provided in the upper part of the drawing, and the N-type active region 42 is provided in the lower part of the drawing.

The PMOS transistor Q11 has the partial isolation regions 14a and 14b formed in the both end gate regions, respectively, with the tap region 23b provided adjacent to the partial isolation region 14b. The PMOS transistor Q12 has the partial isolation regions 15a and 15b formed in the both end gate regions, respectively, with the tap region 23b provided adjacent to the partial isolation region 15b. The PMOS transistor Q13 has the partial isolation regions 16a and 16b formed in the both end gate regions, respectively, with the tap region 23b provided adjacent to the partial isolation region 16b.

The NMOS transistor Q21 has the partial isolation regions 14a and 14b formed in the both end gate regions, respectively (the lower part of the drawing will be assumed as the one-end gate region in the NMOS transistors Q21 to Q23), with the tap region 23b provided adjacent to the partial isolation region 14b. The NMOS transistor Q22 has the partial isolation regions 15a and 15b formed in the both end gate regions, respectively, with the tap region 23b provided adjacent to the partial isolation region 15b. The NMOS transistor Q23 has the partial isolation regions 16a and 16b formed in the both end gate regions, respectively, with the tap region 23b provided adjacent to the partial isolation region 16b.

The fifth layout example differs from the first layout example shown in FIG. 73 in the absence of the tap regions 23a, and the metal interconnections ML1 and ML2.

A metal interconnection ML3a branched off from the metal interconnection ML3 extends above the P-type active region 41 of the PMOS transistor Q11 (on the side of its source region) and above the P-type active region 41 between the PMOS transistors Q12 and Q13 (on the side of each source region), and is electrically connected to corresponding positions of the P-type active regions 41 through contact holes 39, respectively.

Similarly, a metal interconnection ML4a branched off from the metal interconnection ML4 extends above the N-type active region 42 of the NMOS transistor Q21 (on the side of its source region) and above the N-type active region 42 between the NMOS transistors Q22 and Q23 (on the side of each source region), and is electrically connected to corresponding positions of the N-type active regions 42 through contact holes 39, respectively. Other configuration is similar to the first layout example shown in FIG. 73, and repeated description will be omitted herein.

The fifth layout example with such configuration is an application of an equivalent configuration to the eighth mode of the fourth preferred embodiment (cf. FIG. 25) in which the tap regions are isolated from each other in the one-end gate region (in terms of positional isolation), and the partial isolation regions are isolated from each other in each side gate region.

The tap regions 23b may be provided also under the gate electrode 43 to increase their areas. In this case, a gate capacitance generated by the gate electrode 43 increases a little, however, there is little influence on substantial operations of the MOS transistors.

Sixth Layout Example

Figure 78:
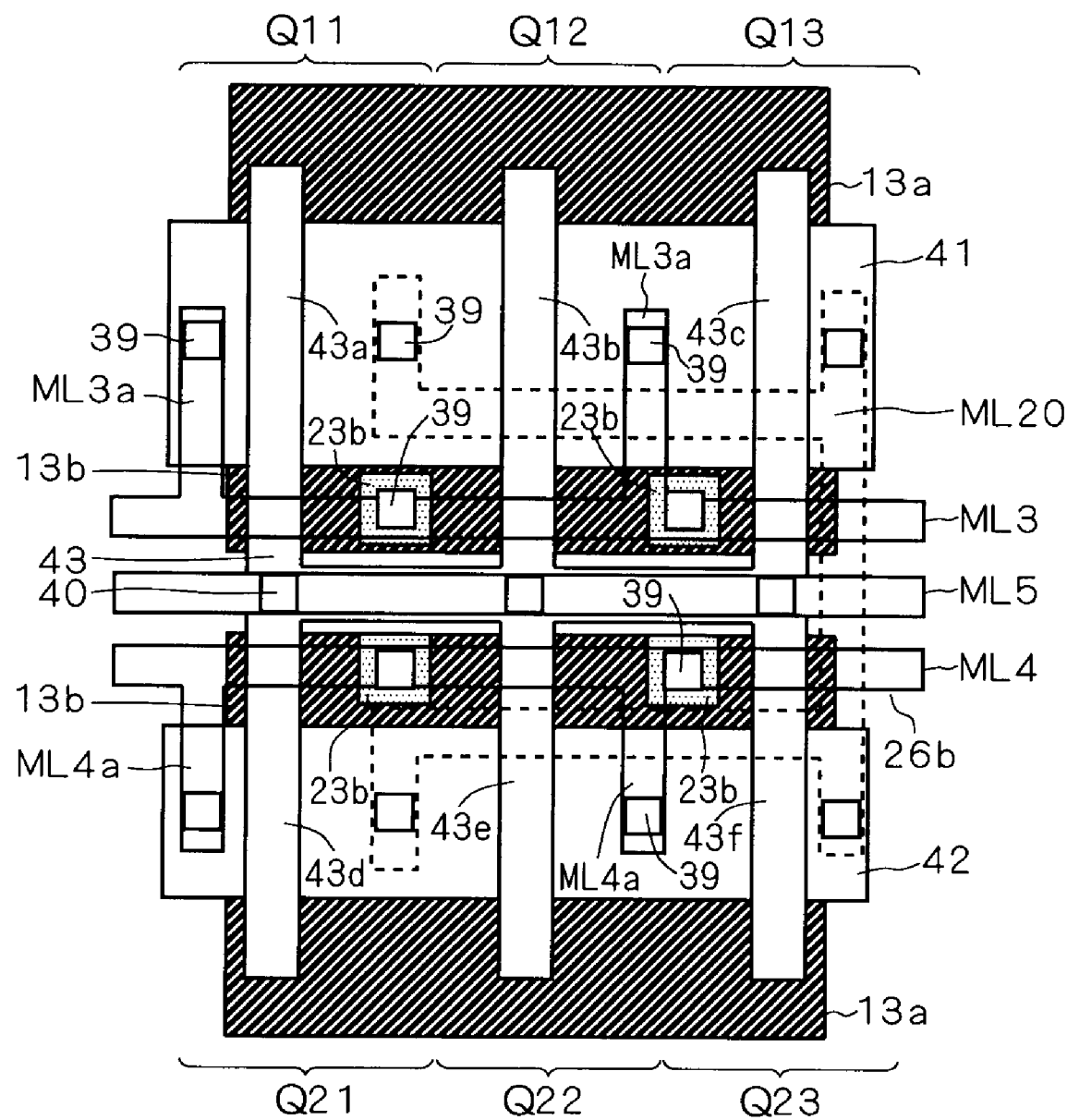
FIG. 78 is a plan view showing a sixth layout example of a combined layout pattern according to an application of the fourth preferred embodiment.

FIG. 78 is a plan view showing a sixth layout example of a combined layout pattern according to an application of the fourth preferred embodiment. As shown in the drawing, the P-type active region 41 is provided in the upper part of the drawing, and the N-type active region 42 is provided in the lower part of the drawing.

The PMOS transistors Q11 to Q13 all have the partial isolation regions 13a and 13b formed in the both end gate regions, respectively, with two tap regions 23b provided in and adjacent to the partial isolation region 13b. The tap regions 23b are isolated from each other in the partial isolation region 13b, but are electrically connected in common to the metal interconnection ML3 installed thereabove through contact holes 39, respectively.

The NMOS transistors Q21 to Q23 all have the partial isolation regions 13a and 13b formed in the both end gate regions, respectively, with two tap regions 23b provided in and adjacent to the partial isolation region 13b. The tap regions 23b are isolated from each other in the partial isola- tion region 13b, but are electrically connected in common to the metal interconnection ML4 installed thereabove through contact holes 39, respectively.

The sixth layout example differs from the second layout example shown in FIG. 74 in the absence of the tap regions 23a, and the metal interconnections ML1 and ML2.

The metal interconnection ML3a branched off from the metal interconnection ML3 extends above the P-type active region 41 of the PMOS transistor Q11 (on the side of its source region) and above the P-type active region 41 between the PMOS transistors Q12 and Q13 (on the side of each source region), and is electrically connected to corresponding positions of the P-type active regions 41 through contact holes 39, respectively.

Similarly, the metal interconnection ML4a branched off from the metal interconnection ML4 extends above the N-type active region 42 of the NMOS transistor Q21 (on the side of its source region) and above the N-type active region 42 between the NMOS transistors Q22 and Q23 (on the side of each source region), and is electrically connected to corresponding positions of the N-type active regions 42 through contact holes 39, respectively. Other configuration is similar to the second layout example shown in FIG. 74, and repeated description will be omitted herein.

The sixth layout example with such configuration is an application of an equivalent configuration to the fourth mode of the fourth preferred embodiment (cf. FIG. 21) in which the tap region is shared in the one-end gate region (also electrically shared), and the partial isolation region is shared in each side gate region.

The tap regions 23b may be provided also under the gate electrode 43 to increase their areas. In this case, a gate capacitance generated by the gate electrode 43 increases a little, however, there is little influence on substantial operations of the MOS transistors.

Comparing the fifth and sixth layout examples, the fifth layout example is superior in terms of reduction in parasitic capacitance, and the sixth layout example is superior in terms of stability in body fixing. In another combination, the tap regions 23b may be electrically isolated from each other among the MOS transistors.

Seventh Layout Example

Figure 79:
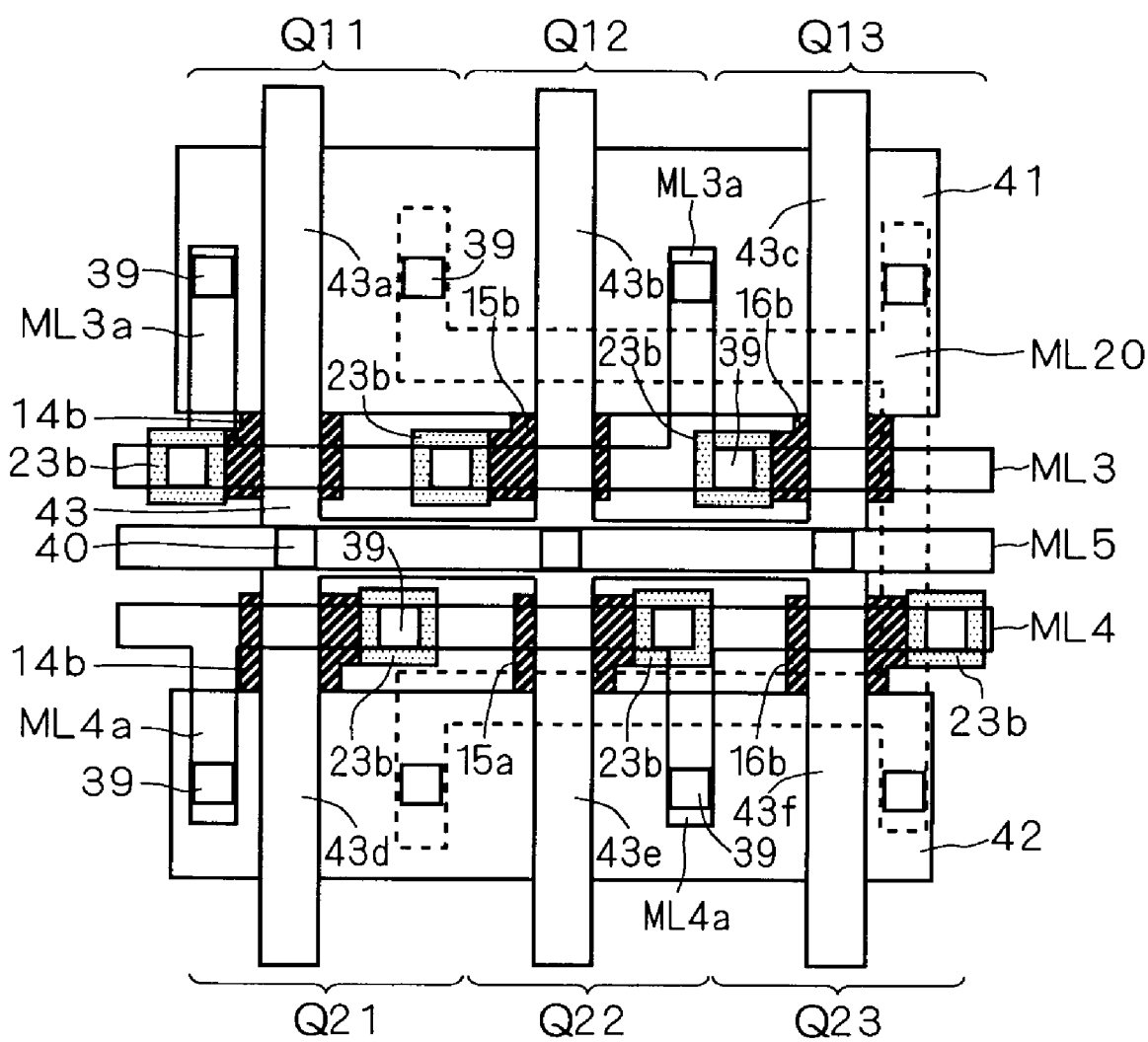
FIG. 79 is a plan view showing a seventh layout example of a combined layout pattern according to an application of the fourth preferred embodiment.

FIG. 79 is a plan view showing a seventh layout example of a combined layout pattern according to an application of the fourth preferred embodiment. As shown in the drawing, the P-type active region 41 is provided in the upper part of the drawing, and the N-type active region 42 is provided in the lower part of the drawing.

The seventh layout example shown in FIG. 79 differs from the fifth layout example shown in FIG. 77 in the absence of the partial isolation regions 14a to 16a in the PMOS transistors Q11 to Q13 and the partial isolation regions 14a to 16a in the NMOS transistors Q21 to Q23. Other configuration is similar to the fifth layout example shown in FIG. 77, and repeated description will be omitted herein.

The seventh layout example with such configuration is an application of an equivalent configuration to the tenth mode of the fourth preferred embodiment (cf. FIG. 27) in which the tap regions are isolated from each other in the one-end gate region (also in terms of positional isolation), and the partial isolation regions are isolated from each other in the one-end gate region.

The tap regions 23b may be provided also under the gate electrode 43 to increase their areas. In this case, a gate capacitance generated by the gate electrode 43 increases a little, however, there is little influence on substantial operations of the MOS transistors.

Eighth Layout Example

Figure 80:
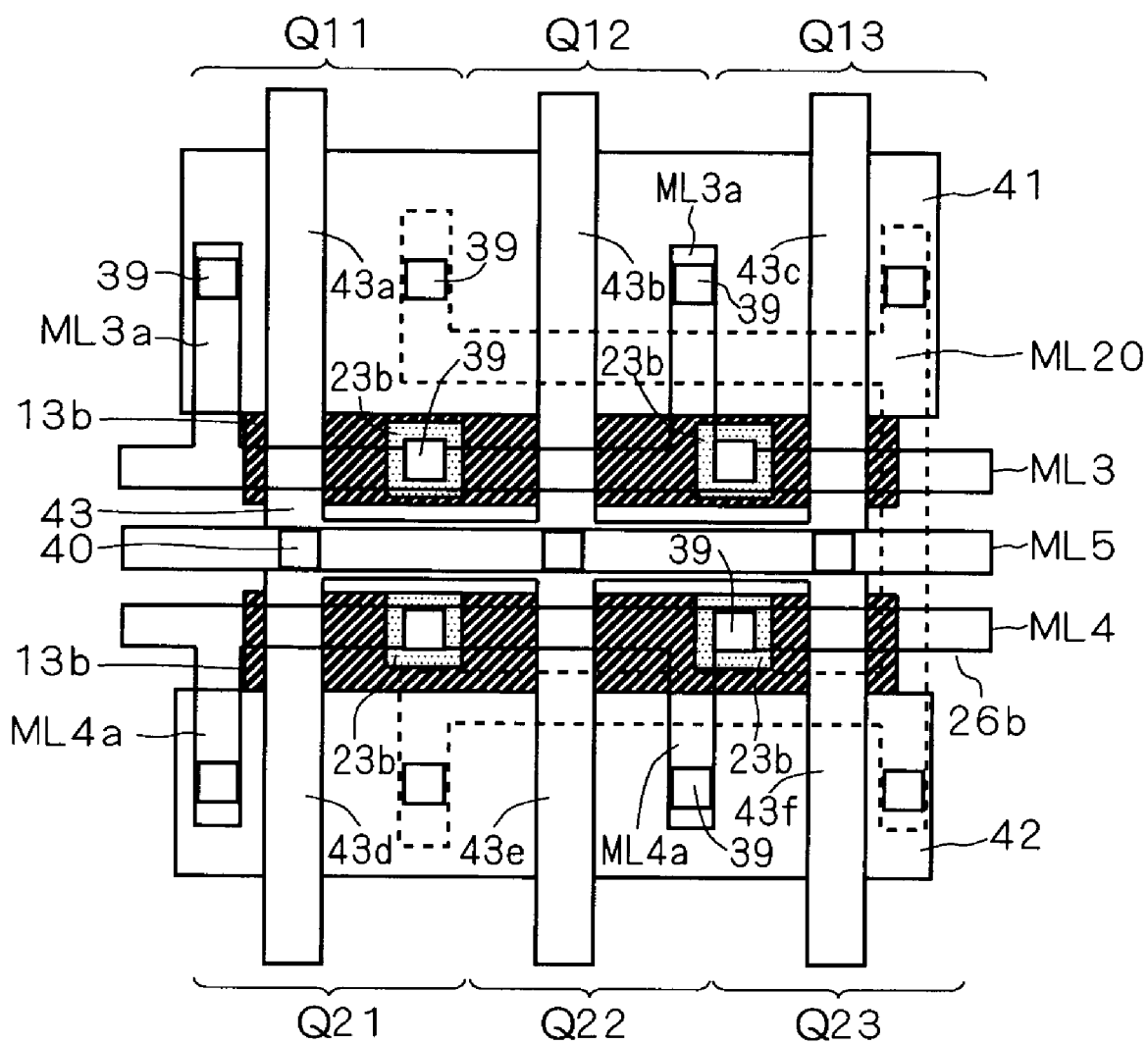
FIG. 80 is a plan view showing an eighth layout example of a combined layout pattern according to an application of the fourth preferred embodiment.

FIG. 80 is a plan view showing an eighth layout example of a combined layout pattern according to an application of the fourth preferred embodiment. As shown in the drawing, the P-type active region 41 is provided in the upper part of the drawing, and the N-type active region 42 is provided in the lower part of the drawing.

The eighth layout example shown in FIG. 80 differs from the sixth layout example shown in FIG. 78 in the absence of the partial isolation region 13a common to the PMOS transistors Q11 to Q13 and the partial isolation regions 13a common to the NMOS transistors Q21 to Q23. Other configuration is similar to the sixth layout example shown in FIG. 78, and repeated description will be omitted herein.

The eighth layout example with such configuration is an application of the configuration in which the tap regions are shared in the one-end gate region (also electrically shared), and the partial isolation region is shared in the one-end gate region, which is equivalent to the sixth mode of the fourth preferred embodiment (cf. FIG. 23).

The tap regions 23b may be provided also under the gate electrode 43 to increase their areas. In this case, a gate capacitance resulting from the gate electrode 43 increases a little, however, there is little influence on substantial operations of the MOS transistors.

Ninth Layout Example

Figure 81:
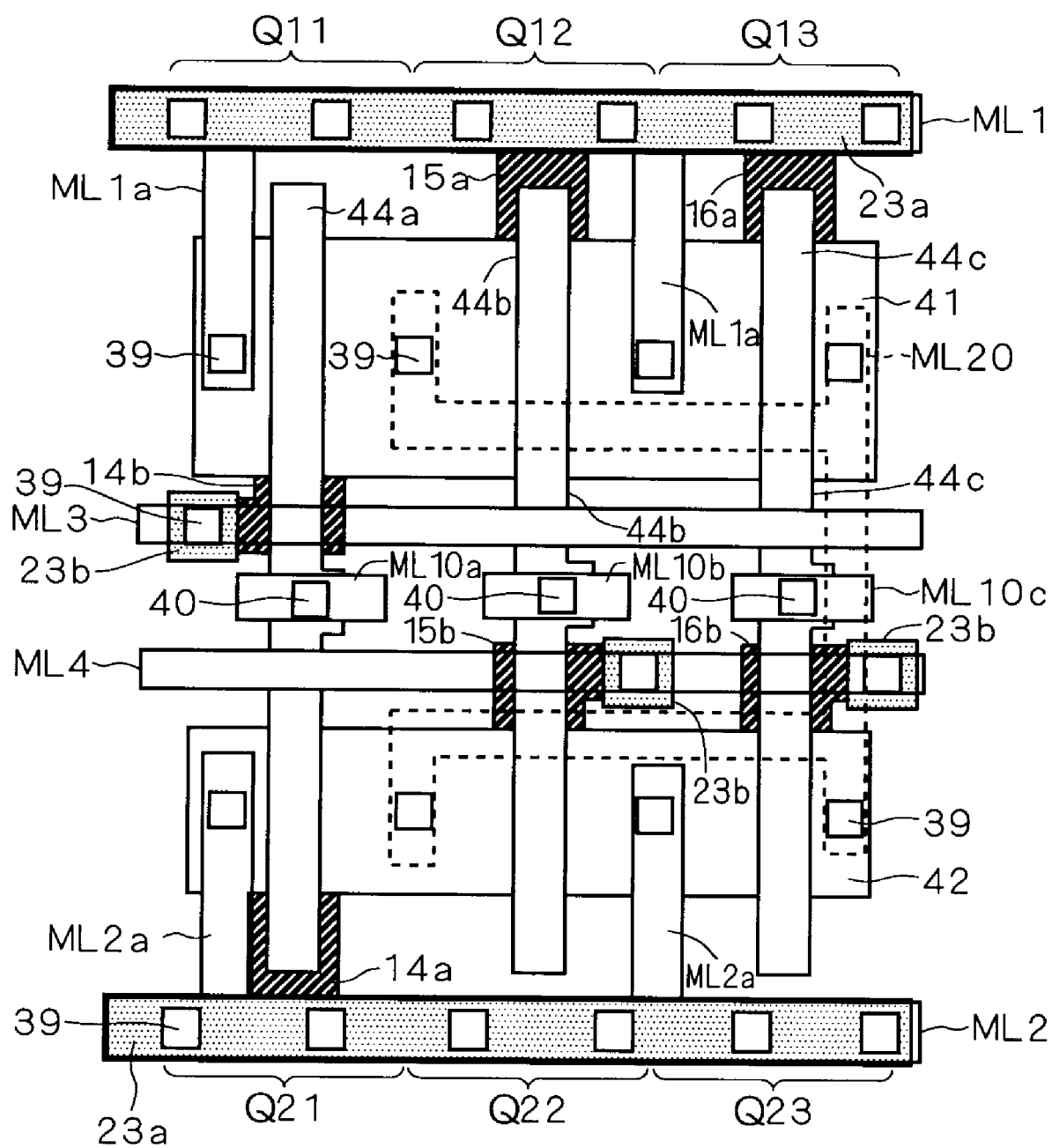
FIG. 81 is a plan view showing a ninth layout example of a combined layout pattern according to an application of the fourth preferred embodiment.

FIG. 81 is a plan view showing a ninth layout example of a combined layout pattern according to an application of the fourth preferred embodiment. As shown in the drawing, the P-type active region 41 is provided in the upper part of the drawing, and the N-type active region 42 is provided in the lower part of the drawing.

Independent gate electrodes 44a to 44c are provided which respectively cross longitudinally at three positions above the P-type active region 41 and N-type active region 42. The gate electrode 44a is electrically connected to the metal interconnection ML10a installed thereabove through a via hole 40. The gate electrode 44b is electrically connected to the metal interconnection ML10b installed thereabove through a via hole 40. The gate electrode 44c is electrically connected to the metal interconnection ML10c installed thereabove through a via hole 40.

Accordingly, the P-type active region 41 and gate electrode 44a constitute the PMOS transistor Q11, the P-type active region 41 and gate electrode 44b constitute the PMOS transistor Q12, and the P-type active region 41 and gate electrode 44c constitute the PMOS transistor Q13. The N-type active region 42 and gate electrode 44a constitute the NMOS transistor Q21, the N-type active region 42 and gate electrode 44b constitute the NMOS transistor Q22, and the N-type active region 42 and gate electrode 44c constitute the NMOS transistor Q23.

The PMOS transistor Q11 has the partial isolation region 14b formed in the other-end gate region, with the tap region 24b provided adjacent to the partial isolation region 14b. The PMOS transistor Q12 has the partial isolation region 15a formed in the one-end gate region, with the tap region 23a provided adjacent to the partial isolation region 15a. The PMOS transistor Q13 has the partial isolation region 16a formed in the one-end gate region, with the tap region 23a provided adjacent to the partial isolation region 16a.

The tap region 23a is shared among the PMOS transistors Q11 to Q13, and is electrically connected to the metal interconnection ML1 installed thereabove through contact holes

39. The tap region 23*b* is electrically connected to the metal interconnection ML3 installed thereabove through a contact hole 39.

The metal interconnection ML1*a* branched off from the metal interconnection ML1 extends above the P-type active region 41 of the PMOS transistor Q11 (on the side of its source region) and above the P-type active region 41 between the PMOS transistors Q12 and Q13 (on the side of each source region), and is electrically connected to corresponding positions of the P-type active regions 41 through contact holes 39, respectively.

The NMOS transistor Q21 has the partial isolation region 14*a* formed in the one-end gate region (the lower part of the drawing will be assumed as the one-end gate region in the NMOS transistors Q21 to Q23), with the tap region 23*a* provided adjacent to the partial isolation region 14*a*. The NMOS transistor Q22 has the partial isolation region 15*b* formed in the other-end gate region, with the tap region 23*b* provided adjacent to the partial isolation region 15*b*. The NMOS transistor Q23 has the partial isolation region 16*b* formed in the other-end gate region, with the tap region 23*b* provided adjacent to the partial isolation region 16*b*.

The tap region 23*a* is used only in the NMOS transistor Q21, and is electrically connected to the metal interconnection ML2 installed thereabove through contact holes 39. The tap regions 23*b* are isolated from each other between the NMOS transistors Q22 and Q23, but are electrically connected in common to the metal interconnection ML4 installed thereabove through contact holes 39, respectively.

The metal interconnection ML2*a* branched off from the metal interconnection ML2 extends above the N-type active region 42 of the NMOS transistor Q21 (on the side of its source region) and above the N-type active region 42 between the NMOS transistors Q22 and Q23 (on the side of each source region), and is electrically connected to corresponding positions of the N-type active regions 42 through contact holes 39, respectively.

Further, the metal interconnection ML20 installed above the metal interconnections ML1 to ML5 extends from the P-type active region 41 between the PMOS transistors Q11 and Q12 (on the side of each drain region) to the P-type active region 41 of the PMOS transistor Q13 (on the side of its drain region), and from above the N-type active region 42 of the NMOS transistor Q23 (on the side of its drain region) to the N-type active region 42 between the NMOS transistors Q21 and Q22 (on the side of each drain region), and is electrically connected to corresponding positions of the P-type active region 41 and N-type active region 42 through contact holes 39, respectively.

In the ninth layout example with such configuration, the PMOS transistor Q11 has an equivalent configuration to the third mode of the first preferred embodiment (cf. FIG. 3), and the PMOS transistors Q12 and Q13 are configured such that the tap region is shared in the one-end gate region and the partial isolation regions are formed independently from each other in the one-end gate region, which is substantially equivalent to the sixth mode of the fourth preferred embodiment (cf. FIG. 27) (the only difference is whether the tap region is shared or isolated).

Similarly, the NMOS transistor Q21 has a configuration equivalent to the third mode of the first preferred embodiment (cf. FIG. 3), and the NMOS transistors Q22 and Q23 are configured such that the tap regions are formed independently from each other in the one-end gate region and the partial isolation regions are formed independently from each other in the one-end gate region, which is substantially equivalent to the sixth mode of the fourth preferred embodiment (cf. FIG. 27) (the only difference is whether the tap region is shared or isolated).

As described, the ninth layout pattern partially provides a combined layout of the first and third preferred embodiments. Accordingly, the gate potential can be controlled independently among the PMOS transistors Q11 to Q13 (NMOS transistors Q21 to Q23), while the body potential can be controlled independently between the PMOS transistor Q11 and the pair of the PMOS transistors Q12, Q13 and between the NMOS transistor Q21 and the NMOS transistors Q22 and Q23.

The tap regions 23*b* may be provided also under the gate electrode 43 to increase their areas. In this case, a gate capacitance generated by the gate electrode 43 increases a little, however, there is little influence on substantial operations of the MOS transistors.

Tenth Layout Example

Figure 82:
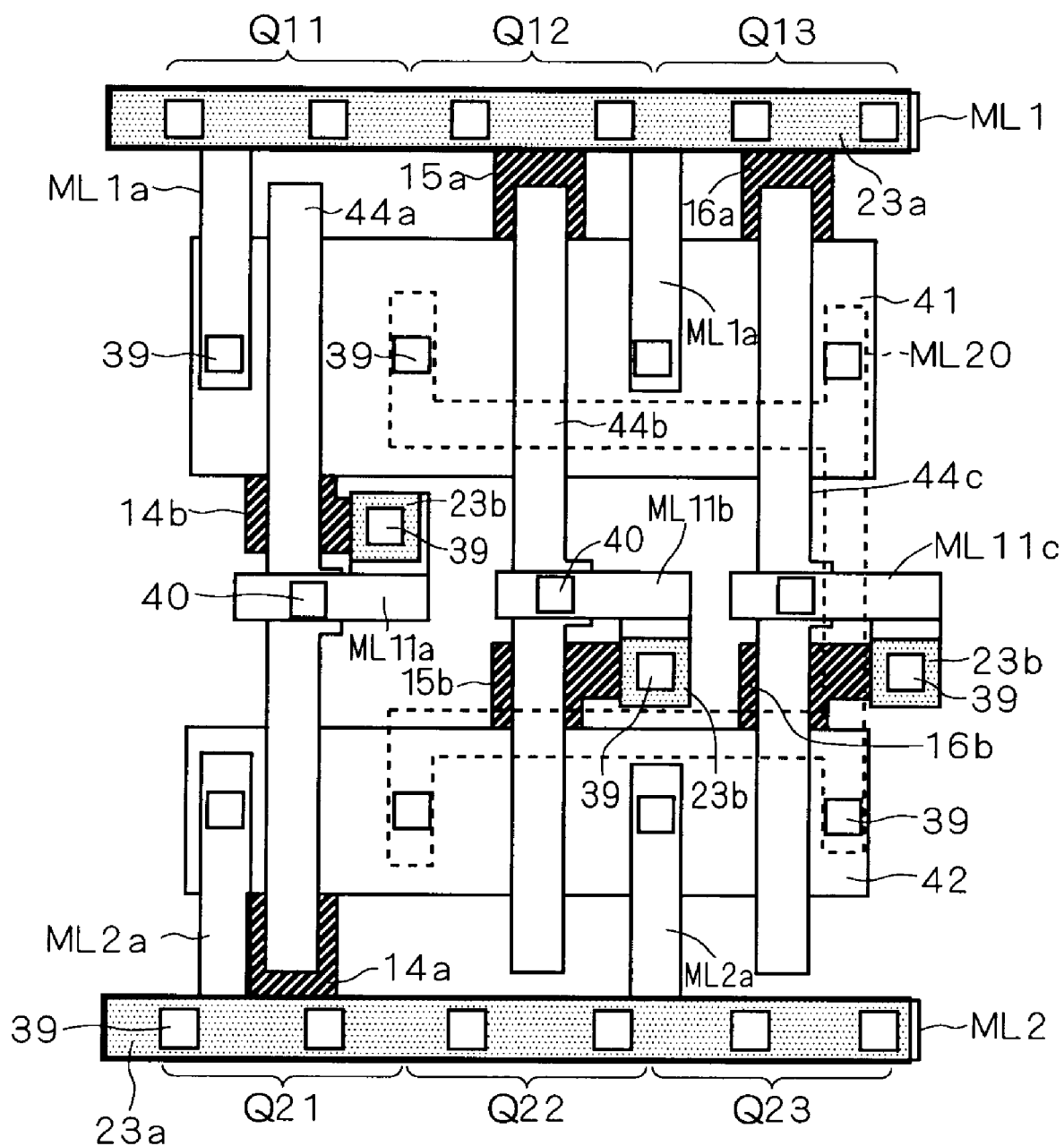
FIG. 82 is a plan view showing a tenth layout example of a combined layout pattern according to an application of the fourth preferred embodiment.

FIG. 82 is a plan view showing a tenth layout example of a combined layout pattern according to an application of the fourth preferred embodiment. As shown in the drawing, the P-type active region 41 is provided in the upper part of the drawing, and the N-type active region 42 is provided in the lower part of the drawing.

Independent gate electrodes 44*a* to 44*c* are provided which respectively cross longitudinally at three positions above the P-type active region 41 and N-type active region 42. The gate electrode 44*a* is electrically connected to a metal interconnection ML11*a* installed thereabove through a via hole 40. The gate electrode 44*b* is electrically connected to a metal interconnection ML11*b* installed thereabove through a via hole 40. The gate electrode 44*c* is electrically connected to a metal interconnection ML11*c* installed thereabove through a via hole 40.

The PMOS transistor Q11 has its tap region 23*b* electrically connected to the metal interconnection ML11*a* installed thereabove through a contact hole 39. The NMOS transistor Q22 has its tap region 23*b* electrically connected to the metal interconnection ML11*b* installed thereabove through a contact hole 39. The NMOS transistor Q22 has its tap region 23*b* electrically connected to the metal interconnection ML11*c* installed thereabove through a contact hole 39.

As described, the metal interconnection ML11*a* electrically connects the gate electrode 44*a* and the tap region 23*b* in the PMOS transistor Q11, the metal interconnection ML11*b* electrically connects the gate electrode 44*b* and the tap region 23*b* in the NMOS transistor Q22, and the metal interconnection ML11*c* electrically connects the gate electrode 44*c* and the tap region 23*b* in the NMOS transistor Q23.

Accordingly, the tenth layout example differs from the ninth layout example shown in FIG. 81 in the absence of the metal interconnections ML3 and ML4. Other configuration is similar to the ninth layout example shown in FIG. 81, and repeated description will be omitted herein.

In the tenth layout example with such configuration, the PMOS transistor Q11 has an equivalent configuration to the third mode of the first preferred embodiment (cf. FIG. 3), and the PMOS transistors Q12 and Q13 are configured such that the tap region is shared in the one-end gate region and the partial isolation regions are formed independently from each other in the one-end gate region, which is substantially equivalent to the sixth mode of the fourth preferred embodiment (cf. FIG. 27) (the only difference is whether the tap region is shared or isolated).

Similarly, the NMOS transistor Q21 has an equivalent configuration to the third mode of the first preferred embodiment (cf. FIG. 3), and the NMOS transistors Q22 and Q23 are configured such that the tap regions are formed independently from each other in the one-end gate region and the partial isolation regions are formed independently from each other in the one-end gate region, which is substantially equivalent to the sixth mode of the fourth preferred embodiment (cf. FIG. 27) (the only difference is whether the tap region is shared or isolated).

As described, the tenth layout pattern partially provides a combined layout of the first and third preferred embodiments. Accordingly, the gate potential can be controlled independently among the PMOS transistors Q11 to Q13 (NMOS transistors Q21 to Q23), while the body potential can be controlled independently between the PMOS transistor Q11 and the pair of the PMOS transistors Q12 and Q13 and among the NMOS transistors Q21 to Q23.

In addition, in the PMOS transistor Q11, NMOS transistors Q22 and Q23, the gate potential and body potential are controlled simultaneously at the same potential.

The tap regions 23b may be provided also under the gate electrode 43 to increase their areas. In this case, a gate capacitance generated by the gate electrode 43 increases a little, however, there is little influence on substantial operations of the MOS transistors.

Application of Fifth Preferred Embodiment

Figure 83:
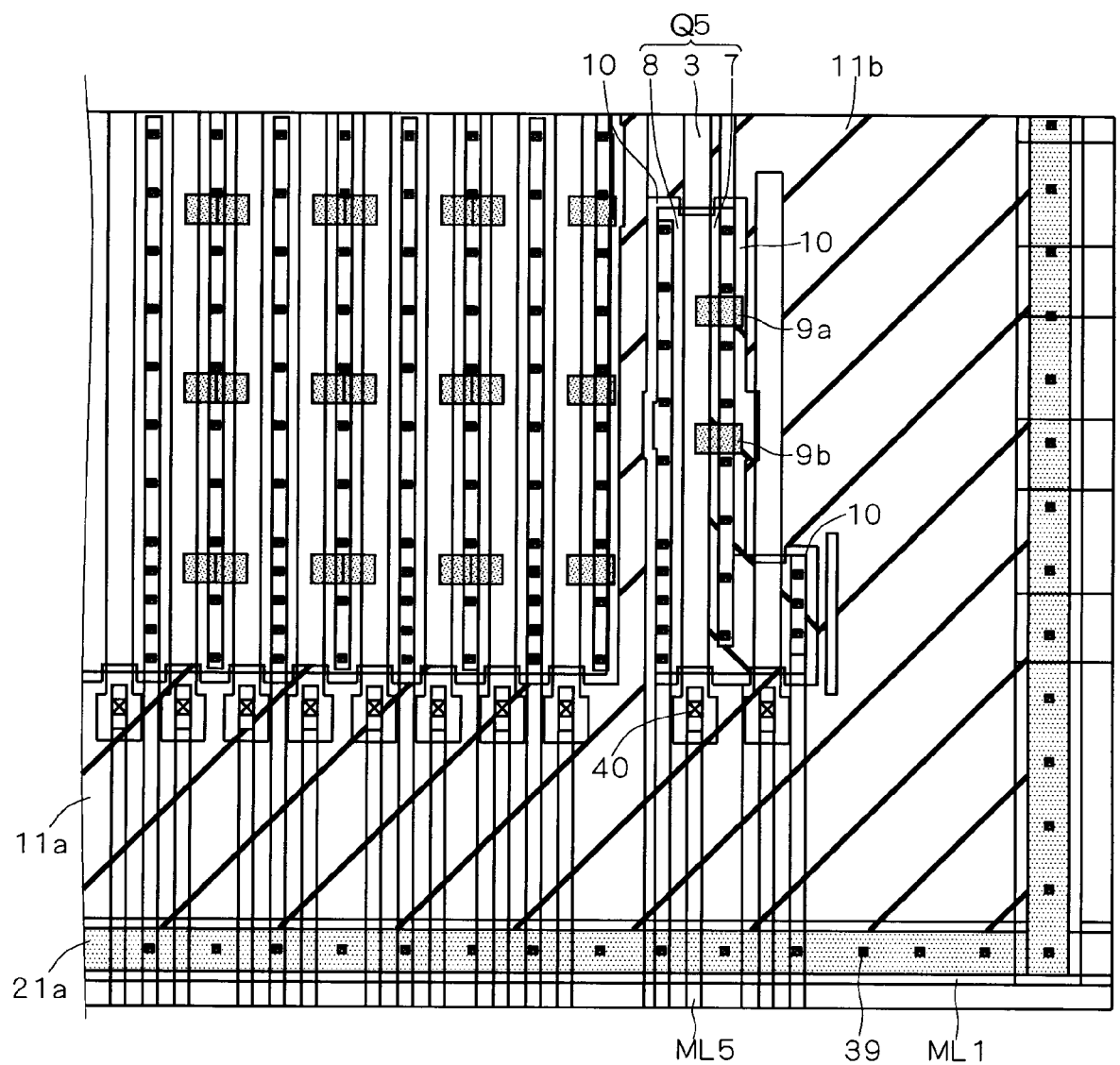
FIG. 83 is a plan view showing a layout pattern according to an application of the fifth preferred embodiment.
Figure 84:
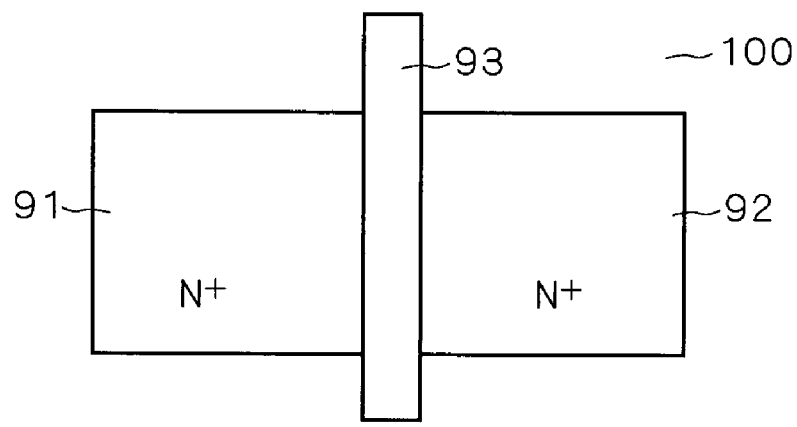
FIG. 84 is a plan view showing a first mode of layout of a conventional MOS transistor formed in a SOI layer of a SOI substrate.
Figure 85:
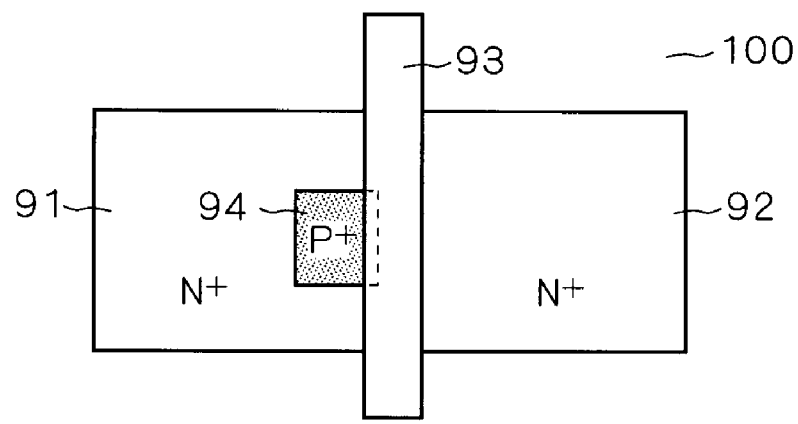
FIG. 85 is a plan view showing a second mode of layout of a conventional MOS transistor formed in a SOI layer of a SOI substrate.

FIG. 83 is a plan view showing a layout pattern according to an application of the fifth preferred embodiment. As shown in the drawing, the gate electrode 3, source region 7 and drain region 8 constitute a MOS transistor Q5.

The MOS transistor Q5 has the partial isolation region 11a formed in the one-end gate region (the lower part of the drawing will be assumed as the one-end gate region) and the partial isolation region 11b formed in the other-end gate region, with the tap region 21a provided adjacent to the partial isolation region 11a. The source tie region 9b extends from the vicinity of the central part of the source region 7 to part of a lower portion (body region) under the gate electrode 3, and the source tie region 9a extends from the vicinity of the other-end gate region of the source region 7 to part of a lower portion (body region) under the gate electrode 3. The gate electrode 3 is electrically connected to the metal interconnection ML5 installed thereabove through a via hole 40, and the tap region 21a is electrically connected to the metal interconnection ML1 installed thereabove through contact holes 39. Further, the full isolation region 10 is provided in the whole area around the active regions 7 and 8 except the partial isolation region 11a and 11b.

Accordingly, the MOS transistor Q5 has an equivalent configuration to the MOS transistor in the second mode of the fifth preferred embodiment (cf. FIG. 35).

As shown in FIG. 83, employing the second mode of the fifth preferred embodiment in the MOS transistor Q5 with the gate electrode 3 formed relatively long allows body potential fixing to be carried out with stability.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a MOS transistor in a SOI layer of a first conductivity type in a SOI substrate, said SOI substrate including a semiconductor substrate, a buried insulating film on said semiconductor substrate and said SOI layer on said buried insulating film, wherein
   said MOS transistor includes first and second MOS transistors sharing a one-side common electrode region,
   said first MOS transistor includes:
      said one-side common electrode region and an other-side first electrode region of a second conductivity type selectively provided in said SOI layer, a region sandwiched between said one-side common electrode region and said other-side first electrode region being defined as a first body region of the first conductivity type; and
      a first gate electrode on said first body region,
   said second MOS transistor includes:
      said one-side common electrode region and an other-side second electrode region of the second conductivity type selectively provided in said SOI layer, a region sandwiched between said one-side common electrode region and said other-side second electrode region being defined as a second body region of the first conductivity type; and
      a second gate electrode on said second body region,
   said semiconductor device further comprising:
   one-side first and second insulative partial isolation regions provided in said SOI layer close to one-end region of said first and second gate electrodes;
   one-side first and second semiconductor regions which are a part of a lower portion of said SOI layer between said buried insulating film and said one-side first and second insulative partial isolation regions;
   a common active region including said one-side common electrode region, said other-side first electrode region, said first body region, said other-side second electrode region and said second body region, said one-side first and second insulative partial isolation regions being adjacent to said first and second body regions, respectively;
   an insulative full isolation region provided at least in a region except a region close to both end regions of each of said first and second gate electrodes and except a region between said first and second gate electrodes in a peripheral region of said common active region, said insulative full isolation region extending through said SOI layer; and
   one-side first and second body-fixing active regions of the first conductivity type adjacent to said one-side first and second semiconductor regions, respectively, said one-side first and second body-fixing active regions each being capable of receiving a fixed potential from outside.

2. The semiconductor device according to claim 1, wherein
   said one-side first and second insulative partial isolation regions include a one-side common partial isolation region integrally provided also in a region between said first and second gate electrodes on a side of one ends of said first and second gate electrodes in said peripheral region of said common active region, and
   said one-side first and second semiconductor regions include a one-side common semiconductor region integrally formed under said one-side common partial isolation region.

3. The semiconductor device according to claim 1, wherein
   said insulative full isolation region is also provided in a region between said first and second gate electrodes on a side of one ends of said first and second gate electrodes in said peripheral region of said common active region, and said one-side first and second semiconductor regions under said one-side first and second insulative partial isolation regions each include semiconductor regions isolated from each other by said insulative full isolation region.

4. The semiconductor device according to claim 3, wherein said one-side first and second body-fixing active regions each include body-fixing active regions isolated from each other.

5. The semiconductor device according to claim 1, wherein said one-side first and second body-fixing active regions each include a one-side common body-fixing active region integrally provided.

6. The semiconductor device according to claim 1, further comprising:
other-side first and second insulative partial isolation regions provided in said SOI layer such that other-side first and second semiconductor regions respectively remain only in a region close to other-end regions of said first and second gate electrodes in said peripheral region of said common active region, said other-side first and second insulative partial isolation regions being adjacent to said first and second body regions, respectively.

7. The semiconductor device according to claim 6, wherein said other-side first and second insulative partial isolation regions include an other-side common partial isolation region integrally provided also in a region between said first and second gate electrodes on a side of other ends of said first and second gate electrodes in said peripheral region of said common active region, and
said other-side first and second insulative partial isolation regions include an other-side common semiconductor region integrally provided under said other-side common partial isolation region.

8. The semiconductor device according to claim 6, wherein said insulative full isolation region is also provided in a region between said first and second gate electrodes on a side of other ends of said first and second gate electrodes in said peripheral region of said common active region, and
said other-side first and second semiconductor regions under said other-side first and second insulative partial isolation regions each include semiconductor regions isolated from each other by said insulative full isolation region.

9. The semiconductor device according to claim 6, further comprising:
other-side first and second body-fixing active regions provided adjacent to said other-side first and second semiconductor regions, respectively, said other-side first and second body-fixing active regions each being capable of receiving a fixed potential from outside.

10. The semiconductor device according to claim 9, wherein said other-side first and second body-fixing active regions respectively include other-side common body-fixing active regions integrally provided.

11. The semiconductor device according to claim 9, wherein said other-side first and second body-fixing active regions each include body-fixing active regions isolated from each other.

12. The semiconductor device according to claim 6, wherein said other-side first and second semiconductor regions each include a crystal defect region.

13. A semiconductor device comprising a MOS transistor in a SOI layer of a first conductivity type in a SOI substrate, said SOI substrate including a semiconductor substrate, a buried insulating film on said semiconductor substrate and said SOI layer on said buried insulating film, wherein said MOS transistor includes first and second MOS transistors sharing a one-side common electrode region,
said first MOS transistor includes:
said one-side common electrode region and an other-side first electrode region of a second conductivity type selectively provided in said SOI layer, a region sandwiched between said one-side common electrode region and said other-side first electrode region being defined as a first body region of the first conductivity type; and
a first gate electrode on said first body region,
said second MOS transistor includes:
said one-side common electrode region and an other-side second electrode region of the second conductivity type selectively provided in said SOI layer, a region sandwiched between said one-side common electrode region and said other-side second electrode region being defined as a second body region of the first conductivity type; and
a second gate electrode on said second body region,
said semiconductor device further comprising:
one-side first and second insulative partial isolation regions provided in said SOI layer close to one-end region of said first and second gate electrodes;
one-side first and second semiconductor regions which are a part of a lower portion of said SOI layer between said buried insulating film and said one-side first and second insulative partial isolation region:
a common active region including said one-side common electrode region, said other-side first electrode region, said first body region, said other-side second electrode region and said second body region, said one-side first and second semiconductor regions being adjacent to said first and second body regions, respectively;
an insulative full isolation region provided at least in a region except a region close to both end regions of each of said first and second gate electrodes and except a region between said first and second gate electrodes in a peripheral region of said common active region, said insulative full isolation region extending through said SOI layer, wherein said semiconductor device does not include an external-potential receiving region for a potential setting of said first and second body regions.

14. The semiconductor device according to claim 13, wherein
said one-side first and second insulative partial isolation regions include a one-side common partial isolation region integrally provided also in a region between said first and second gate electrodes on a side of one ends of said first and second gate electrodes in said peripheral region of said common active region, and
said one-side first and second semiconductor regions include a one-side common semiconductor region integrally formed under said one-side common partial isolation region.

15. The semiconductor device according to claim 13, wherein
said insulative full isolation region is also provided in a region between said first and second gate electrodes on a side of one ends of said first and second gate electrodes in said peripheral region of said common active region, and
said one-side first and second semiconductor regions under said one-side first and second insulative partial isolation regions each include semiconductor regions isolated from each other by said insulative full isolation region.

16. The semiconductor device according to claim 13, further comprising:

other-side first and second insulative partial isolation regions provided in said SOI layer such that other-side first and second semiconductor regions respectively remain only in a region close to other-end regions of said first and second gate electrodes in said peripheral region of said common active region, said other-side first and second insulative partial isolation regions being adjacent to said first and second body regions, respectively.

17. The semiconductor device according to claim 16, wherein said other-side first and second insulative partial isolation regions include an other-side common partial isolation region integrally provided also in a region between said first and second gate electrodes on a side of other ends of said first and second gate electrodes in said peripheral region of said common active region, and said other-side first and second semiconductor regions include an other-side common semiconductor region integrally provided under said other-side common partial isolation region.

18. The semiconductor device according to claim 16, wherein said insulative full isolation region is also provided in a region between said first and second gate electrodes on a side of other ends of said first and second gate electrodes in said peripheral region of said common active region, and said other-side first and second semiconductor regions under said other-side first and second insulative partial isolation regions each include semiconductor regions isolated from each other by said insulative full isolation region.

19. The semiconductor device according to claim 13, wherein said one-side first and second semiconductor regions each include a crystal defect region.

\* \* \* \* \*